United States Patent
May et al.

(10) Patent No.: US 9,206,352 B2
(45) Date of Patent: Dec. 8, 2015

(54) FORMULATION AND METHOD FOR PREPARATION OF ORGANIC ELECTRONIC DEVICES

(75) Inventors: Philip Edward May, Sidcup (GB); Mark James, Romsey (GB); Piotr Wierzchowiec, Southampton (GB); Stephen Bain, Southampton (GB); Paul Craig Brookes, Southampton (GB); Edgar Kluge, Gross-Gerau (DE); Li Wei Tan, Eastleigh (GB); David Sparrowe, Bournemouth (GB); Magda Goncalves-Miskiewicz, Southampton (GB)

(73) Assignee: Merck Patent GmbH, Darmstadt (DE)

( * ) Notice: Subject to any disclaimer, the term of this patent is extended or adjusted under 35 U.S.C. 154(b) by 189 days.

(21) Appl. No.: 13/700,298

(22) PCT Filed: Apr. 28, 2011

(86) PCT No.: PCT/EP2011/002128
§ 371 (c)(1),
(2), (4) Date: Nov. 27, 2012

(87) PCT Pub. No.: WO2011/147523
PCT Pub. Date: Dec. 1, 2011

(65) Prior Publication Data
US 2013/0069020 A1    Mar. 21, 2013

(30) Foreign Application Priority Data

May 27, 2010 (EP) .................................... 10005495

(51) Int. Cl.
*H01B 1/12* (2006.01)
*H01L 51/00* (2006.01)
*C09K 11/06* (2006.01)
*H05B 33/10* (2006.01)
*H01L 51/05* (2006.01)

(52) U.S. Cl.
CPC ............ *C09K 11/06* (2013.01); *H01L 51/0007* (2013.01); *H01L 51/0558* (2013.01); *H05B 33/10* (2013.01); *C09K 2211/1037* (2013.01); *C09K 2211/1416* (2013.01); *C09K 2211/1425* (2013.01); *C09K 2211/1441* (2013.01); *C09K 2211/185* (2013.01); *H01L 51/0058* (2013.01); *H01L 51/0074* (2013.01); *Y02E 10/549* (2013.01)

(58) Field of Classification Search
CPC .......... H01B 1/12; H01L 51/00; C09K 11/06; H05B 33/10

USPC ............ 252/519.21, 500; 438/99; 427/58, 66, 427/99.2; 257/E51.024
See application file for complete search history.

(56) References Cited

U.S. PATENT DOCUMENTS

| | | | |
|---|---|---|---|
| 7,576,208 B2 | 8/2009 | Brown et al. | |
| 8,119,804 B2 | 2/2012 | Brown et al. | |
| 8,232,550 B2 | 7/2012 | Clough et al. | |
| 2006/0155040 A1* | 7/2006 | Veres et al. | 524/484 |
| 2006/0208221 A1 | 9/2006 | Gerhard et al. | |
| 2007/0102696 A1* | 5/2007 | Brown et al. | 257/40 |
| 2007/0114919 A1 | 5/2007 | Sotoyama | |
| 2007/0221916 A1 | 9/2007 | Shkunov et al. | |
| 2008/0009625 A1 | 1/2008 | Brown et al. | |
| 2009/0149627 A1 | 6/2009 | Pan et al. | |
| 2010/0213455 A1* | 8/2010 | James et al. | 257/40 |
| 2010/0227956 A1 | 9/2010 | Brown et al. | |
| 2011/0006265 A1 | 1/2011 | James et al. | |
| 2011/0092015 A1 | 4/2011 | Clough et al. | |
| 2012/0256137 A1* | 10/2012 | James et al. | 252/500 |
| 2013/0069020 A1* | 3/2013 | May et al. | 252/519.21 |

FOREIGN PATENT DOCUMENTS

| | | | |
|---|---|---|---|
| JP | 2006523740 A | 10/2006 | |
| JP | 2007258724 A | 10/2007 | |
| JP | 2009536981 A | 10/2009 | |
| WO | WO 2005/055248 A2 | 6/2005 | |
| WO | WO 2009065479 A1 * | 5/2009 | |
| WO | WO 2009/109273 A1 | 9/2009 | |
| WO | WO 2009/151978 A1 | 12/2009 | |

OTHER PUBLICATIONS

CRC Handbook of Chemistry and Physics, CRC Press, 77th ed., 1996, pp. 6-208 through 6-212.*
International Search Report of PCT/EP2011/002128 (Aug. 9, 2011).
English translation of Office Action of JP 2013-511565 Date of Notice: Aug. 28, 2015, Date of Dispatch: Sep. 1, 2015.

* cited by examiner

*Primary Examiner* — Douglas McGinty
(74) *Attorney, Agent, or Firm* — Millen, White, Zelano & Branigan, P.C.

(57) ABSTRACT

The present invention relates to novel formulations comprising an organic semiconductor (OSC) and one or more organic solvents. The formulation comprises a viscosity at 25° C. of less than 15 mPas and the boiling point of the solvent is at most 400° C. Furthermore, the present invention describes the use of these formulations as inks for the preparation of organic electronic (OE) devices, especially organic photovoltaic (OPV) cells and OLED devices, to methods for preparing OE devices using the novel formulations, and to OE devices, OLED devices and OPV cells prepared from such methods and formulations.

38 Claims, 10 Drawing Sheets

FORMULATION AND METHOD FOR PREPARATION OF ORGANIC ELECTRONIC DEVICES

FIELD OF THE INVENTION

The present invention relates to novel formulations comprising an organic semiconducting compound (OSC), to their use as conducting inks for the preparation of organic electronic (OE) devices, especially organic photovoltaic (OPV) cells, organic field effect transistors (OFET) and OLED devices, to methods for preparing OE devices using the novel formulations, and to OE devices and OPV cells prepared from such methods and formulations.

BACKGROUND AND PRIOR ART

When preparing OLED devices usually printing techniques like inkjet printing, roll to roll printing, slot dye coating or gravure printing are used to apply the active layer. Based on the low solubility of most of the present organic compounds useful as emitting materials and/or charge transporting materials, these techniques need the use of solvents in high amounts.

In order to improve the film forming ability and the rheology, binding agents can be used. These additives are especially needed with regard to light emitting materials and/or charge transporting materials having small molecular weight or polymeric compounds having a low molecular weight.

The document WO 2009/109273 describes compositions comprising special solvents in order to achieve specific viscosity. Conventional compositions for printing applications like ink jet printing, flexographic or gravure printing need additives to increase ink viscosity and improve film formation.

The prior art provides compositions being useful in order to process low molecular weight organic light emitting and charge transporting materials. However, it is a permanent desire to improve the performance of the OLED layer, such as efficiency, life time and sensitivity regarding oxidation or water.

In addition thereto, the formulation should enable a low-cost and easy printing process. The printing process should allow a high quality printing at high speed.

It is therefore desirable to have improved formulations comprising an OSC that are suitable for the preparation of OE devices, especially thin film transistors, diodes, OLED displays and OPV cells, which allow the manufacture of high efficient OE devices having a high performance, a long lifetime and a low sensitivity against water or oxidation. One aim of the present invention is to provide such improved formulations. Another aim is to provide improved methods of preparing an OE device from such formulations. Another aim is to provide improved OE devices obtained from such formulations and methods. Further aims are immediately evident to the person skilled in the art from the following description.

Surprisingly it has been found that these aims can be achieved, and the above-mentioned problems can be solved, by providing methods, materials and devices as claimed in the present invention, especially by providing a process for preparing an OE device using a formulation of the present invention.

Furthermore, the document WO 2009/109273 describes compositions comprising special solvents in order to achieve specific viscosity.

SUMMARY OF THE INVENTION

The invention relates to a formulation comprising one or more organic semiconducting compounds (OSC), and one or more organic solvents, characterized in that said formulation comprises a viscosity at 25° C. of less than 15 mPas and the boiling point of the solvent is at most 400° C.

The invention further relates to the use of a formulation as described above and below as coating or printing ink, preferably for the preparation of rigid or flexible OE devices, in particular for thin film transistors, diodes, OLED devices and rigid or flexible organic photovoltaic (OPV) cells and devices, preferably by flexographic or gravure printing.

The invention further relates to a process of preparing an organic electronic (OE) device, comprising the steps of
a) depositing the formulation as described above and below onto a substrate to form a film or layer, preferably by coating or printing, very preferably by flexographic or gravure printing
b) removing the solvent(s).

The invention further relates to an OE device prepared from a formulation and/or by a process as described above and below.

The OE devices include, without limitation, organic field effect transistors (OFET), integrated circuits (IC), thin film transistors (TFT), Radio Frequency Identification (RFID) tags, organic light emitting diodes (OLED), organic light emitting transistors (OLET), electroluminescent displays, organic photovoltaic (OPV) cells, organic solar cells (O-SC), flexible OPVs and O-SCs, organic laserdiodes (O-laser), organic integrated circuits (O-IC), lighting devices, sensor devices, electrode materials, photoconductors, photodetectors, electrophotographic recording devices, capacitors, charge injection layers, Schottky diodes, planarising layers, antistatic films, conducting substrates, conducting patterns, photoconductors, electrophotographic devices, organic memory devices, biosensors and biochips.

According to a preferred embodiment, the present invention provides organic light emitting diodes (OLED). OLED devices can for example be used for illumination, for medical illumination purposes, as signalling device, as signage devices, and in displays. Displays can be addressed using passive matrix driving, total matrix addressing or active matrix driving. Transparent OLEDs can be manufactured by using optically transparent electrodes. Flexible OLEDs are assessable through the use of flexible substrates.

The formulations, methods and devices of the present invention provide surprising improvements in the efficiency of the OE devices and the production thereof. Unexpectedly, the performance, the lifetime and the efficiency of the OE devices can be improved, if these devices are achieved by using a composition of the present invention. Furthermore, it was surprisingly found that these formulations are suitable for printing techniques, especially for flexographic and gravure printing. Furthermore, the composition of the present invention provides an astonishingly high level of film forming. Especially, the homogeneity and the quality of the films can be improved. In addition thereto, the present invention enables better printing of multi layer devices.

In addition thereto, the formulations enable a low-cost and easy printing process. The printing processes allow a high quality printing at high speed.

DETAILED DESCRIPTION OF THE INVENTION

The present formulation has a viscosity at 25° C. of less than 15, more preferably less than 13, especially less than 11 and most preferably less than 10 mPas. Preferably, the formulation has a viscosity in the range of 0.5 to 9.5 mPas, especially from 1 to 9 mPas and more preferably from 1.5 to 8.5 mPas. According to a further aspect of the present invention, the viscosity is preferably situated in the range of 2 to 6 mPas. The viscosity is determined at a temperature of 25° C. by measuring on AR-G2 rheometer manufactured by TA Instruments. This is measured using a parallel plate geometry.

The viscosity of the formulation can be achieved by using appropriate solvents and other additives in suitable amounts.

Consequently, the formulation of the present invention comprises at least one organic solvent having a viscosity at 25° C. of less than 15 mPas and a boiling point of at most 400° C.

The solvent has a boiling point or sublimation temperature of <400° C., especially ≤350° C., more preferably ≤300° C., most preferably ≤250° C., at the pressure employed, very preferably at atmospheric pressure (1013 hPa). Evaporation can also be accelerated e.g. by applying heat and/or reduced pressure.

Further preferably the boiling point of the solvent, or of the lowest boiling solvent of the solvent blend, is at least 130° C., more preferably at least 150° C. at atmospheric pressure (1013 hPa).

According to a special embodiment of the present invention, the formulation may comprise a is mixture of organic compounds as solvent having different boiling points and the boiling point of the compound with the lowest boiling point is at least 10° C. below the boiling point of the compound with the highest boiling point.

Furthermore, the formulation may comprise a mixture of organic compounds as solvent having boiling points and the boiling point of the compound with the lowest boiling point is at most 100° C. below the boiling point of the compound with the highest boiling point.

The partition ratio log P (in the literature also referred to as "partition coefficient") of a compound or solvent is given by equation (1)

$$\log P = \log([A]_{oct}/[A]_{aq}) \quad (1)$$

wherein $[A]_{oct}$ is the concentration of the compound or solvent in octanol and $[A]_{aq}$ is the concentration of the compound or solvent in water.

(See IUPAC Compendium of Chemical Terminology, Electronic version, http://goldbook.iupac.org/P04440.html, PAC 1993, 65, 2385, and C. Hansch, Acc. Chem. Res. 2, 232, (1969)).

In case of a solvent blend, which comprises two or more solvents, the partition ratio of the blend is defined as the weighted average $(\log P)_w$ of the partition ratios of all solvents contained in the blend, as given by equation (2)

$$(\log P)_w = \sum_{i=1}^{n} w_i \log P_i \quad (2)$$

with n being the number of solvents, $\log P_i$ being the log P value of a single solvent in the solvent blend, and $w_i$ being the weight fraction (concentration in % by weight/100) of said solvent in the solvent blend.

The log P values are measured by measuring the concentration in each phase (e.g. by GC, HPLC, UV/vis etc.) after equilibrating a dilute solution in equal volumes of water and octanol. For a rough estimation log P can be calculated by molecular calculation using "Chem Bio Draw Ultra version 11.0 (2007)" software, produced and marketed by Cambridge Soft., unless stated otherwise.

According to a preferred embodiment of the present invention, the logarithm of the partition ratio log P of the solvent, or the weighted average of the partition ratio $(\log P)_W$ of the solvent blend is >1.5, more preferably >2 and most preferably >2.5. Preferably these values relate to the calculated log P for each solvent.

The solvents can generally be selected from any chemical class that meets the physical criteria mentioned above, including, but not limited to, aliphatic or aromatic hydrocarbons, amines, thiols, amides, esters, ethers, polyethers, alcohols, diols and polyols. Preferably, the solvent comprises at least one aromatic and/or heteroaromatic compound.

Suitable and preferred solvents include for example aromatic hydrocarbons (eg halogenated aromatics) and aromatic hydrocarbons having an alkyl group having 1 to 8 carbon atoms and more preferably 1 to 6 carbon atoms especially toluene, dimethyl benzenes (xylenes), trimethyl benzenes, and methyl naphthalenes; and aromatic hydrocarbon compound having a cycloalkyl group, especially cyclopentyl benzene and cyclohexyl benzene.

According to a further embodiment of the present invention, aromatic compounds comprising hetero atoms may be used such as esters, ethers, nitriles or amides. Preferably, these compounds include aromatic alkoxy compounds such as 3-methylanisol, 2-isopropylanisol, 5-methoxyindan, 2-ethoxynaphthalene, aromatic esters such as butylbenzoate, ethylbenzoate. Furthermore, heteroaromatic compounds having at least one O, N or S atom in the aromatic ring are preferred. These compounds include e.g. 2-bromo-3-(bromomethyl)thiophene, 2-methylindole, 6-methyl quinoline and thiophene.

The solvents can be used as mixture of two, three or more.

Astonishing improvements can be achieved with mixtures of hydrocarbon aromatic compounds. Preferably, the mixture can comprise at least one aromatic hydrocarbon having an alkyl group having 1 to 8 carbon atoms and at least one aromatic hydrocarbon compound having a cycloalkyl group.

Preferred organic solvents can comprise Hansen Solubility parameters of $H_d$ in the range of 17.0 to 23.2 MPa$^{0.5}$, $H_p$ in the range of 0.2 to 12.5 MPa$^{0.5}$ and $H_h$ in the range of 0.0 to 20.0 MPa$^{0.5}$. More preferred organic solvents comprise Hansen Solubility parameters of $H_d$ in the range of 17.0 to 23.2 MPa$^{0.5}$, $H_p$ in the range of 0.2 to 10.5 MPa$^{0.5}$ and $H_h$ in the range of 0.0 to 5.0 MPa$^{0.5}$.

Particular useful organic solvents comprise a surface tension of in the range of 22 to 50 mN/m, especially in the range of 25 to 40 mN/m, and more preferably of in the range of 28 to 37 mN/m.

According to a special aspect of the present invention a mixture of solvents can be used having different surface tensions. Preferably, the mixture can comprise at least one solvent having a surface tension of at most 35 mN/m, especially of at most 30 mN/m and at least one solvent having a surface tension of at least 30, especially of at least 32 mN/m and the difference of the surface tension is at least 1 mN/m, more preferably at least 2 mN/m.

The surface tension can be measured using a FTA (First Ten Angstrom) 125 contact angle goniometer at 25° C. Details of the method are available from First Ten Angstrom as published by Roger P. Woodward, Ph.D. "Surface Tension Measurements Using the Drop Shape Method". Preferably, the pendant drop method can be used to determine the surface tension.

For the purpose for making a rough estimate, the surface tension can be calculated using the Hansen Solubility Parameters by the formula expounded in Hansen Solubility Parameters: A User's Handbook, Second Edition, C. M. Hansen (2007), Taylor and Francis Group, LLC (HSPiP manual).

$$\text{Surface tension} = 0.0146 \times (2.28 \times \delta H_d^2 + \delta H_p^2 + \delta H_h^2) \times \text{MVol}^{0.2},$$

where:
$H_d$ refers to Dispersion contribution
$H_p$ refers to Polar contribution
$H_h$ refers to Hydrogen bonding contribution
MVol refers to Molar Volume.

The Hansen Solubility Parameters can be determined according to the Hansen Solubility Parameters in Practice (HSPiP) program ($2^{nd}$ edition) as supplied by Hanson and Abbot et al. Suitable solvents, their Hansen Solubility Parameters, their surface tension and their boiling points are provided in Table 1.

TABLE 1

Hansen Solubility Parameters of useful solvents

| Solvent | $H_d$ [MPa$^{0.5}$] | $H_h$ [MPa$^{0.5}$] | $H_p$ [MPa$^{0.5}$] | Surface Tension [mN/m] Calc. (Actual) | Boiling Point [° C.] Calc. (Actual) |
|---|---|---|---|---|---|
| 1,2,3,4-tetrahydronaphthalene (tetralin) | 19.1 | 2.3 | 4 | 33.3 (33.2) | 206.9 (207) |
| 1,2,3,4-tetramethylbenzene | 18.7 | 1.8 | 1.6 | 32.0 | 198.5 ( ) |
| 1,2,3,5-tetramethylbenzene | 18.7 | 1.8 | 1.6 | 32.0 | 198.5 ( ) |
| 1,2,3-trimethylbenzene | 19.0 | 2.9 | 1.6 | 32.6 | 171.6 ( ) |
| 1,2,4,5-tetramethylbenzene | 18.7 | 1.8 | 1.6 | 32.0 | 198.5 ( ) |
| 1,2,4-trichlorobenzene | 20.5 | 6.9 | 2.7 | 39.0 | 204.8 ( ) |
| 1,2,4-trimethylbenzene | 19.0 | 2.9 | 1.6 | 32.6 | 171.6 ( ) |
| 1,2-dihydronaphthalene | 20.1 | 5.5 | 4.9 | 37.7 | 209.5 (206) |
| 1,2-dimethylnaphthalene | 17.6 | 1.7 | 5.2 | 29.9 | 261.5 (266) |
| 1,3,3-trimethyl-2-methyleneindole | 17.9 | 1 | 3 | 30.6 | 296.9 (248) |
| 1,3-benzodioxole | 19.7 | 7.4 | 7.9 | 37.1 | 169.5 ( ) |
| 1,3-diisopropylbenzene | 17.5 | 0.2 | 1.1 | 29.2 | 200 ( ) |
| 1,3-dimethylnaphthalene | 17.6 | 1.7 | 5.2 | 29.9 | 261.5 (263) |
| 1,4-benzodioxane | 19.5 | 8.7 | 7.2 | 37.8 | 178.7 ( ) |
| 1,4-diisopropylbenzene | 17.5 | 0.6 | 1.6 | 29.2 | 206.7 ( ) |
| 1,4-dimethylnaphthalene | 17.6 | 1.7 | 5.2 | 29.9 | 261.5 (262) |
| 1,5-dimethyltetralin | 19.3 | 5.5 | 2.6 | 36.2 | 243 ( ) |
| 1-benzothiophene | 19.7 | 12.3 | 6.3 | 36.5 | 107.5 ( ) |
| 1-bromonaphthalene | 20.1 | 10.3 | 6.1 | 37.9 | 262.8 (133) |
| 1-chloromethyl naphthalene | 19.6 | 9.9 | 5.3 | 36.6 | 285 (287) |
| 1-ethylnaphthalene | 18.8 | 7.8 | 4.4 | 33.2 | 254 (258) |
| 1-methoxynaphthalene | 19.1 | 10.5 | 7.5 | 35.2 | 260.8 (269) |
| 1-methyl naphthalene | 19.2 | 8.4 | 4.5 | 34.0 (36.3) | 240 (243) |
| 1-methylindane | 19.4 | 5.7 | 2.5 | 35.2 | 199.1 ( ) |
| 1-methylindole | 19.2 | 8.1 | 10 | 35.7 | 90 (133) |
| 2,3,3-trimethoxyindolenine | 19.6 | 6.8 | 4.2 | 37.7 | 228.4 (228) |
| 2,3-benzofuran | 21.3 | 5.5 | 5.6 | 38.0 | 113.7 ( ) |
| 2,3-dihydrobenzofuran | 19.9 | 9.5 | 6.6 | 39.0 | 180.4 ( ) |
| 2,3-dimethylanisol | 18.9 | 4.6 | 4.5 | 33.7 | 192.8 ( ) |
| 2,4-dimethylanisol | 18.9 | 4.6 | 4.5 | 33.7 | 192.8 ( ) |
| 2,5-dimethylanisol | 18.9 | 4.6 | 4.5 | 33.7 | 192.8 ( ) |
| 2,6-diisopropyl naphthalene | 16.8 | 3.5 | 2.2 | 28.3 | 299 (300) |
| 2,6-dimethylanisol | 18.9 | 4.6 | 4.5 | 33.7 | 192.8 ( ) |
| 2,6-dimethylnaphthalene | 17.6 | 5 | 3 | 29.9 | 261.5 (262) |
| 2-bromo-3-(bromomethyl)thiophene | 19.3 | 7.3 | 6.6 | 36.4 | 236.4 ( ) |
| 2-bromomethyl naphthalene | 19.6 | 9.4 | 7.2 | 37.4 | 289.6 (291) |
| 2-bromonaphthalene | 20.1 | 10.3 | 6.1 | 37.9 | 262.8 (281) |
| 2-ethoxynaphthalene | 18.7 | 10 | 7 | 34.3 | 271.6 (282) |
| 2-ethylnaphthalene | 18.8 | 7.8 | 4.4 | 33.2 | 254.1 (251) |
| 2-isopropylanisol | 17.7 | 4.3 | 5.4 | 30.8 | 201.5 ( ) |
| 2-methyl quinoline | 20.0 | 7.8 | 4 | 35.7 | 141.5 ( ) |
| 2-methylanisol | 18.3 | 5.1 | 6.2 | 31.9 | 169 ( ) |
| 2-methylindole | 17.8 | 9.7 | 4.8 | 29.6 | 134.3 (228) |
| 3,4-dimethyl anisole | 18.9 | 4.6 | 4.5 | 33.7 | 192.8 (201) |
| 3,5-dimethylanisol | 18.9 | 4.6 | 4.5 | 33.7 | 192.8 ( ) |
| 3-bromoquinoline | 21.4 | 8.7 | 5.1 | 41.2 | 169.3 ( ) |
| 3-isopropylbiphenyl | 19.1 | 1.3 | 1.9 | 35.3 | 277.1 ( ) |
| 3-methylanisol | 18.7 | 5.7 | 5.4 | 33.1 | 171.7 ( ) |
| 4-isopropylbiphenyl | 19.0 | 2.5 | 1.9 | 35.2 | 282.4 |
| 4-methyl anisole | 18.6 | 5.9 | 7.2 | 33.8 | 178.5 (174) |
| 4-phenyl-2-butanone (benzyl acetone) | 18.3 | 8.8 | 5 | 34.4 | 241.4 |
| 5-decanolide | 17.1 | 7.8 | 3.8 | 30.7 | 278.4 |
| 5-methoxyindan | 19.8 | 9.8 | 4 | 39.7 | 235.9 (232.5) |
| 5-methoxyindole | 17.4 | 12.3 | 7.8 | 32.7 | 158.2 (176) |
| 5-tert-butyl-m-xylene | 17.6 | 3.4 | 2.2 | 30.1 | 213.8 |
| 6-methoxy-1,2,3,4-tetrahydronapthalene | 19.4 | 6.8 | 5.4 | 37.6 | 241 (269) |
| 6-methyl quinoline | 21.7 | 8.4 | 4.5 | 41.9 | 140.4 |
| 8-methyl quinoline | 21.7 | 8.4 | 4.5 | 41.9 | 140.4 |
| Acetophenone | 18.8 | 10.8 | 5.5 | 36.1 | 187.1 |
| Anisole | 18.5 | 5.5 | 5.2 | 31.4 (34.5) | 144.8 (154) |
| a-pinene | 17.4 | 3 | 3.2 | 28.5 (27.6) | 165.2 |
| Benzonitrile | 19.2 | 11.9 | 4.7 | 36.9 (39.0) | 193.7 |
| Benzothiazole | 21.3 | 5.5 | 5.6 | 38.0 | 113.7 |
| benzyl acetate | 18.2 | 7.3 | 6.4 | 33.5 | 215.8 |
| Bromobenzene | 19.8 | 7.6 | 4.3 | 35.8 | 162.9 |

TABLE 1-continued

Hansen Solubility Parameters of useful solvents

| Solvent | $H_d$ [MPa$^{0.5}$] | $H_h$ [MPa$^{0.5}$] | $H_p$ [MPa$^{0.5}$] | Surface Tension [mN/m] Calc. (Actual) | Boiling Point [° C.] Calc. (Actual) |
|---|---|---|---|---|---|
| Butylbenzene | 17.6 | 2.6 | 1.7 | 28.7 | 183.1 |
| Butylbenzoate | 17.7 | 5.9 | 5.2 | 31.9 | 241.8 |
| Butyl phenyl ether | 17.8 | 4.1 | 5 | 30.9 | 208 (210) |
| Cyclohexylbenzene | 18.6 | 1 | 1.6 | 32.3 (34.3) | 238.7 (239) |
| Decahydronaphthalene | 17.5 | 0.4 | 1 | 28.2 (30.9) | 192 (189) |
| dimethoxytoluene | 18.8 | 6.5 | 7 | 35.8 | 225 |
| diphenyl ether | 19.9 | 2.9 | 3.3 | 37.1 | 268.4 (259) |
| ethyl phenyl keton (propiophenone) | 18.3 | 8.9 | 5.3 | 33.9 | 202.5 |
| Ethylbenzene | 18.2 | 2.7 | 2.1 | 29.3 (28.6) | 141.1 |
| Ethylbenzoate | 18.1 | 6.6 | 5.9 | 32.5 | 210 (212) |
| gamma-terpinene | 18.0 | 2.5 | 2.8 | 30.2 | 180.4 |
| Hexylbenzene | 17.4 | 2.9 | 1.6 | 29.2 | 226.2 |
| Indan | 19.7 | 7.3 | 5.8 | 37.0 | 188.9 (176) |
| indene | 20.3 | 4.4 | 5.4 | 37.3 | 188.6 |
| iso-amylbenzene | 17.1 | 3.7 | 1.8 | 28.0 | 198.5 |
| iso-butylbenzene | 17.1 | 2.9 | 1.6 | 27.2 | 179.3 |
| Isochroman | 19.6 | 5.4 | 3.8 | 35.4 | 201 |
| isopropylbenzene (cumene) | 17.8 | 2 | 1.1 | 28.5 (27.4) | 155 |
| m-cymene | 18.1 | 2 | 2.1 | 30.3 | 173.7 |
| mesitylene | 19.0 | 2.9 | 1.6 | 32.6 (28.5) | 171.6 (166) |
| methyl benzoate | 18.5 | 7.9 | 6.4 | 34.8 | 215.8 |
| methylphenylacetate | 18.2 | 7.3 | 6.4 | 33.5 | 215.8 |
| m-xylene | 18.8 | 3.1 | 2.7 | 31.4 | 144.8 |
| n-butoxybenzene | 17.5 | 4.4 | 4.1 | 29.7 | 202.1 |
| n-butylbenzene | 17.6 | 2.6 | 1.7 | 28.7 | 183.1 |
| n-propyl benzoate (propyl benzoate) | 17.8 | 6.6 | 6.3 | 32.5 | 222.7 |
| n-propylbenzene | 17.8 | 3.4 | 2.8 | 29.1 | 161.5 |
| o-dichlorobenzene | 19.5 | 8.7 | 3.3 | 35.9 | 179.8 |
| o-diethylbenzenes | 17.7 | 0.7 | 1.9 | 32.6 | 321.3 |
| o-ethyltoluene | 18.0 | 1.9 | 2.8 | 29.4 | 161.5 |
| o-xylene | 18.4 | 2 | 2.9 | 29.9 (29.5) | 147.7 |
| pentylbenzene | 17.4 | 3 | 1.8 | 28.7 | 204.1 |
| p-ethyltoluene | 18.3 | 3.5 | 2.8 | 30.7 | 168.6 |
| phenetol | 18.1 | 4.6 | 4.6 | 30.5 | 163.7 (170) |
| phenyl acetate | 18.5 | 7.9 | 6.4 | 34.0 | 194.4 |
| p-isopropyltoluene (p-cymene) | 18.0 | 2.5 | 2.8 | 30.2 | 180.4 |
| propiophenone | 18.3 | 8.9 | 5.3 | 33.9 | 202.5 |
| p-xylene | 18.7 | 3.3 | 3.3 | 31.3 (27.8) | 151.7 |
| sec-butylbenzene | 17.2 | 2.2 | 1.6 | 27.3 | 176.8 |
| t-butylbenzene | 17.2 | 1.3 | 2.9 | 27.5 | 168 |
| thiophene | 18.8 | 5.2 | 7.4 | 30.9 | 91.9 |
| toluene | 18.6 | 4 | 2.2 | 30.0 | 118.3 |
| veratrole | 18.2 | 6.3 | 8 | 33.1 | 190 (206) |

$H_d$ refers to Dispersion contribution
$H_p$ refers to Polar contribution
$H_h$ refers to Hydrogen bonding contribution The present formulation comprises at least one organic semiconducting compound (OSC). The OSC compounds can be selected from standard materials known to the skilled person and described in the literature. The OSC may be a monomeric compound (also referred to as "small molecule", as compared to a polymer or macromolecule), a polymeric compound, or a mixture, dispersion or blend containing one or more compounds selected from either or both of monomeric and polymeric compounds.

In one preferred embodiment of the present invention the OSC is selected from monomeric compounds, where it is easier to achieve a significant variation in the degree of crystallinity.

According to an aspect of the present invention, the OSC is preferably a conjugated aromatic molecule, and contains preferably at least three aromatic rings, which can be fused or unfused. Unfused rings are connected e.g. via a linkage group, a single bond or a spiro-linkage. Preferred monomeric OSC compounds contain one or more rings selected from the group consisting of 5-, 6- or 7-membered aromatic rings, and more preferably contain only 5- or 6-membered aromatic rings. The material may be a monomer, oligomer or polymer, including mixtures, dispersions and blends.

Each of the aromatic rings optionally contains one or more hetero atoms selected from Se, Te, P, Si, B, As, N, O or S, preferably from N, O or S.

The aromatic rings may be optionally substituted with alkyl, alkoxy, polyalkoxy, thioalkyl, acyl, aryl or substituted aryl groups, halogen, particularly fluorine, cyano, nitro or an optionally substituted secondary or tertiary alkylamine or arylamine represented by —N($R^x$)($R^y$), where $R^x$ and $R^y$ independently of each other denote H, optionally substituted alkyl, optionally substituted aryl, alkoxy or polyalkoxy groups. Where $R^x$ and/or $R^y$ denote alkyl or aryl these may be optionally fluorinated.

Preferred rings are optionally fused, or are optionally linked with a conjugated linking group such as —C($T^1$)=C($T^2$)-, —C≡C— —N($R^z$)—, —N=N—, —($R^z$)C=N—, —N=C($R^z$)—, wherein $T^1$ and $T^2$ independently of each other denote H, Cl, F, —C≡N— or a lower alkyl group, preferably a $C_{1-4}$ alkyl group, and $R^z$ denotes H, optionally substituted alkyl or optionally substituted aryl. Where $R^z$ is alkyl or aryl these may be optionally fluorinated.

Preferred OSC compounds include small molecules (i.e. monomeric compounds), polymers, oligomers and derivatives thereof, selected from condensed aromatic hydrocarbons such as tetracene, chrysene, pentacene, pyrene, perylene, coronene, or soluble substituted derivatives of the aforementioned; oligomeric para substituted phenylenes such as p-quaterphenyl (p-4P), p-quinquephenyl (p-5P), p-sexiphenyl (p-6P), or soluble substituted derivatives of the aforementioned; conjugated hydrocarbon polymers such as polyacene, polyphenylene, poly(phenylene vinylene), polyfluorene, polyindenofluorene, including oligomers of these conjugated hydrocarbon polymers; conjugated heterocyclic polymers such as poly(3-substituted thiophene), poly(3,4-bisubstituted thiophene), polyselenophene, poly(3-substituted selenophene), poly(3,4-bisubstituted selenophene), polybenzothiophene, polyisothianapthene, poly(N-substituted pyrrole), poly(3-substituted pyrrole), poly(3,4-bisubstituted pyrrole), polyfuran, polypyridine, poly-1,3,4-oxadiazole, polyiso-thianaphthene, poly(N-substituted aniline), poly(2-substituted aniline), poly(3-substituted aniline), poly(2,3-bisubstituted aniline), polyazulene, polypyrenepolybenzofuran; polyindole, polypyridazine, polytriarylamines such as optionally substituted polytriphenylamines; pyrazoline compounds; benzidine compounds; stilbene compounds; triazines; substituted metallo- or metal-free porphines, phthalocyanines, fluorophthalocyanines, naphthalocyanines or fluoronaphthalocyanines; $C_{60}$ and $C_{70}$ fullerenes or derivatives thereof; N,N'-dialkyl, substituted dialkyl, diaryl or substituted diaryl-1,4,5,8-naphthalenetetracarboxylic diimide and fluoro derivatives; N,N'-dialkyl, substituted dialkyl, diaryl or substituted diaryl 3,4,9,10-perylenetetracarboxylic diimide; bathophenanthroline; diphenoquinones; 1,3,4-oxadiazoles; 11,11,12,12-tetracyanonaptho-2,6-quinodimethane; $\alpha,\alpha'$-bis(dithieno[3,2-b:2',3'-d]thiophene); 2,8-dialkyl, substituted dialkyl, diaryl or substituted diaryl anthradithiophene; 2,2'-bibenzo[1,2-b:4,5-b']-dithiophene. Preferred compounds are those from the above list and derivatives thereof which are soluble.

Especially preferred OSC materials are substituted polyacenes, such as 6,13-bis(trialkylsilylethynyl)pentacene or derivatives thereof, such as 5,11-bis(trialkylsilylethynyl)anthradithiophenes, as described for example in U.S. Pat. No. 6,690,029, WO 2005/055248 A1, or WO 2008/107089 A1. A further preferred OSC material is poly(3-substituted thiophene), very preferably poly(3-alkylthiophenes) (P3AT) wherein the alkyl group is preferably straight-chain and preferably has 1 to 12, most preferably 4 to 10 C-atoms, like e.g. poly(3-hexylthiophene).

Particularly preferred polymeric OSC compounds are polymers or copolymers comprising one or more repeating units selected from the group consisting of thiophene-2,5-diyl, 3-substituted thiophene-2,5-diyl, optionally substituted thieno[2,3-b]thiophene-2,5-diyl, optionally substituted thieno[3,2-b]thiophene-2,5-diyl, selenophene-2,5-diyl, 3-substituted selenophene-2,5-diyl, optionally substituted indenofluorene, optionally substituted phenanthrene and optionally substituted triarylamine.

The composition according to the present invention can comprise between 0.01 and 20% by weight, preferably between 0.1 and 15% by weight, more preferably between 0.2 and 10% by weight and most preferably between 0.25 and 5% by weight of OSC materials or the corresponding blend. The percent data relate to 100% of the solvent or solvent mixture. The composition may comprise one or more than one, preferably 1, 2, 3 or more than three OSC compounds.

The organic semiconductor compound used here is either a pure component or a mixture of two or more components, at least one of which must have semiconducting properties. In the case of the use of mixtures, however, it is not necessary for each component to have semiconducting properties. Thus, for example, inert low-molecular-weight compounds can be used together with semiconducting polymers. It is likewise possible to use non-conducting polymers, which serve as inert matrix or binder, together with one or more low-molecular-weight compounds or further polymers having semiconducting properties. For the purposes of this application, the potentially admixed non-conducting component is taken to mean an electro-optically inactive, inert, passive compound.

Preference is given to solutions of polymeric organic semiconductors, which optionally comprise further admixed substances. The molecular weight $M_w$ of the polymeric organic semiconductor is preferably greater than 10,000 g/mol, more preferably between 50,000 and 2,000,000 g/mol and most preferably between 100,000 and 1,000,000 g/mol.

For the purposes of the present invention, polymeric organic semiconductors are taken to mean, in particular, (i) substituted poly-p-arylene-vinylenes (PAVs) as disclosed in EP 0443861, WO 94/20589, WO 98/27136, EP 1025183, WO 99/24526, DE 19953806 and EP 0964045 which are soluble in organic solvents, (ii) substituted polyfluorenes (PFs) as disclosed in EP 0842208, WO 00/22027, WO 00/22026, DE 19846767, WO 00/46321, WO 99/54385 and WO 00155927 which are soluble in organic solvents, (iii) substituted polyspirobifluorenes (PSFs) as disclosed in EP 0707020, WO 96/17036, WO 97/20877, WO 97/31048, WO 97/39045 and WO 031020790 which are soluble in organic solvents, (iv) substituted poly-para-phenylenes (PPPs) or -biphenylenes as disclosed in WO 92/18552, WO 95/07955, EP 0690086, EP 0699699 and WO 03/099901 which are soluble in organic solvents, (v) substituted polydihydrophenanthrenes (PDHPs) as disclosed in WO 05/014689 which are soluble in organic solvents, (vi) substituted poly-trans-indenofluorenes and poly-cis-indenofluorenes (PIFs) as disclosed in WO 04/041901 and WO 04/113412 which are soluble in organic solvents, (vii) substituted polyphenanthrenes as disclosed in DE 102004020298 which are soluble in organic solvents, (viii) substituted polythiophenes (PTs) as disclosed in EP 1028136 and WO 95/05937 which are soluble in organic solvents, (ix) polypyridines (PPys) as disclosed in T. Yamamoto et at., J. Am. Chem. Soc. 1994, 116, 4832 which are soluble in organic solvents, (x) polypyrroles as disclosed in V. Gelling et at., Polym. Prepr. 2000, 41, 1770 which are soluble in organic solvents, (xi) substituted, soluble copolymers having structural units from two or more of classes (i) to (x), as described, for example, in WO 02/077060, (xii) conjugated polymers as disclosed in Proc. of ICSM '98, Part I & II (in: Synth. Met 1999, 101/102) which are soluble in organic solvents, (xiii) substituted and unsubstituted polyvinylcarbazoles (PVKs), as disclosed, for example, in R. C. Penwell et al., J. Polym. Sci., Macromol Rev. 1978, 13, 63-160, (xiv) substituted and unsubstituted triarylamine polymers, as disclosed, for example, in JP 2000/072722, (xv) substituted and unsubstituted polysilylenes and polygermylenes, as disclosed, for example, in M. A. Abkowitz and M. Stolka, Synth. Met. 1996, 78, 333, and (xvi) soluble polymers containing phosphorescent units, as disclosed, for example in EP 1245659, WO 03/001616, WO 03/018653, WO 03/022908, WO 03/080687, EP 1311138, WO 031102109, WO 04/003105, WO 04/015025, DE 102004032527 and some of the specifications already cited above.

According to a further embodiment of the present invention, the organic semiconducting compound preferably has a molecular weight of 5000 g/mol or less, especially a molecular weight of 2000 g/mol or less.

According to a special embodiment of the present invention, the OSC can be used for example as the active channel material in the semiconducting channel of an OFET, or as a layer element of an organic rectifying diode.

In case of OFET devices, where the OFET layer contains an OSC as the active channel material, it may be an n- or p-type OSC. The semiconducting channel may also be a composite of two or more OSC compounds of the same type, i.e. either n- or p-type. Furthermore, a p-type channel OSC compound may for example be mixed with an n-type OSC compound for the effect of doping the OSC layer. Multilayer semiconductors may also be used. For example, the OSC may be intrinsic near the insulator inter-face and a highly doped region can additionally be coated next to the intrinsic layer.

Preferred OSC compounds have a FET mobility of greater than $1 \times 10^{-5}$ cm$^2$V$^{-1}$ s$^{-1}$, very preferably greater than $1 \times 10^{-2}$ cm$^2$V$^{-1}$ s$^{-1}$.

Particularly preferred polymeric OSC compounds are selected from formulae P1-P7:

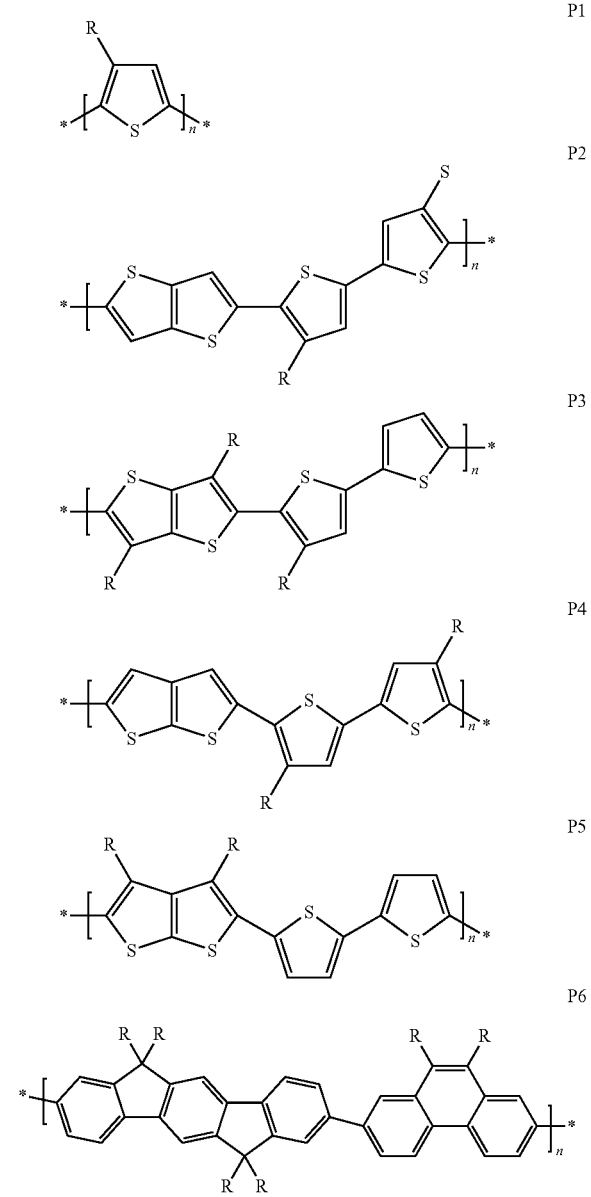

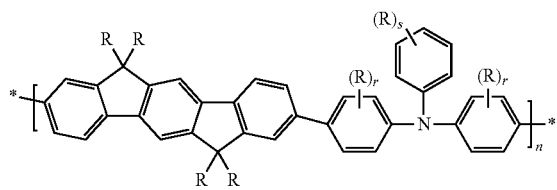

wherein
n is an integer >1, preferably from 10 to 1,000,
R on each occurrence identically or differently denotes H, F, Cl, Br, I, CN, a straight-chain, branched or cyclic alkyl group having from 1 to 40 C atoms, in which one or more C atoms are optionally replaced by O, S, O—CO, CO—O, O—CO—O, CR$^0$=CR$^0$ or C≡C such that O- and/or S-atoms are not linked directly to each other, and in which one or more H atoms are optionally replaced by F, Cl, Br, I or CN, or denotes an aryl or heteroaryl group having from 4 to 20 ring atoms that is unsubstituted or substituted by one or more non-aromatic groups R$^s$, and wherein one or more groups R may also form a mono- or polycyclic aliphatic or aromatic ring system with one another and/or with the ring to which they are attached,
R$^s$ on each occurrence identically or differently denotes F, Cl, Br, I, CN, Sn(R$^{00}$)$_3$, Si(R$^{00}$)$_3$ or B(R$^{00}$)$_2$ a straight-chain, branched or cyclic alkyl group having from 1 to 25 C atoms, in which one or more C atoms are optionally replaced by O, S, O—CO, CO—O, O—CO—O, CR$^0$=CR$^0$, C≡C such that O- and/or S-atoms are not linked directly to each other, and in which one or more H atoms are optionally replaced by F, Cl, Br, I or CN, or R$^s$ denotes an aryl or heteroaryl group having from 4 to 20 ring atoms that is unsubstituted or substituted by one or more non-aromatic groups R$^s$, and wherein one or more groups R$^s$ may also form a ring system with one another and/or with R,
R$^0$ on each occurrence identically or differently denotes H, F, Cl, CN, alkyl having from 1 to 12 C atoms or aryl or heteroaryl having from 4 to 10 ring atoms,
R$^{00}$ on each occurrence identically or differently denotes H or an aliphatic or aromatic hydrocarbon group having from 1 to 20 C atoms, wherein two groups R$^{00}$ may also form a ring together with the hetero atom (Sn, Si or B) to which they are attached,
r is 0, 1, 2, 3 or 4,
s is 0, 1, 2, 3, 4 or 5,
wherein R in formulae P1-P5 is preferably different from H.

Especially preferred monomeric OSC compounds are selected from the group consisting of substituted oligoacenes such as pentacene, tetracene or anthracene, or heterocyclic derivatives thereof, like bis(trialkylsilylethynyl)oligoacenes or bis(trialkylsilylethynyl)heteroacenes, as disclosed for example in U.S. Pat. No. 6,690,029, WO 2005/055248 A1 or U.S. Pat. No. 7,385,221.

Particularly preferred monomeric OSC compounds are selected from formula M1 (polyacenes):

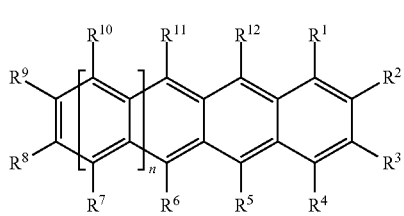

wherein each of $R^1$, $R^2$, $R^3$, $R^4$, $R^5$, $R^6$, $R^7$, $R^8$, $R^9$, $R^{10}$, $R^{11}$ and $R^{12}$, which may be the same or different, independently represents: hydrogen; an optionally substituted $C_1$-$C_{40}$ carbyl or hydrocarbyl group; an optionally substituted $C_1$-$C_{40}$ alkoxy group; an optionally substituted $C_6$-$C_{40}$ aryloxy group; an optionally substituted $C_7$-$C_{40}$ alkylaryloxy group; an optionally substituted $C_2$-$C_{40}$ alkoxycarbonyl group; an optionally substituted $C_7$-$C_{40}$ aryloxycarbonyl group; a cyano group (—CN); a carbamoyl group (—C(=O)NH$_2$); a haloformyl group (—C(=O)—X, wherein X represents a halogen atom); a formyl group (—C(=O)—H); an isocyano group; an isocyanate group; a thiocyanate group or a thioisocyanate group; an optionally substituted amino group; a hydroxy group; a nitro group; a CF$_3$ group; a halo group (Cl, Br, F); or an optionally substituted silyl or alkynylsilyl group; and wherein independently each pair of $R^1$ and $R^2$, $R^2$ and $R^3$, $R^3$ and $R^4$, $R^7$ and $R^8$, $R^8$ and $R^9$, $R^9$ and $R^{10}$, is optionally cross-bridged to form a $C_4$-$C_{40}$ saturated or unsaturated ring, which saturated ring may be intervened by an oxygen atom, a sulphur atom or a group of the formula —N($R^a$)—, wherein $R^a$ is a hydrogen atom or an optionally substituted hydrocarbon group, or may optionally be substituted; and wherein one or more of the carbon atoms of the polyacene skeleton may optionally be substituted by a heteroatom selected from N, P, As, O, S, Se and Te; and wherein independently any two or more of the substituents $R^1$-$R^{12}$ which are located on adjacent ring positions of the polyacene may, together, optionally constitute a further $C_4$-$C_{40}$ saturated or unsaturated ring optionally intervened by O, S or —N($R^a$), where $R^a$ is as defined above, or an aromatic ring system, fused to the polyacene; and wherein n is 0, 1, 2, 3 or 4 preferably n is 0, 1 or 2, most preferably n is 0 or 2, meaning that the polyacene compound is a pentacene compound (if n=2) or a "pseudo pentacene" compound (if n=0).

Very preferred are compounds of formula M1a (substituted pentacenes):

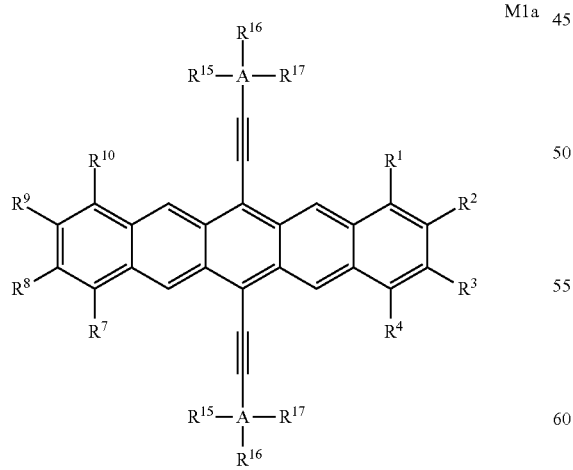

M1a wherein $R^1$, $R^2$, $R^3$, $R^4$, $R^7$, $R^8$, $R^9$, $R^{10}$, $R^{15}$, $R^{16}$, $R^{17}$ each independently are the same or different and each independently represents: H; an optionally substituted $C_1$-$C_{40}$ carbyl or hydrocarbyl group; an optionally substituted $C_1$-$C_{40}$ alkoxy group; an optionally substituted $C_6$-$C_{40}$ aryloxy group; an optionally substituted $C_7$-$C_{40}$ alkylaryloxy group; an optionally substituted $C_2$-$C_{40}$ alkoxycarbonyl group; an optionally substituted $C_7$-$C_{40}$ aryloxycarbonyl group; a cyano group (—CN); a carbamoyl group (—C(=O)NH$_2$); a haloformyl group (—C(=O)—X, wherein X represents a halogen atom); a formyl group (—C(=O)—H); an isocyano group; an isocyanate group; a thiocyanate group or a thioisocyanate group; an optionally substituted amino group; a hydroxy group; a nitro group; a CF$_3$ group; a halo group (Cl, Br, F); or an optionally substituted silyl group; and A represents Silicon or Germanium; and wherein independently each pair of $R^1$ and $R^2$, $R^2$ and $R^3$, $R^3$ and $R^4$, $R^7$ and $R^8$, $R^8$ and $R^9$, $R^9$ and $R^{10}$, $R^{15}$ and $R^{16}$, and $R^{16}$ and $R^{17}$ is optionally cross-bridged with each other to form a $C_4$-$C_{40}$ saturated or unsaturated ring, which saturated or unsaturated ring is optionally intervened by an oxygen atom, a sulphur atom or a group of the formula —N($R^a$)—, wherein $R^a$ is a hydrogen atom or a hydrocarbon group, or is optionally substituted; and wherein one or more of the carbon atoms of the polyacene skeleton is optionally substituted by a heteroatom selected from N, P, As, O, S, Se and Te.

Further preferred are compounds of formula M1b (substituted heteroacenes):

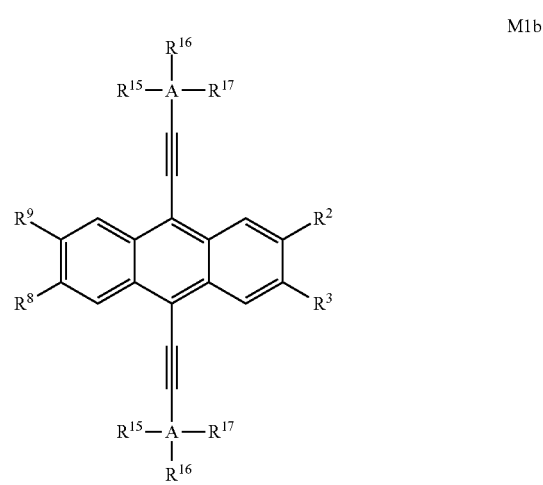

M1b wherein $R^2$, $R^3$, $R^8$, $R^9$, $R^{15}$, $R^{16}$, $R^{17}$ each independently are the same or different and each independently represents: H; an optionally substituted $C_1$-$C_{40}$ carbyl or hydrocarbyl group; an optionally substituted $C_1$-$C_{40}$ alkoxy group; an optionally substituted $C_6$-$C_{40}$ aryloxy group; an optionally substituted $C_7$-$C_{40}$ alkylaryloxy group; an optionally substituted $C_2$-$C_{40}$ alkoxycarbonyl group; an optionally substituted $C_7$-$C_{40}$ aryloxy-carbonyl group; a cyano group (—CN); a carbamoyl group (—C(=O)NH$_2$); a haloformyl group (—C(=O)—X, wherein X represents a halogen atom); a formyl group (—C(=O)—H); an isocyano group; an isocyanate group; a thiocyanate group or a thioisocyanate group; an optionally substituted amino group; a hydroxy group; a nitro group; a CF$_3$ group; a halo group (Cl, Br, F); or an optionally substituted silyl group; and A represents Silicon or Germanium; and wherein independently each pair of $R^2$ and $R^3$, $R^8$ and $R^9$, $R^{15}$ and $R^{16}$, and $R^{16}$ and $R^{17}$ is optionally cross-bridged with each other to form a $C_4$-$C_{40}$ saturated or unsaturated ring, which saturated or unsaturated ring is optionally intervened by an oxygen atom, a sulphur atom or a group of the formula —N($R^a$)—, wherein $R^a$ is a hydrogen atom or a hydrocarbon group, and is optionally substituted; and wherein one or more of the carbon atoms of the polyacene skeleton is optionally substituted by a heteroatom selected from N, P, As, O, S, Se and Te.

Especially preferred are compounds of subformula M1 b, wherein at least one pair of $R^2$ and $R^3$, and $R^8$ and $R^9$ is cross-bridged with each other to form a $C_4$-$C_{40}$ saturated or unsaturated ring, which is intervened by an oxygen atom, a sulphur atom or a group of the formula —N($R^a$)—, wherein $R^a$ is a hydrogen atom or a hydrocarbon group, and which is optionally substituted.

Especially preferred are compounds of subformula M1b1 (silylethynylated heteroacenes):

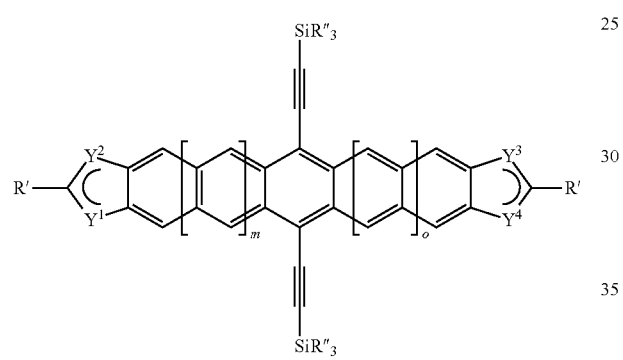

M1b1 wherein
one of $Y^1$ and $Y^2$ denotes —CH= or =CH— and the other denotes —X—,
one of $Y^3$ and $Y^4$ denotes —CH= or =CH— and the other denotes —X—,
X is —O—, —S—, —Se— or —NR'"—,
R' is H, F, Cl, Br, I, CN, straight-chain or branched alkyl or alkoxy that have 1 to 20, preferably 1 to 8 C-atoms and are optionally fluorinated or perfluorinated, optionally fluorinated or perfluorinated aryl having 6 to 30 C-atoms, preferably $C_6F_5$, or $CO_2R''''$, with R'''' being H, optionally fluorinated alkyl having 1 to 20 C-atoms or optionally fluorinated aryl having 2 to 30, preferably 5 to 20 C-atoms,
R" is, in case of multiple occurrence independently of one another, cyclic, straight-chain or branched alkyl or alkoxy that have 1 to 20, preferably 1 to 8 C-atoms, or aryl having 2 to 30 C-atoms, all of which are optionally fluorinated or perfluorinated, with $SiR''_3$ preferably being trialkylsilyl,
R'" is H or cyclic, straight-chain or branched alkyl with 1 to 10 C-atoms, preferably H,
m is 0 or 1,
o is 0 or 1.

Especially preferred are compounds of formula M1b1 wherein m and o are 0, and/or X is S, and/or R' is F.

In a preferred embodiment the compound of subformula M1b1 is provided and used as a mixture of the anti- and syn-isomers of the following formulae

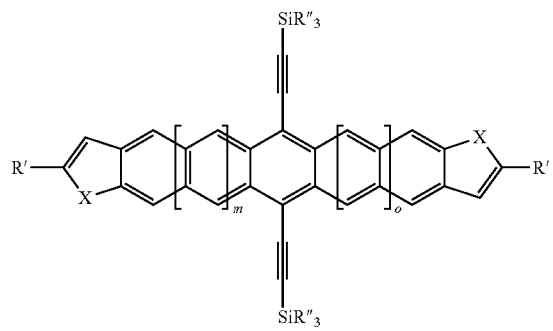

M1b1a

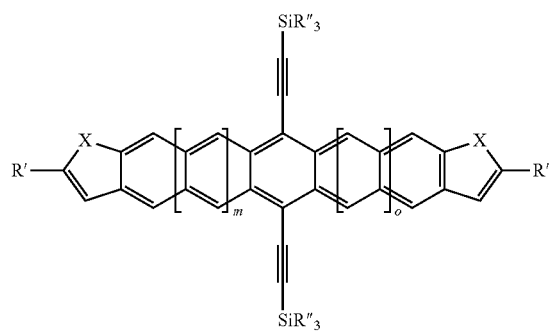

M1b1b wherein X, R, R', R" m and o have independently of each other one of the meanings given in formula M1b1 or one of the preferred meanings given above and below, X is preferably S, and m and o are preferably 0.

The term "carbyl group" as used above and below denotes any mono-valent or multivalent organic radical moiety which comprises at least one carbon atom either without any non-carbon atoms (like for example —C≡C—), or optionally combined with at least one non-carbon atom such as N, O, S, P, Si, Se, As, Te or Ge (for example carbonyl etc.). The term "hydrocarbyl group" denotes a carbyl group that does additionally contain one or more H atoms and optionally contains one or more hetero atoms like for example N, O, S, P, Si, Se, As, Te or Ge.

A carbyl or hydrocarbyl group comprising a chain of 3 or more C atoms may also be straight-chain, branched and/or cyclic, including spiro and/or fused rings.

Preferred carbyl and hydrocarbyl groups include alkyl, alkoxy, alkylcarbonyl, alkoxycarbonyl, alkylcarbonyloxy and alkoxycarbonyloxy, each of which is optionally substituted and has 1 to 40, preferably 1 to 25, very preferably 1 to 18 C atoms, furthermore optionally substituted aryl or aryloxy having 6 to 40, preferably 6 to 25 C atoms, furthermore alkylaryloxy, arylcarbonyl, aryloxycarbonyl, arylcarbonyloxy and aryloxycarbonyloxy, each of which is optionally substituted and has 6 to 40, preferably 7 to 40 C atoms, wherein all these groups optionally contain one or more hetero atoms, especially selected from N, O, S, P, Si, Se, As, Te and Ge.

The carbyl or hydrocarbyl group may be a saturated or unsaturated acyclic group, or a saturated or unsaturated cyclic group. Unsaturated acyclic or cyclic groups are preferred, especially aryl, alkenyl and alkynyl groups (especially ethynyl). Where the $C_1$-$C_{40}$ carbyl or hydrocarbyl group is acyclic, the group may be straight-chain or branched. The $C_1$-$C_{40}$ carbyl or hydrocarbyl group includes for example: a $C_1$-$C_{40}$ alkyl group, a $C_2$-$C_{40}$ alkenyl group, a $C_2$-$C_{40}$ alkynyl group, a $C_3$-$C_{40}$ alkyl group, a $C_4$-$C_{40}$ alkyldienyl group, a $C_4$-$C_{40}$ polyenyl group, a $C_6$-$C_{18}$ aryl group, a $C_6$-$C_{40}$ alkylaryl group, a $C_6$-$C_{40}$ arylalkyl group, a $C_4$-$C_{40}$ cycloalkyl group, a $C_4$-$C_{40}$ cycloalkenyl group, and the like. Preferred among the foregoing groups are a $C_1$-$C_{20}$ alkyl group, a $C_2$-$C_{20}$ alkenyl group, a $C_2$-$C_{20}$ alkynyl group, a $C_3$-$C_{20}$ alkyl group, a $C_4$-$C_{20}$ alkyldienyl group, a $C_6$-$C_{12}$ aryl group and a $C_4$-$C_{20}$ polyenyl group, respectively. Also included are combinations of groups having carbon atoms and groups having hetero atoms, like e.g. an alkynyl group, preferably ethynyl, that is substituted with a silyl group, preferably a trialkylsilyl group.

Aryl and heteroaryl preferably denote a mono-, bi- or tricyclic aromatic or heteroaromatic group with up to 25 C atoms that may also comprise condensed rings and is optionally substituted with one or more groups L, wherein L is halogen or an alkyl, alkoxy, alkylcarbonyl or alkoxycarbonyl group with 1 to 12 C atoms, wherein one or more H atoms may be replaced by F or Cl.

Especially preferred aryl and heteroaryl groups are phenyl in which, in addition, one or more CH groups may be replaced by N, naphthalene, thiophene, selenophene, thienothiophene, dithienothiophene, fluorene and oxazole, all of which can be unsubstituted, mono- or polysubstituted with L as defined above.

Especially preferred substituents R, $R^s$ and $R^{1-17}$ in the above formulae and subformulae are selected from straight chain, branched or cyclic alkyl having from 1 to 20 C atoms, which is unsubstituted or mono- or polysubstituted by F, Cl, Br or I, and wherein one or more non-adjacent $CH_2$ groups are optionally replaced, in each case independently from one another, by —O—, —S—, —$NR^b$—, $SiR^bR^c$—, —$CX^1$=$CX^2$— or —C≡C— in such a manner that O and/or S atoms are not linked directly to one another, or denotes optionally substituted aryl or heteroaryl preferably having from 1 to 30 C-atoms, with $R^b$ and $R^c$ being independently of each other H or alkyl having from 1 to 12 C-atoms, and $X^1$ and $X^2$ being independently of each other H, F, Cl or CN.

$R^{15-17}$ and R" are preferably identical or different groups selected from a $C_1$-$C_{40}$-alkyl group, preferably $C_1$-$C_4$-alkyl, most preferably methyl, ethyl, n-propyl or isopropyl, a $C_6$-$C_{40}$-aryl group, preferably phenyl, a $C_6$-$C_{40}$-arylalkyl group, a $C_1$-$C_{40}$-alkoxy group, or a $C_6$-$C_{40}$-arylalkyloxy group, wherein all these groups are optionally substituted for example with one or more halogen atoms. Preferably, $R^{15-17}$ and R" are each independently selected from optionally substituted $C_{1-12}$-alkyl, more preferably $C_{1-4}$-alkyl, most preferably $C_{1-3}$-alkyl, for example isopropyl, and optionally substituted $C_{6-10}$-aryl, preferably phenyl. Further preferred is a silyl group of formula —$SiR^{15}R^{16}$ wherein $R^{15}$ is as defined above and $R^{16}$ forms a cyclic silyl alkyl group together with the Si atom, preferably having 1 to 8 C atoms.

In one preferred embodiment all of $R^{15-17}$, or all of R", are identical groups, for example identical, optionally substituted, alkyl groups, as in triisopropylsilyl. Very preferably all of $R^{15-17}$, or all of R", are identical, optionally substituted $C_{1-10}$, more preferably $C_{1-4}$, most preferably $C_{1-3}$ alkyl groups. A preferred alkyl group in this case is isopropyl.

Preferred groups —$SiR^{15}R^{16}R^{17}$ and $SiR"_3$ include, without limitation, trimethylsilyl, triethylsilyl, tripropylsilyl, dimethylethylsilyl, diethylmethylsilyl, dimethylpropylsilyl, dimethylisopropylsilyl, dipropylmethylsilyl, diisopropylmethylsilyl, dipropylethylsilyl, diisopropylethylsilyl, diethylisopropylsilyl, triisopropylsilyl, trimethoxysilyl, triethoxysilyl, triphenylsilyl, diphenylisopropylsilyl, diisopropylphenylsilyl, diphenylethylsilyl, diethylphenylsilyl, diphenylmethylsilyl, triphenoxysilyl, dimethylmethoxysilyl, dimethylphenoxysilyl, methylmethoxyphenylsilyl, etc., wherein the alkyl, aryl or alkoxy group is optionally substituted.

According to a preferred embodiment of the present invention the OSC material is an organic light emitting material and/or charge transporting material. The organic light emitting materials and charge transporting materials can be selected from standard materials known to the skilled person and described in the literature. Organic light emitting material according to the present application means a material which emits light having a A$\lambda_{max}$ in the range from 400 to 700 nm.

Suitable phosphorescent compounds are, in particular, compounds which emit light, preferably in the visible region, on suitable excitation and in addition contain at least one atom having an atomic number greater than 20, preferably greater than 38 and less than 84, more preferably greater than 56 and less than 80. The phosphorescence emitters used are preferably compounds which contain copper, molybdenum, tungsten, rhenium, ruthenium, osmium, rhodium, iridium, palladium, platinum, silver, gold or europium, in particular compounds which contain iridium or platinum.

Particularly preferred organic phosphorescent compounds are compounds of formulae (1) to (4):

formula (1)

formula (2)

formula (3)

formula (4)

where

DCy is, identically or differently on each occurrence, a cyclic group which contains at least one donor atom, preferably nitrogen, carbon in the form of a carbene or phosphorus, via which the cyclic group is bonded to the metal, and which may in turn carry one or more substituents $R^{18}$; the groups DCy and CCy are connected to one another via a covalent bond;

CCy is, identically or differently on each occurrence, a cyclic group which contains a carbon atom via which the cyclic group is bonded to the metal and which may in turn carry one or more substituents $R^{18}$;

A is, identically or differently on each occurrence, a monoanionic, bidentate chelating ligand, preferably a diketonate ligand;

$R^{18}$ are identically or differently at each instance, and are F, Cl, Br, I, $NO_2$, CN, a straight-chain, branched or cyclic alkyl or alkoxy group having from 1 to 20 carbon atoms, in which one or more nonadjacent $CH_2$ groups may be replaced by —O—, —S—, —$NR^{19}$—, —$CONR^{19}$—, —CO—O—, —C=O—, —CH=CH— or —C≡C—, and in which one or more hydrogen atoms may be replaced by F, or an aryl or heteroaryl group which has from 4 to 14 carbon atoms and may be substituted by one or more nonaromatic R¹⁸ radicals, and a plurality of substituents R¹⁸, either on the same ring or on two different rings, may together in turn form a mono- or polycyclic, aliphatic or aromatic ring system; and R¹⁹ are identically or differently at each instance, and are a straight-chain, branched or cyclic alkyl or alkoxy group having from 1 to 20 carbon atoms, in which one or more nonadjacent CH$_2$ groups may be replaced by —O—, —S—, —CO—O—, —C=O—, —CH=CH— or —C≡C—, and in which one or more hydrogen atoms may be replaced by F, or an aryl or heteroaryl group which has from 4 to 14 carbon atoms and may be substituted by one or more nonaromatic R¹⁸ radicals.

Formation of ring systems between a plurality of radicals R¹⁸ means that a bridge may also be present between the groups DCy and CCy.

Furthermore, formation of ring systems between a plurality of radicals R¹⁸ means that a bridge may also be present between two or three ligands CCy-DCy or between one or two ligands CCy-DCy and the ligand A, giving a polydentate or polypodal ligand system.

Examples of the emitters described above are revealed by the applications WO 00/70655, WO 01/41512, WO 02/02714, WO 02/15645, EP 1191613, EP 1191612, EP 1191614, WO 04/081017, WO 05/033244, WO 05/042550, WO 05/113563, WO 06/008069, WO 06/061182, WO 06/081973 and DE 102008027005. In general, all phosphorescent complexes as are used in accordance with the prior art for phosphorescent OLEDs and as are known to the person skilled in the art in the area of organic electroluminescence are suitable, and the person skilled in the art will be able to use further phosphorescent compounds without inventive step. In particular, it is known to the person skilled in the art which phosphorescent complexes emit with which emission colour.

Examples of preferred phosphorescent compounds are shown in the following table.

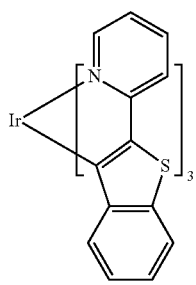
(1)

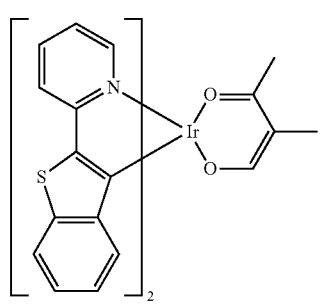
(2)

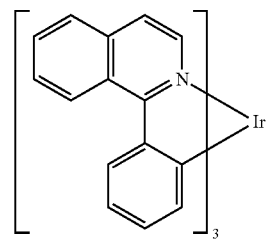
(3)

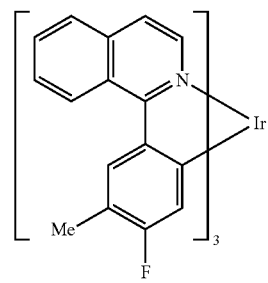
(4)

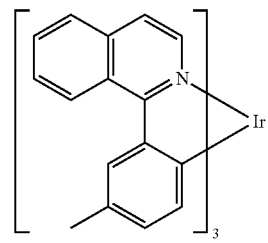
(5)

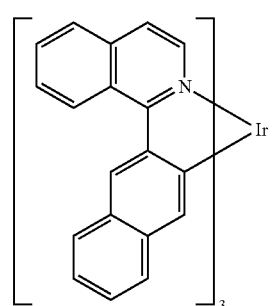
(6)

(7)

-continued
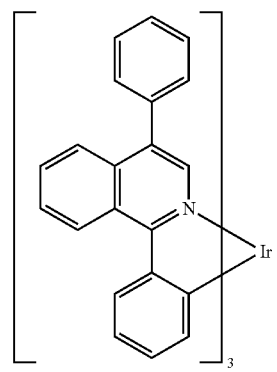(8)
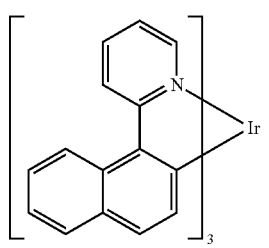(9)
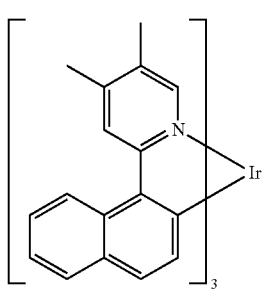(10)
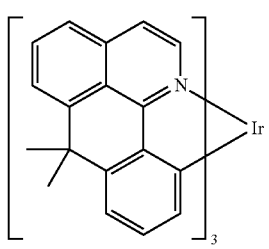(11)
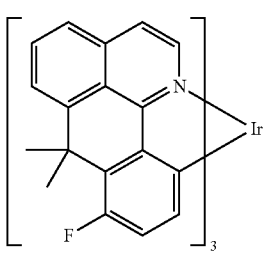(12)
-continued
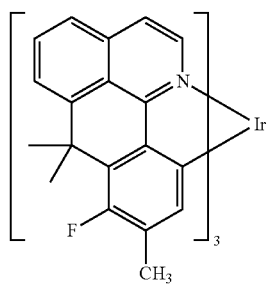(13)
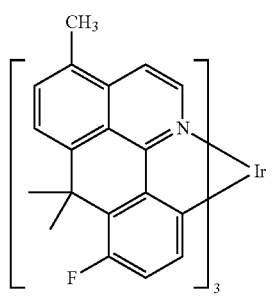(14)
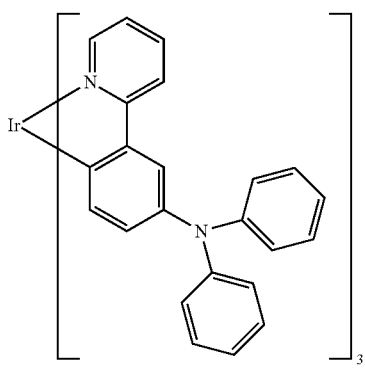(15)
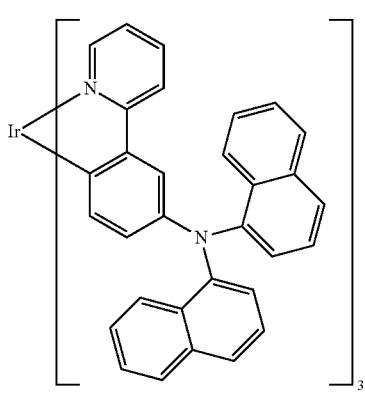(16)

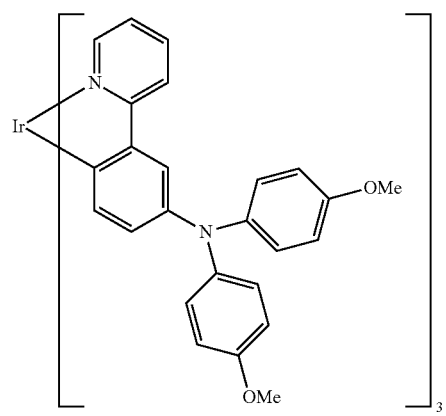
(17)
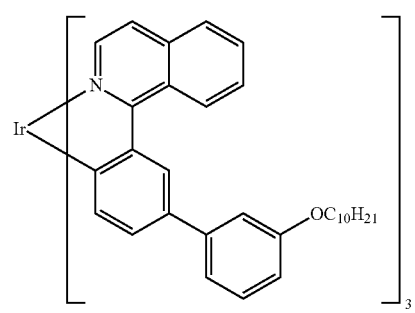
(18)
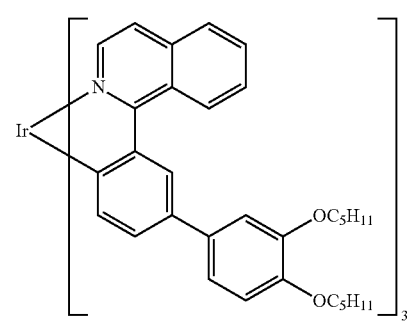
(19)
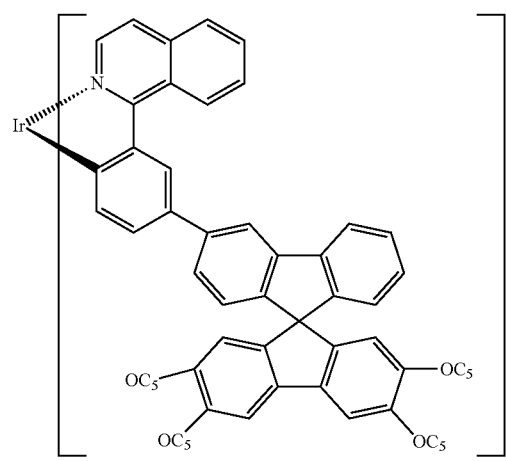
(20)
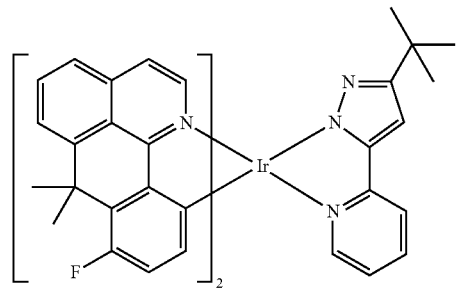
(21)
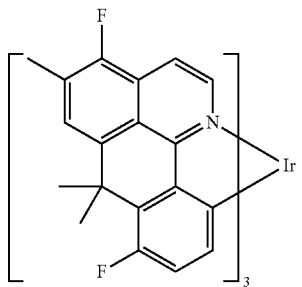
(22)
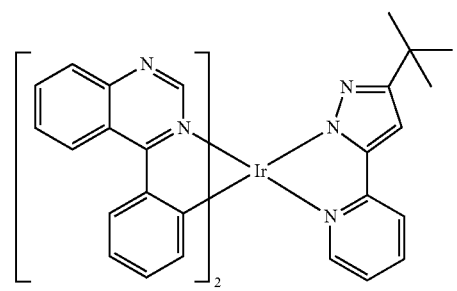
(23)
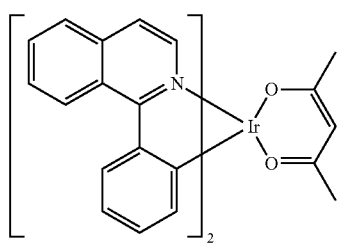
(24)
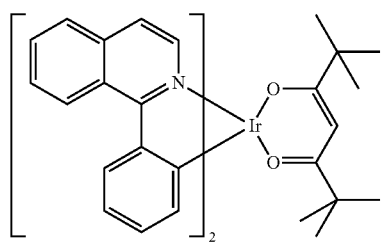
(25)
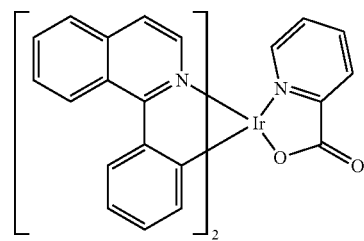
(26)

-continued
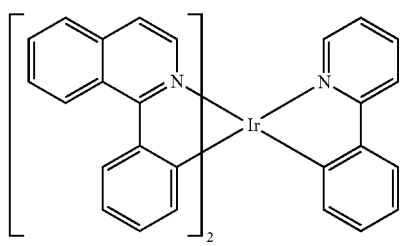 (27)
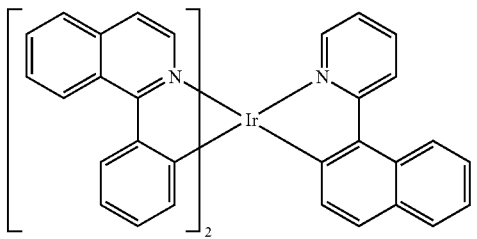 (28)
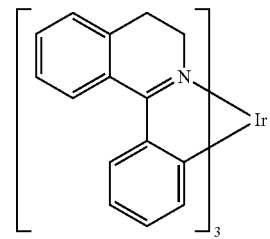 (29)
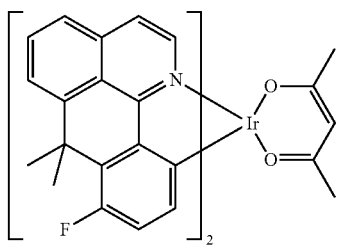 (30)
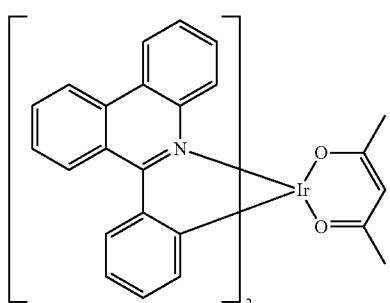 (31)
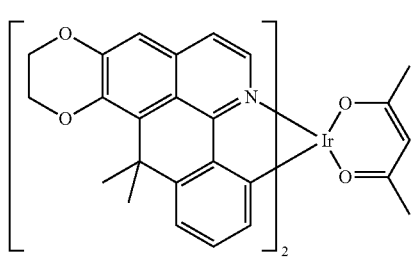 (32)
-continued
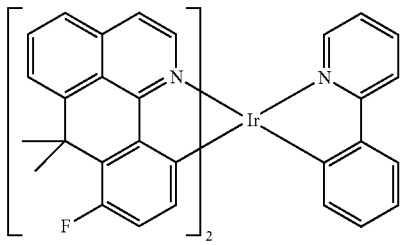 (33)
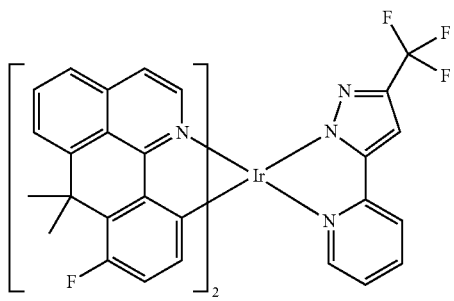 (34)
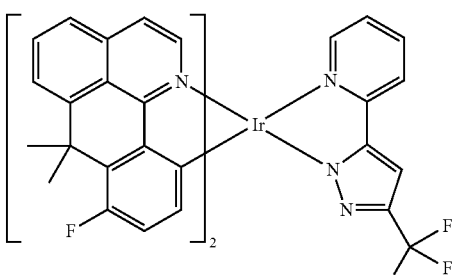 (35)
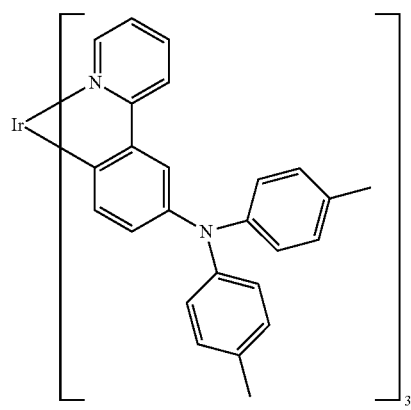 (36)
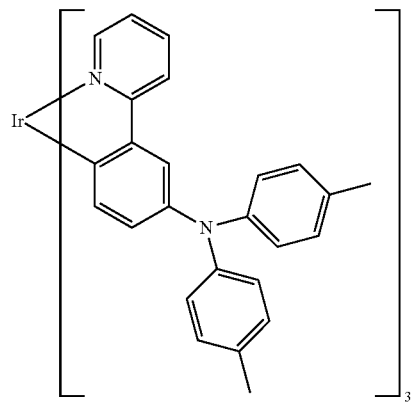 (37)

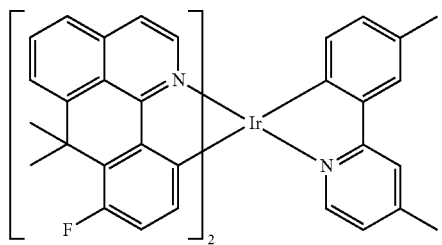 (38)
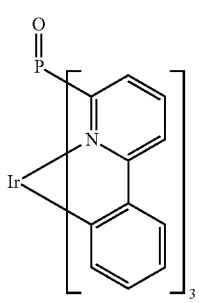 (39)
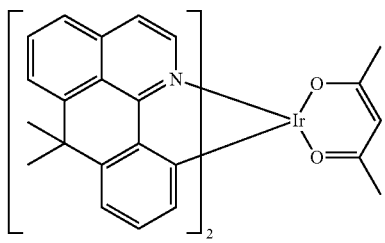 (40)
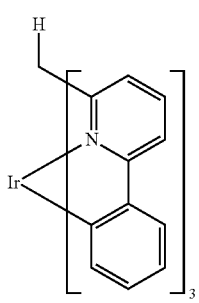 (41)
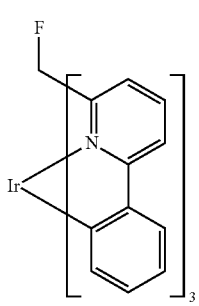 (42)
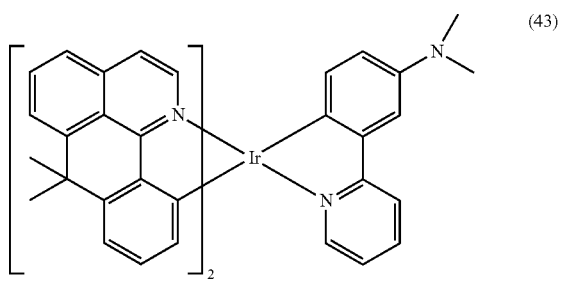 (43)
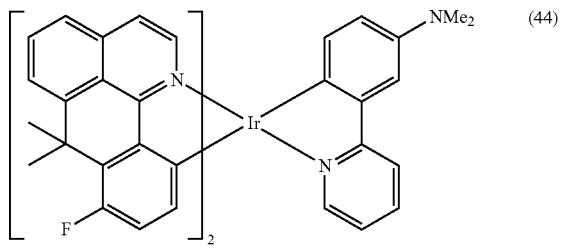 (44)
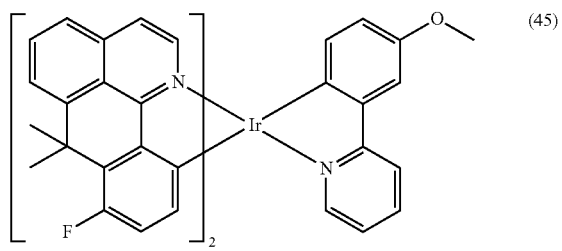 (45)
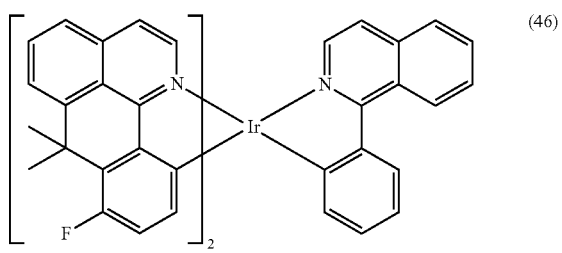 (46)
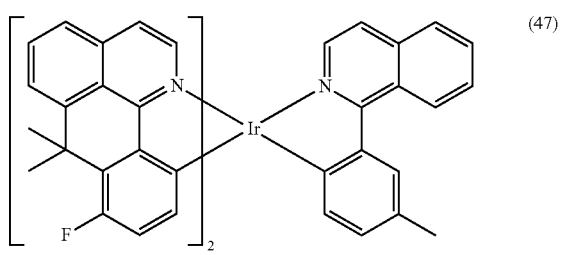 (47)
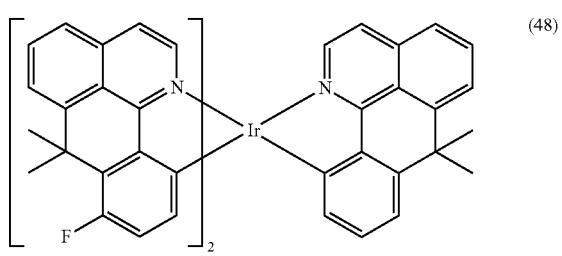 (48)

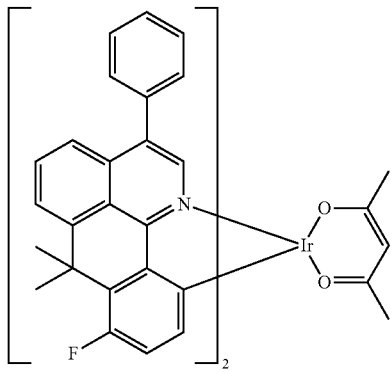
(49)
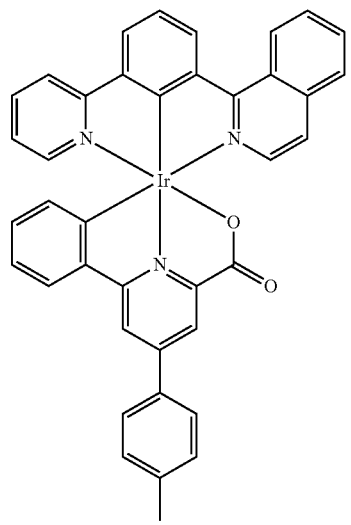
(50)
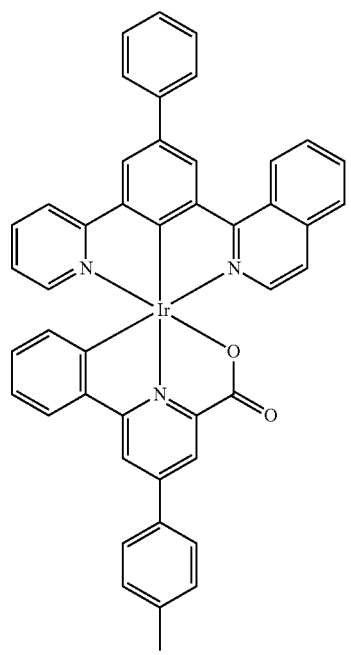
(51)
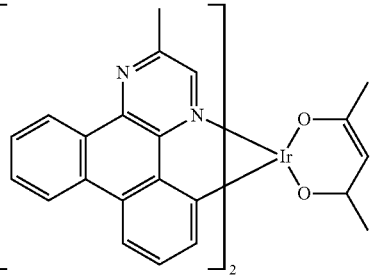
(52)
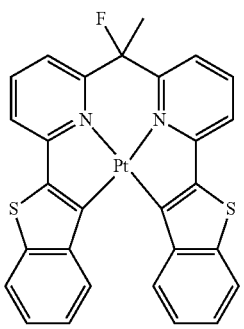
(53)
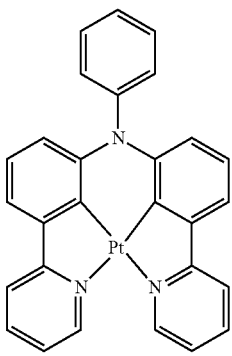
(54)
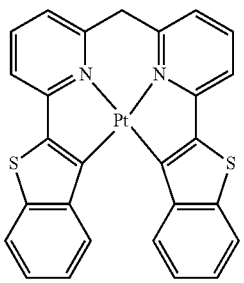
(55)
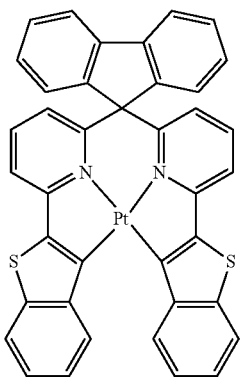
(56)

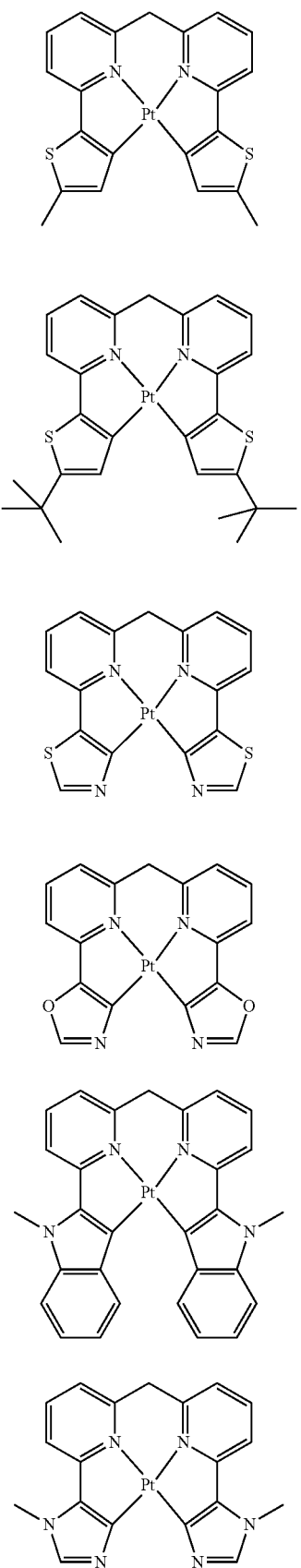
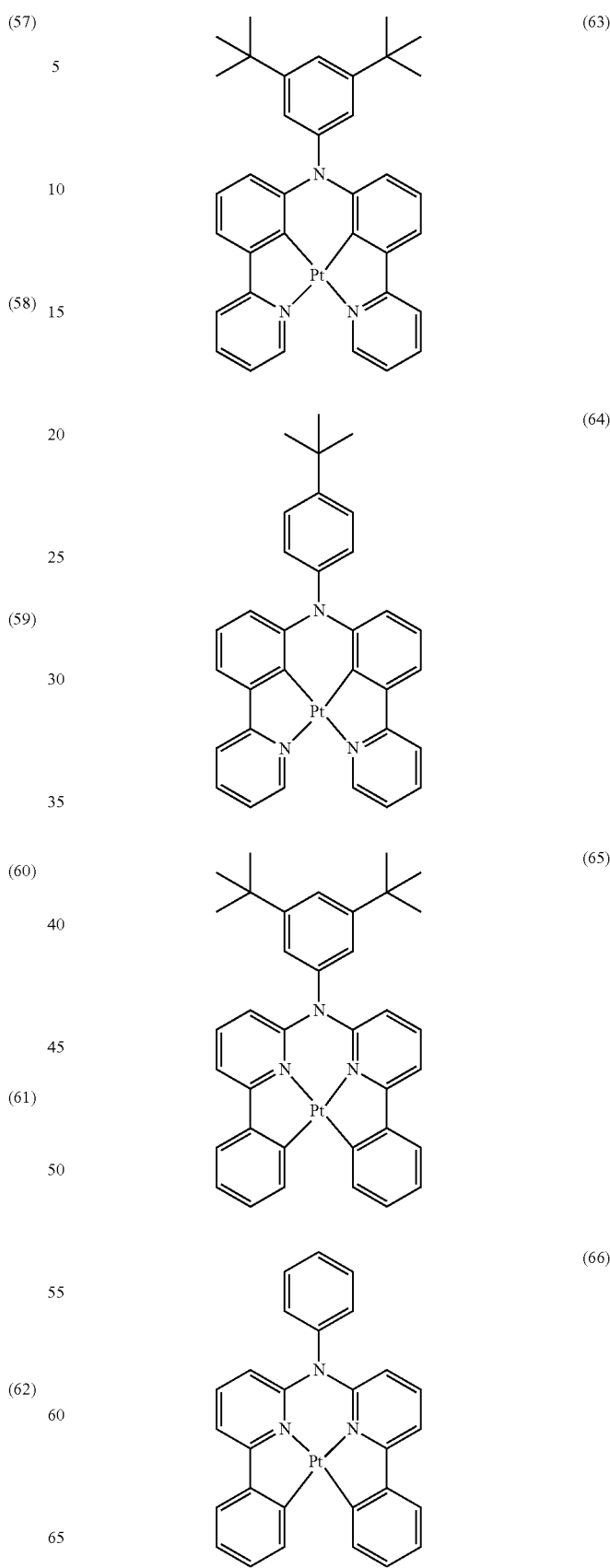

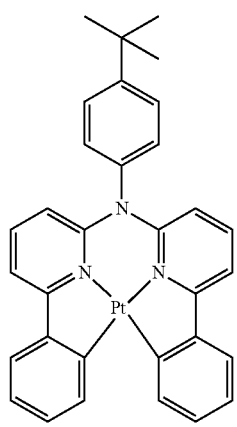 (67)
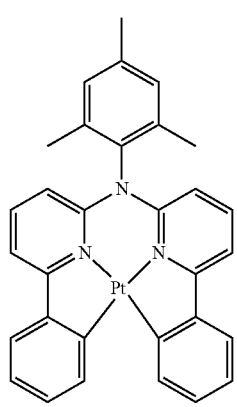 (68)
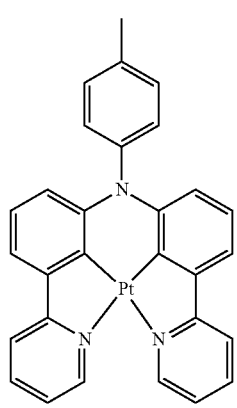 (69)
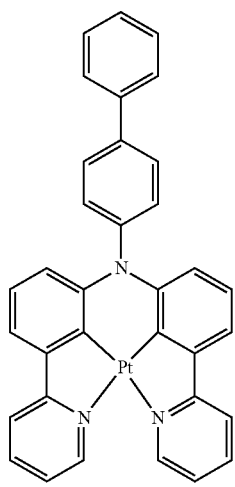 (70)
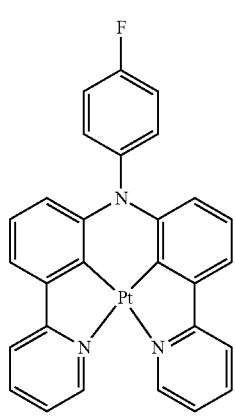 (71)
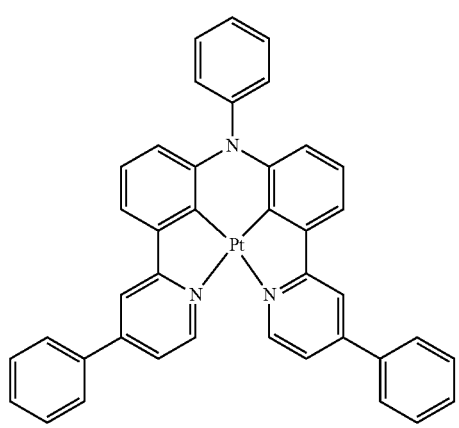 (72)

| 35 -continued | 36 -continued |
|---|---|
| (73) 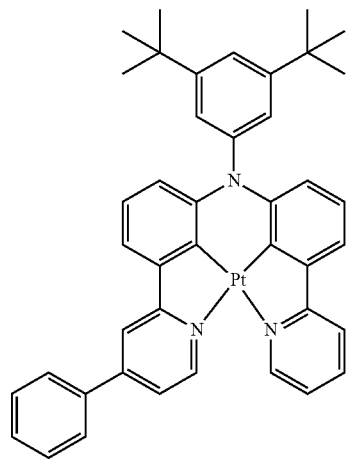 | (76) 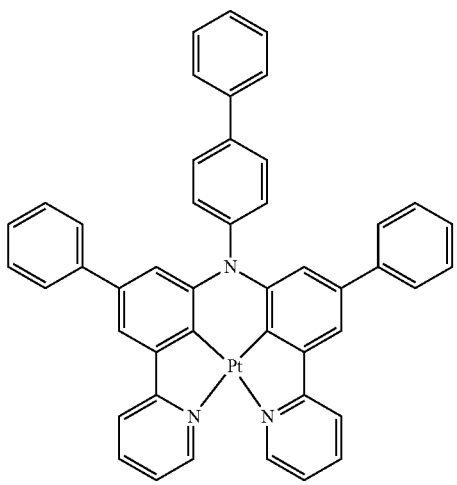 |
| (74) 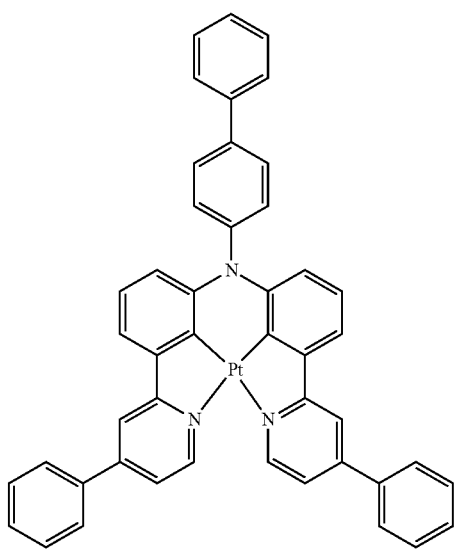 | (77) 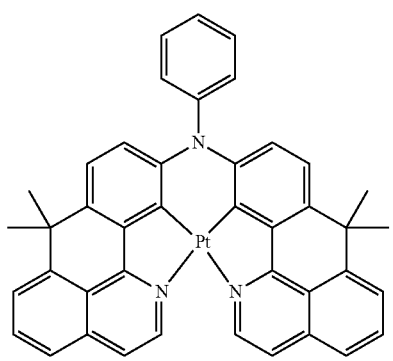 |
| | (78) 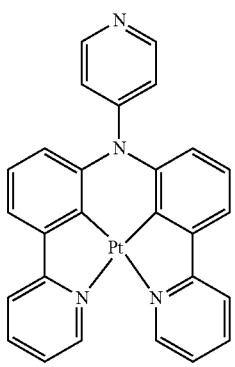 |
| (75) 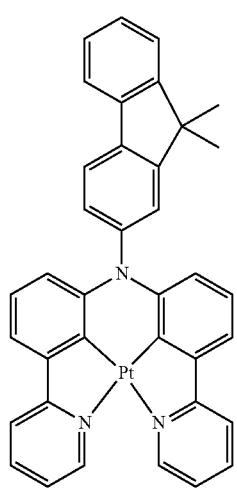 | (79) 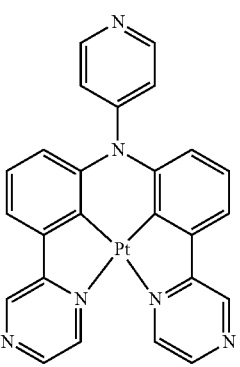 |

-continued
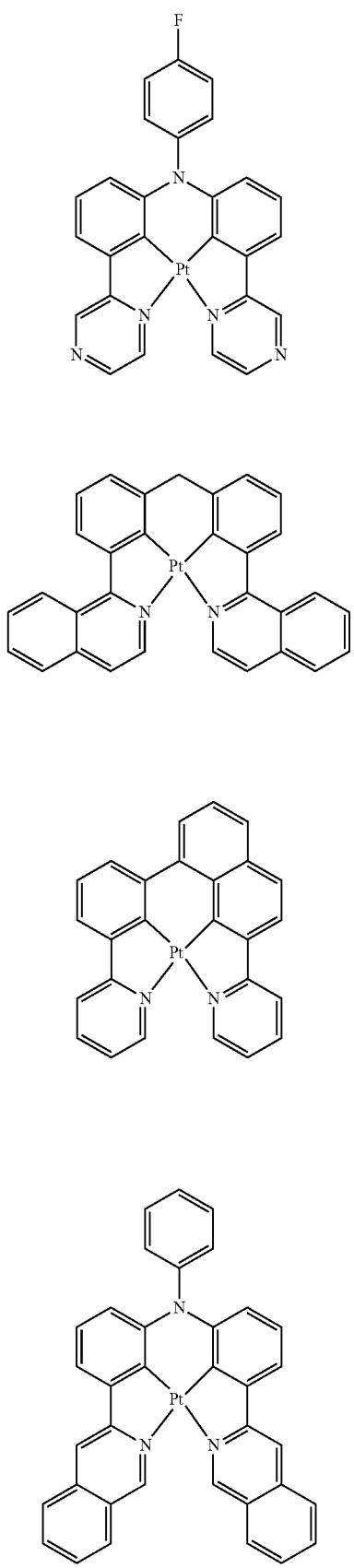
(80)
(81)
(82)
(83)
-continued
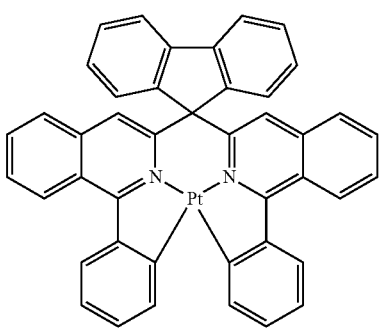
(84)
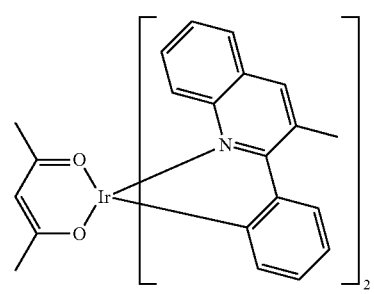
(85)
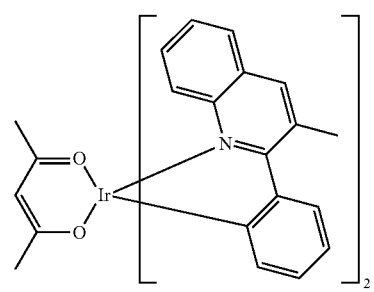
(86)
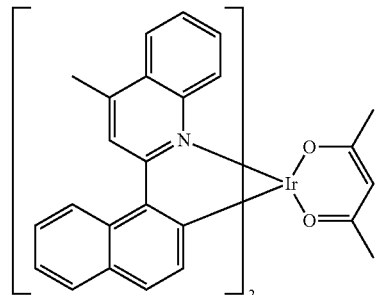
(87)
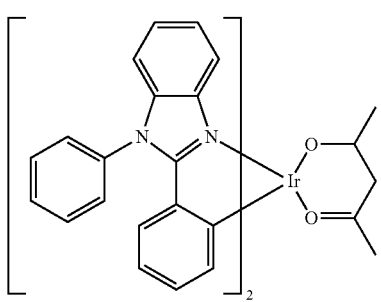
(88)

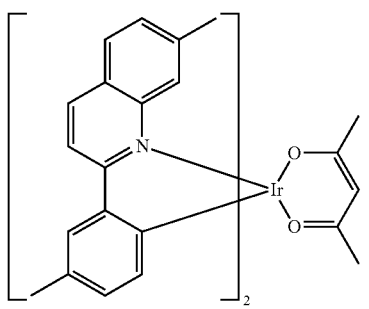
(89)
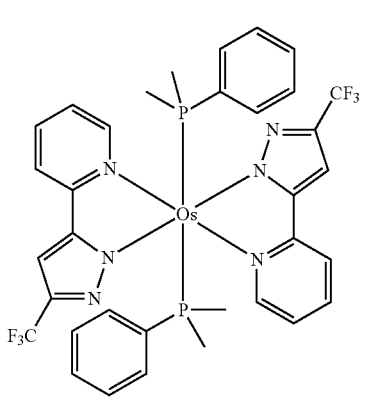
(90)
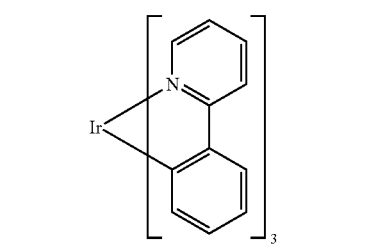
(91)
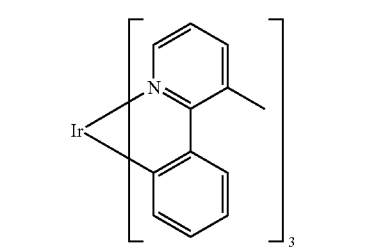
(92)
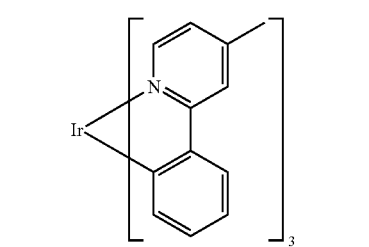
(93)
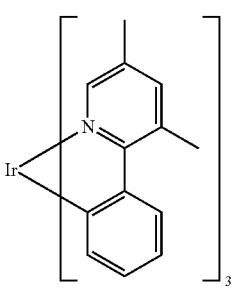
(94)
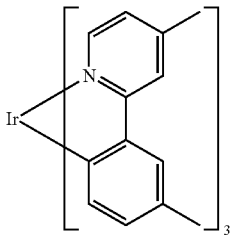
(95)
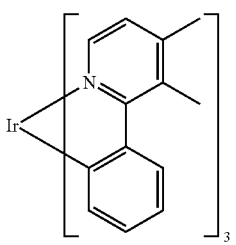
(96)
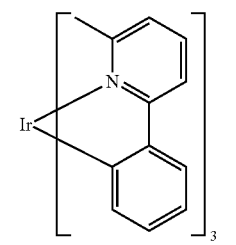
(97)
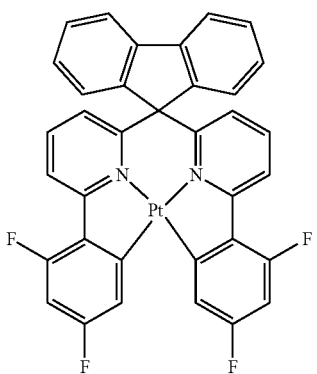
(98)

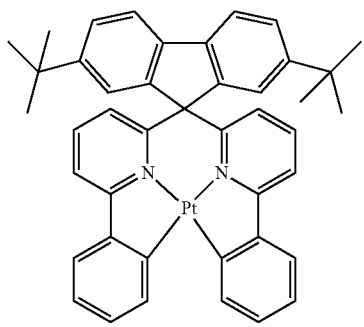
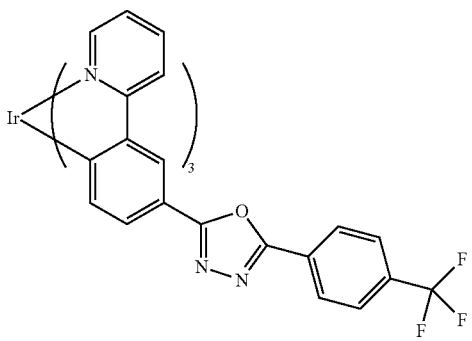
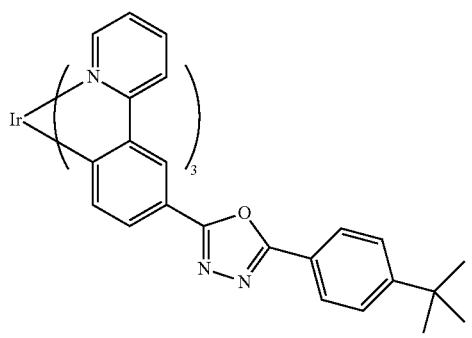
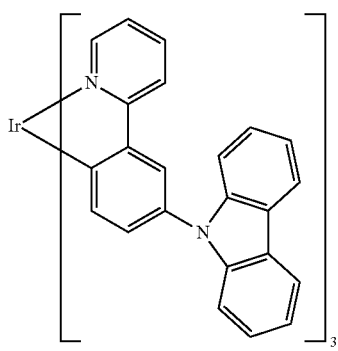
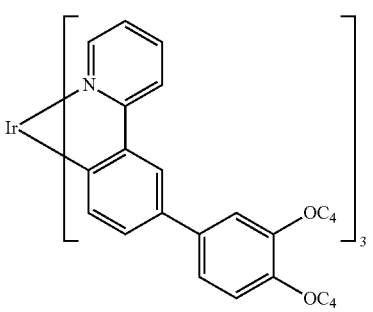

-continued
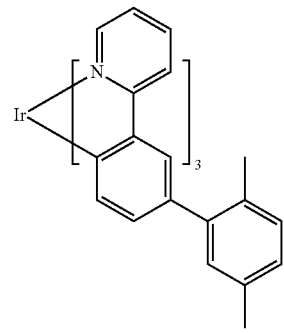 (107)
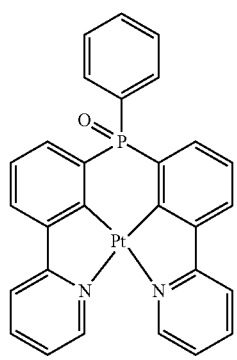 (108)
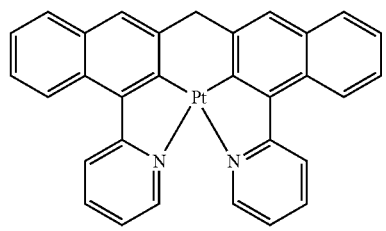 (109)
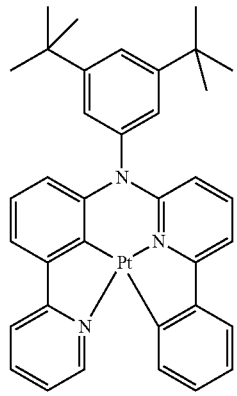 (110)
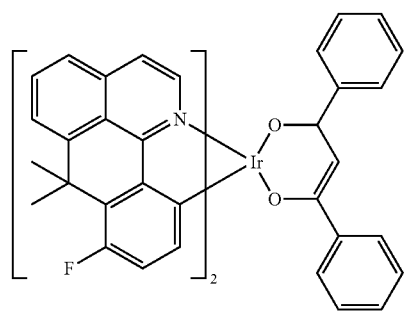 (111)
-continued
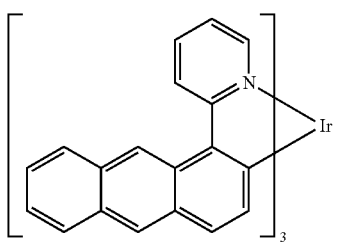 (112)
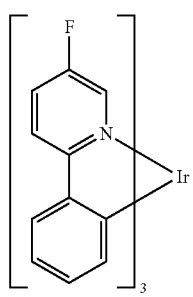 (113)
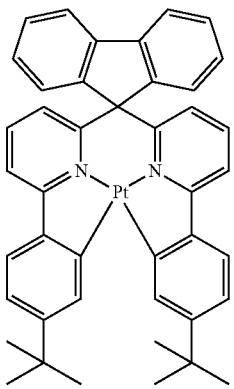 (114)
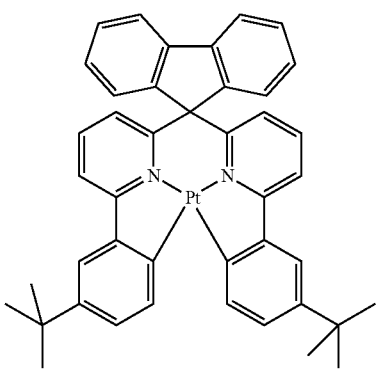 (115)

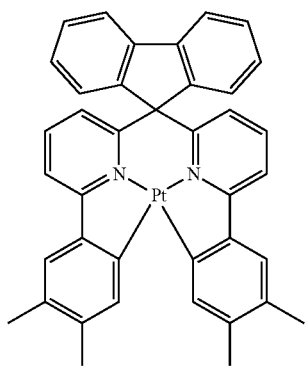 (116)
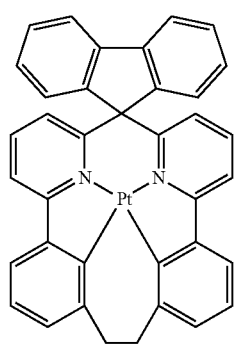 (117)
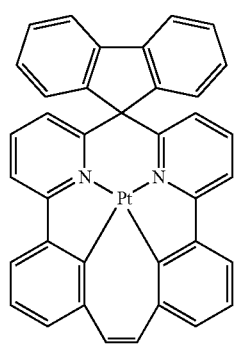 (118)
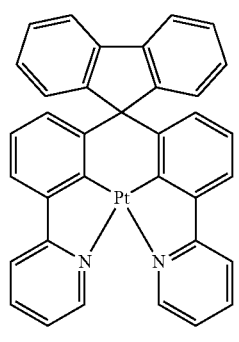 (119)
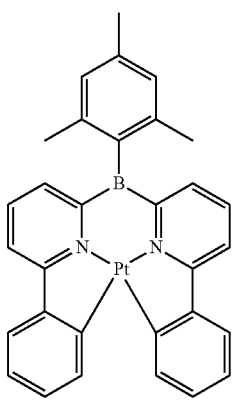 (120)
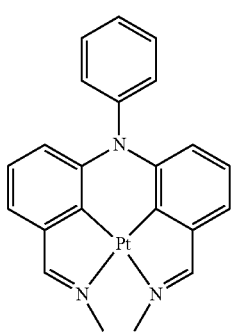 (121)
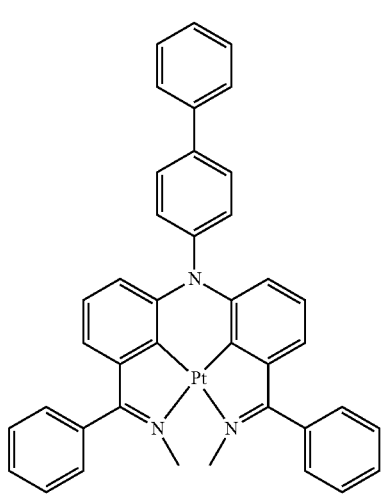 (122)
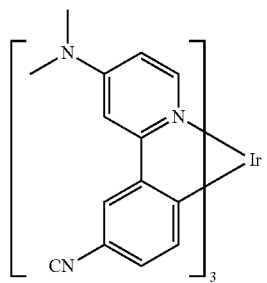 (123)

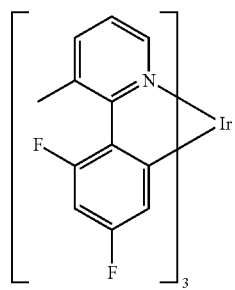 (124)
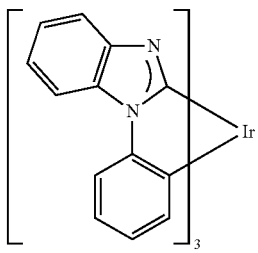 (129)
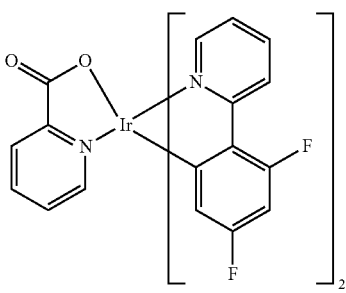 (130)
(125)
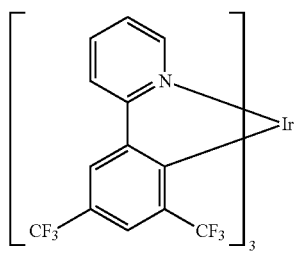 (131)
(126)
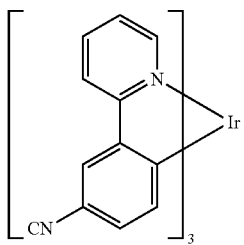 (132)
(127)
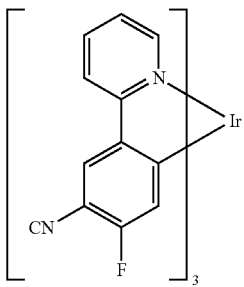 (133)
(128)
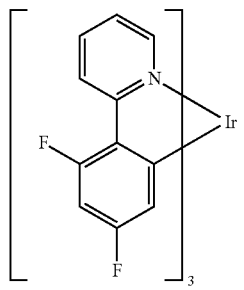 (134)

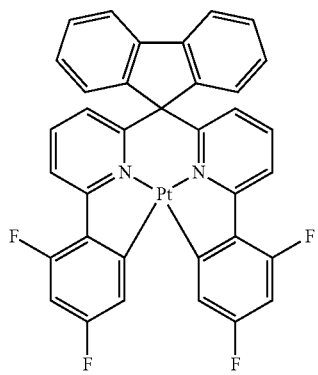
(135)

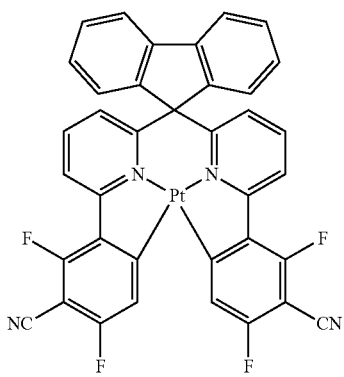
(136)

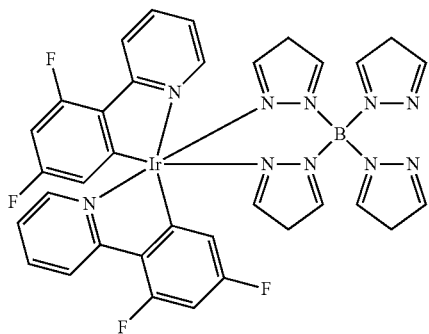
(137)

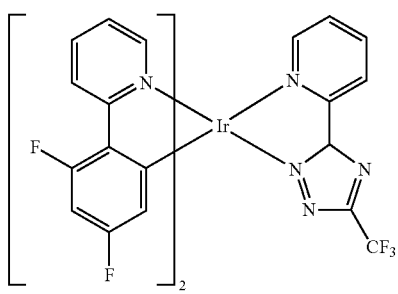
(138)

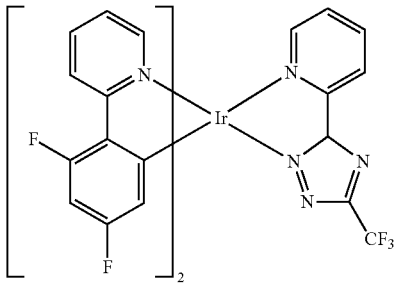
(139)

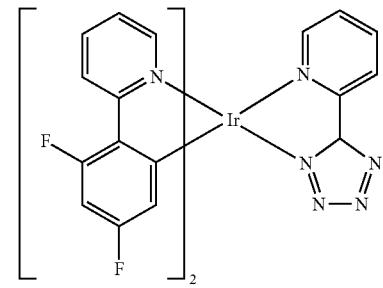
(140)

Preferred dopants are selected from the class of the monostyrylamines, the distyrylamines, the tristyrylamines, the tetrastyrylamines, the styryl-phosphines, the styryl ethers and the arylamines. A monostyrylamine is taken to mean a compound which contains one substituted or unsubstituted styryl group and at least one, preferably aromatic, amine. A distyryl-amine is taken to mean a compound which contains two substituted or un-substituted styryl groups and at least one, preferably aromatic, amine. A tristyrylamine is taken to mean a compound which contains three substituted or unsubstituted styryl groups and at least one, preferably aromatic, amine. A tetrastyrylamine is taken to mean a compound which contains four substituted or unsubstituted styryl groups and at least one, preferably aromatic, amine. The styryl groups are particularly preferably stilbenes, which may also be further substituted. Corresponding phosphines and ethers are defined analogously to the amines. For the purposes of the present invention, an arylamine or an aromatic amine is taken to mean a compound which contains three substituted or unsubstituted aromatic or heteroaromatic ring systems bonded directly to the nitrogen. At least one of these aromatic or heteroaromatic ring systems is preferably a condensed ring system, particularly preferably having at least 14 aromatic ring atoms. Preferred examples thereof are aromatic anthraceneamines, aromatic anthracenediamines, aromatic pyreneamines, aromatic pyrene-diamines, aromatic chryseneamines or aromatic chrysenediamines. An aromatic anthraceneamine is taken to mean a compound in which one di-arylamino group is bonded directly to an anthracene group, preferably in the 9-position. An aromatic anthracenediamine is taken to mean a compound in which two diarylamino groups are bonded directly to an anthracene group, preferably in the 9,10-position. Aromatic pyreneamines, pyrenediamines, chryseneamines and chrysenediamines are defined analogously thereto, where the diarylamino groups are preferably bonded to the pyrene in the 1-position or in the 1,6-position. Further preferred dopants are selected from indenofluoreneamines or indenofluorene-diamines, for example in accordance with WO 06/122630, benzoindenofluoreneamines or benzoindenofluorenediamines, for example in accor dance with WO 08/006,449, and dibenzoindenofluoreneamines or dibenzo-indenofluorenediamines, for example in accordance with WO 07/140,847. Examples of dopants from the class of the styrylamines are substituted or unsubstituted tristilbeneamines or the dopants described in WO 06/000388, WO 06/058737, WO 06/000389, WO 07/065,549 and WO 07/115,610. Preference is furthermore given to the condensed hydrocarbons disclosed in DE 102008035413.

Suitable dopants are furthermore the structures depicted in the following table, and the derivatives of these structures disclosed in JP 06/001973, WO 04/047499, WO 06/098080, WO 07/065,678, US 2005/0260442 and WO 04/092111.

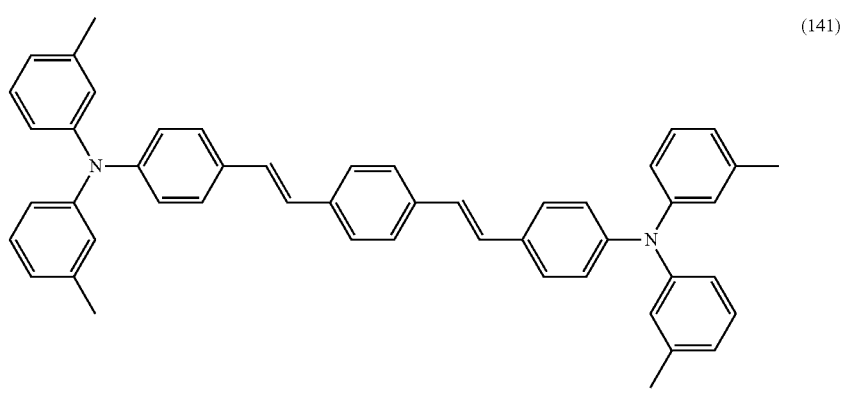

(141)

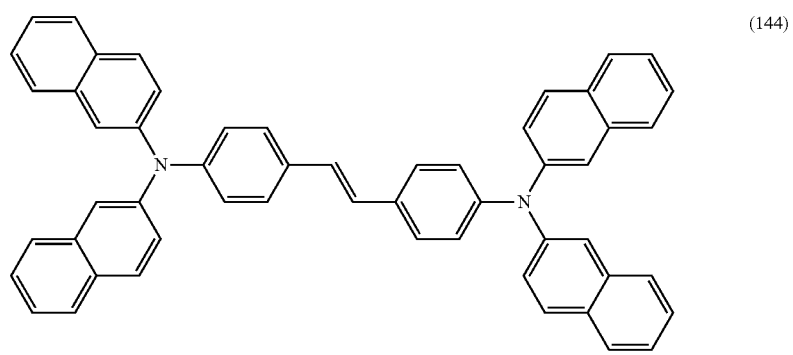

(144)

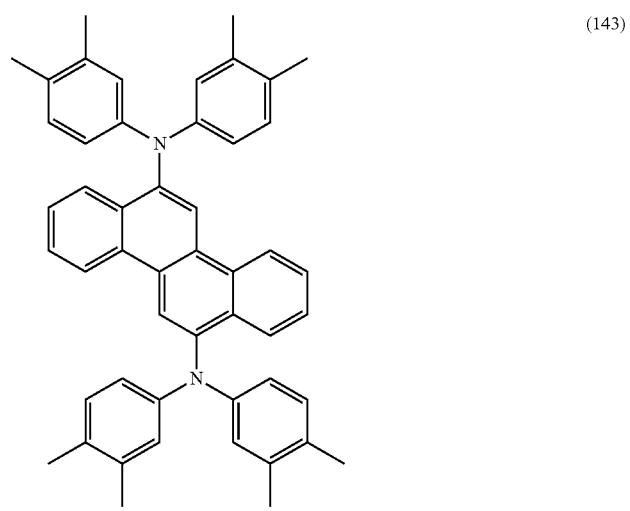

(143)

(144)

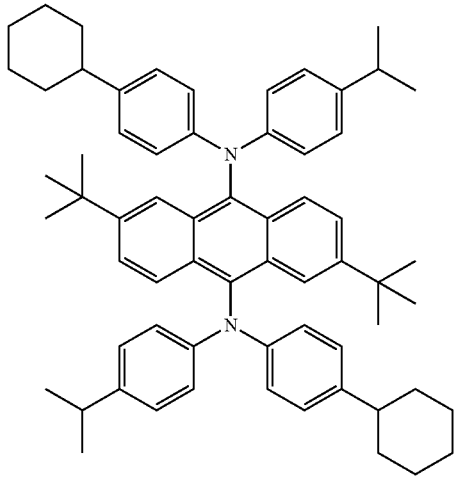 [SMILES: CC(C)c1ccc(N(c2ccc(C3CCCCC3)cc2)c2c3ccc(C(C)(C)C)cc3c(N(c3ccc(C(C)C)cc3)c3ccc(C4CCCCC4)cc3)c3ccc(C(C)(C)C)cc23)cc1]

(145)

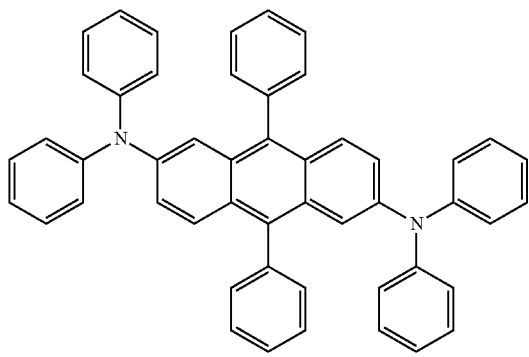 [SMILES: c1ccc(-c2c3ccc(N(c4ccccc4)c4ccccc4)cc3c(-c3ccccc3)c3ccc(N(c4ccccc4)c4ccccc4)cc23)cc1]

(146)

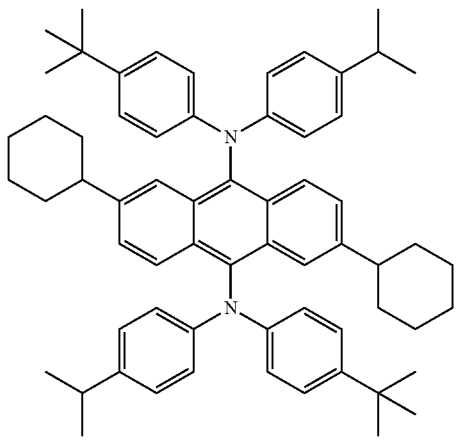 [SMILES: CC(C)c1ccc(N(c2ccc(C(C)(C)C)cc2)c2c3ccc(C4CCCCC4)cc3c(N(c3ccc(C(C)C)cc3)c3ccc(C(C)(C)C)cc3)c3ccc(C4CCCCC4)cc23)cc1]

The proportion of the dopant in the mixture of the emitting layer is between 0.1 and 50.0% by vol., preferably between 0.5 and 20.0% by vol., particularly preferably between 1.0 and 10.0% by vol. Correspondingly, the proportion of the host material is between 50.0 and 99.9% by vol., preferably between 80.0 and 99.5% by vol., particularly preferably between 90.0 and 99.0% by vol.

Suitable host materials for this purpose are materials from various classes of substance. Preferred host materials are selected from the classes of the oligoarylenes (for example 2,2',7,7'-tetraphenylspirobifluorene in accordance with EP 676461 or dinaphthylanthracene), in particular the oligoarylenes containing condensed aromatic groups, the oligoarylene-vinylenes (for example DPVBi or spiro-DPVBi in accordance with EP 676461), the polypodal metal complexes (for example in accordance with WO 04/081017), the hole-conducting compounds (for example in accordance with WO 04/058911), the electron-conducting compounds, in particular ketones, phosphine oxides, sulfoxides, etc. (for example in accordance with WO 05/084081 and WO 05/084082), the atropisomers (for example in accordance with WO 06/048268), the boronic acid derivatives (for example in accordance with WO 06/117052) or the benzanthracenes (for example in accordance with WO 08/145,239). Suitable host materials are furthermore also the benzo[c]phenanthrene compounds according to the invention which are described above. Apart from the compounds according to the invention, particularly preferred host materials are selected from the classes of the oligoarylenes containing naphthalene, anthracene, benzanthracene and/or pyrene or atropisomers of these compounds, the oligoarylenevinylenes, the ketones, the phosphine oxides and the sulfoxides. Apart from the benzo[c]phenanthrene compounds according to the invention, very particularly preferred host materials are selected from the classes of the oligoarylenes containing anthracene, benzanthracene and/or pyrene or atropisomers of these compounds. For the purposes of this invention, an oligoarylene is intended to be taken to mean a compound in which at least three aryl or arylene groups are bonded to one another.

Suitable host materials are furthermore, for example, the materials depicted in the following table, and derivatives of these materials, as disclosed in WO 04/018587, WO 08/006,449, U.S. Pat. No. 5,935,721, US 2005/0181232, JP 2000/273056, EP 681019, US 2004/0247937 and US 2005/0211958.

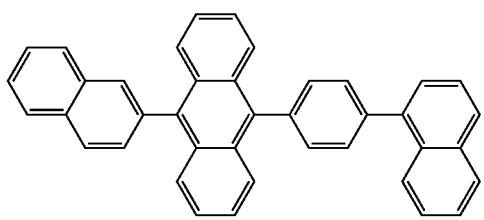 [SMILES: c1ccc2cc(-c3c4ccccc4c(-c4ccc(-c5cccc6ccccc56)cc4)c4ccccc34)ccc2c1]
(147)

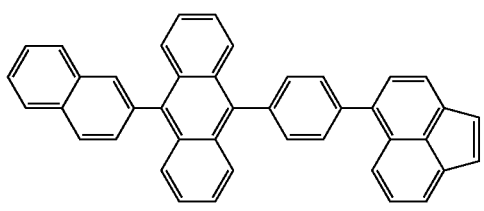 [SMILES: C1=Cc2ccc(-c3ccc(-c4c5ccccc5c(-c5ccc6ccccc6c5)c5ccccc45)cc3)c3cccc1c23]
(148)

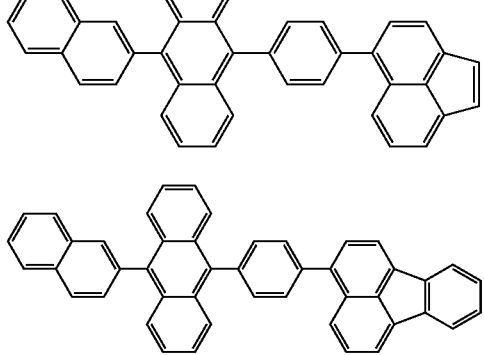
(149)

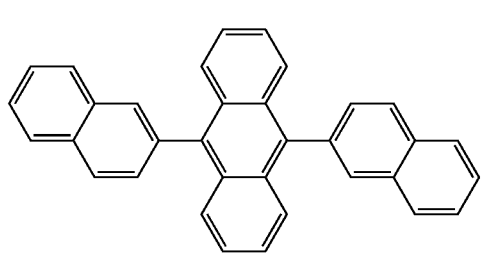 [SMILES: c1ccc2cc(-c3c4ccccc4c(-c4ccc5ccccc5c4)c4ccccc34)ccc2c1]
(150)

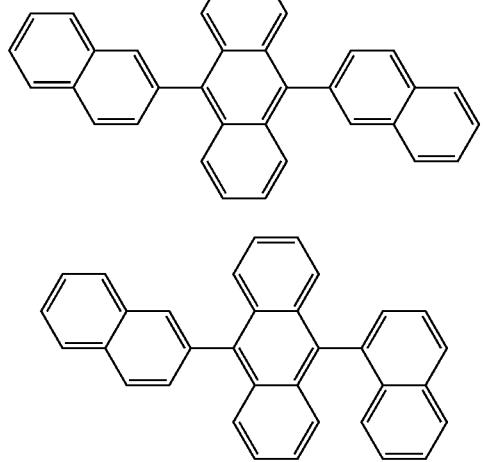
(151)

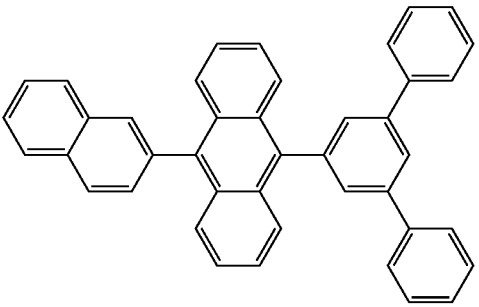 [SMILES: c1ccc(-c2cc(-c3ccccc3)cc(-c3c4ccccc4c(-c4ccc5ccccc5c4)c4ccccc34)c2)cc1]
(152)

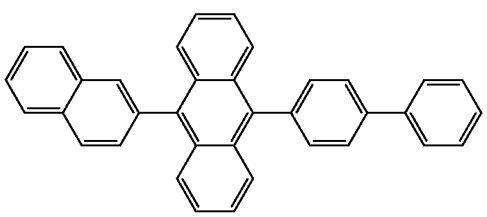 [SMILES: c1ccc(-c2ccc(-c3c4ccccc4c(-c4ccc5ccccc5c4)c4ccccc34)cc2)cc1]
(153)

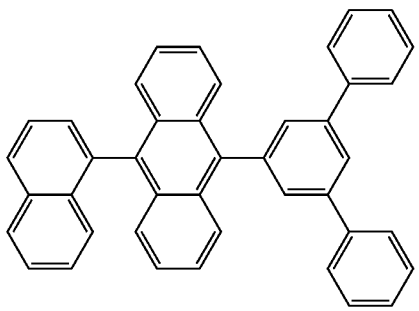 [SMILES: c1ccc(-c2cc(-c3ccccc3)cc(-c3c4ccccc4c(-c4cccc5ccccc45)c4ccccc34)c2)cc1]
(154)

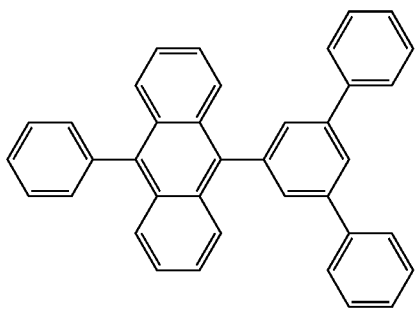 [SMILES: c1ccc(-c2cc(-c3ccccc3)cc(-c3c4ccccc4c(-c4ccccc4)c4ccccc34)c2)cc1]
(155)

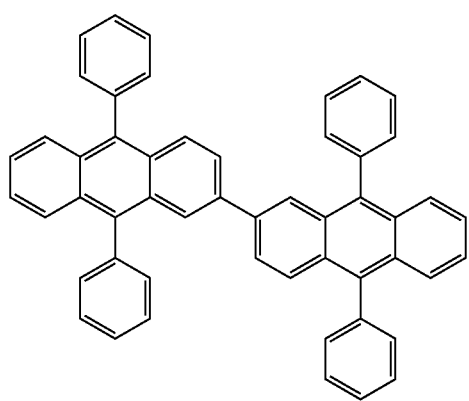 [SMILES: c1ccc(-c2c3ccccc3c(-c3ccccc3)c3cc(-c4ccc5c(-c6ccccc6)c6ccccc6c(-c6ccccc6)c5c4)ccc23)cc1]
(156)

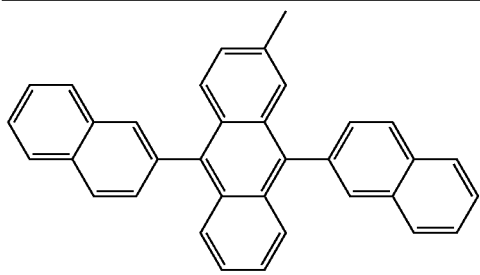
(157)

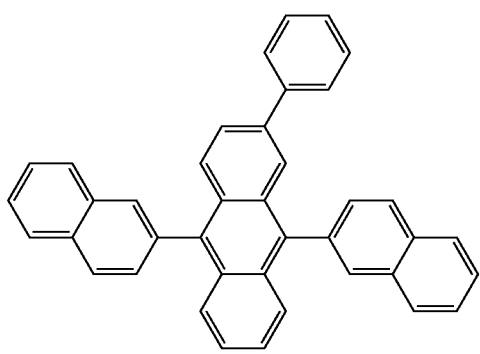 [SMILES: c1ccc(-c2ccc3c(-c4ccc5ccccc5c4)c4ccccc4c(-c4ccc5ccccc5c4)c3c2)cc1]
(158)

For the purposes of this invention, a hole-injection layer is a layer which is directly adjacent to the anode. For the purposes of this invention, a hole-transport layer is a layer which is located between a hole-injection layer and an emission layer. It may be preferred for them to be doped with electron-acceptor compounds, for example with $F_4$-TCNQ or with compounds as described in EP 1476881 or EP 1596445.

Apart from the materials according to the invention, suitable charge-transport materials, as can be used in the hole-injection or hole-transport layer or in the electron-injection or electron-transport layer of the organic electroluminescent device according to the invention, are, for example, the compounds disclosed in Y. Shirota et al., *Chem. Rev.* 2007, 107(4), 953-1010, or other materials as employed in these layers in accordance with the prior art.

Examples of preferred hole-transport materials which can be used in a hole-transport or hole-injection layer of the electroluminescent device according to the invention are indenofluoreneamines and derivatives (for example in accordance with WO 06/122630 or WO 06/100896), the amine derivatives as disclosed in EP 1661888, hexaazatriphenylene derivatives (for example in accordance with WO 01/049806), amine derivatives with condensed aromatics (for example in accordance with U.S. Pat. No. 5,061,569), the amine derivatives as disclosed in WO 95/09147, monobenzoindenofluoreneamines (for example in accordance with WO 08/006, 449) or dibenzoindenofluoreneamines (for example in accordance with WO 07/140,847). Suitable hole-transport and hole-injection materials are furthermore derivatives of the compounds depicted above, as disclosed in JP 2001/226331, EP 676461, EP 650955, WO 01/049806, U.S. Pat. No. 4,780,536, WO 98/30071, EP 891121, EP 1661888, JP 2006/253445, EP 650955, WO 06/073054 and U.S. Pat. No. 5,061,569.

Suitable hole-transport or hole-injection materials are furthermore, for example, the materials indicated in the following table.

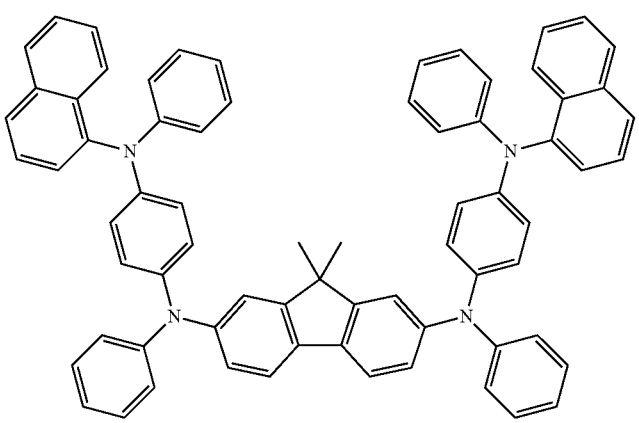 [SMILES: CC1(C)c2cc(N(c3ccccc3)c3ccc(N(c4ccccc4)c4cccc5ccccc45)cc3)ccc2-c2ccc(N(c3ccccc3)c3ccc(N(c4ccccc4)c4cccc5ccccc45)cc3)cc21]
(159)

(160)
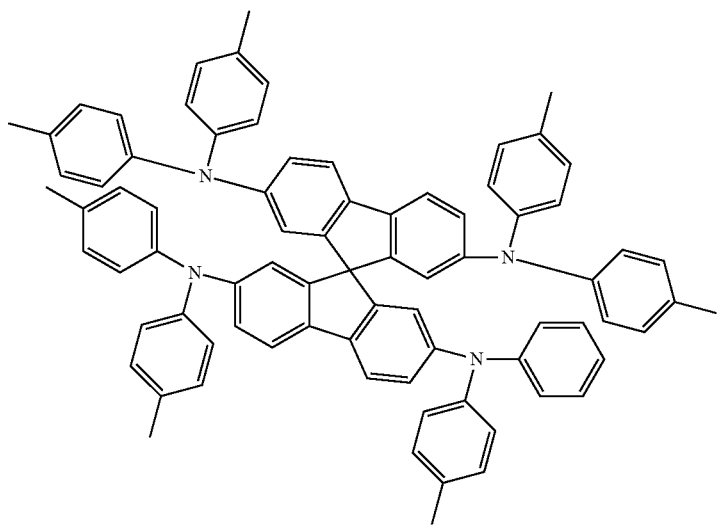
(161)
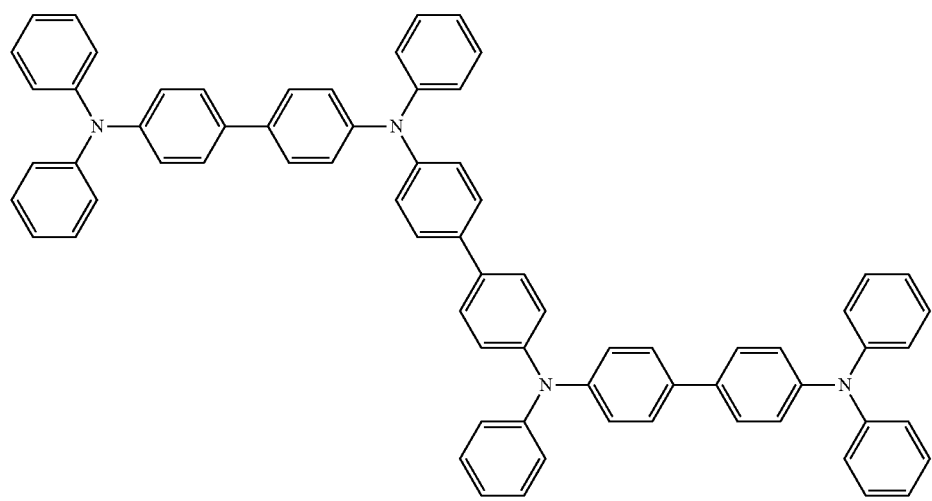 [SMILES: c1ccc(N(c2ccccc2)c2ccc(-c3ccc(N(c4ccccc4)c4ccc(-c5ccc(N(c6ccccc6)c6ccc(-c7ccc(N(c8ccccc8)c8ccccc8)cc7)cc6)cc5)cc4)cc3)cc2)cc1]
(162)
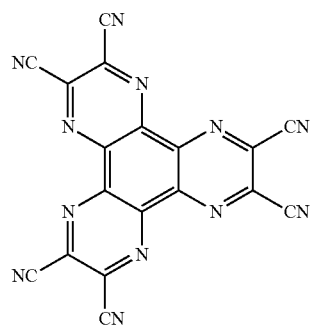 [SMILES: N#Cc1nc2c3nc(C#N)c(C#N)nc3c3nc(C#N)c(C#N)nc3c2nc1C#N]

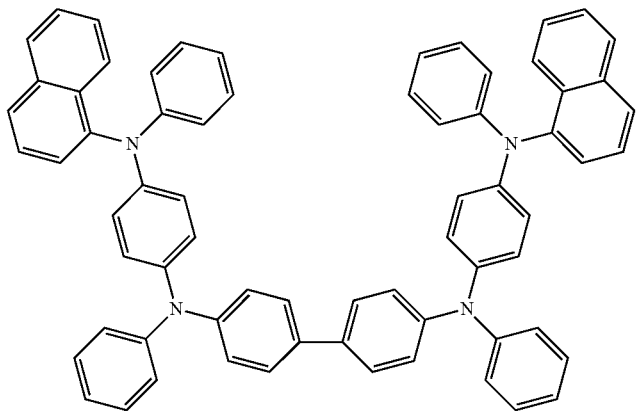 [SMILES: c1ccc(N(c2ccc(-c3ccc(N(c4ccccc4)c4ccc(N(c5ccccc5)c5cccc6ccccc56)cc4)cc3)cc2)c2ccc(N(c3ccccc3)c3cccc4ccccc34)cc2)cc1]
(163)
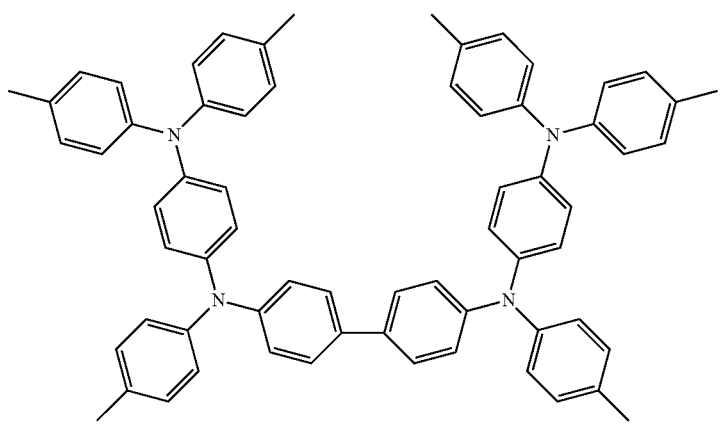
(164)
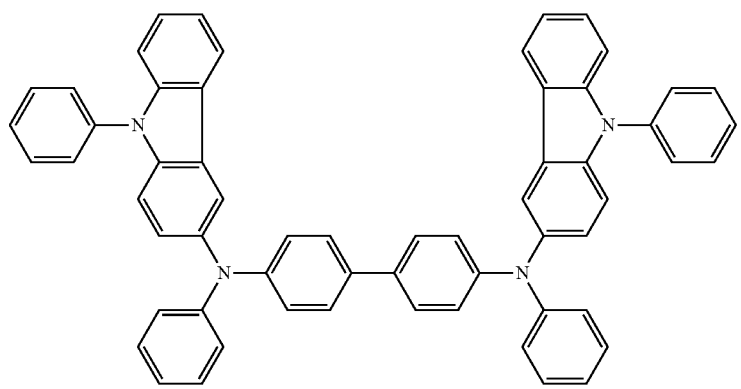 [SMILES: c1ccc(N(c2ccc(-c3ccc(N(c4ccccc4)c4ccc5c(c4)c4ccccc4n5-c4ccccc4)cc3)cc2)c2ccc3c(c2)c2ccccc2n3-c2ccccc2)cc1]
(165)
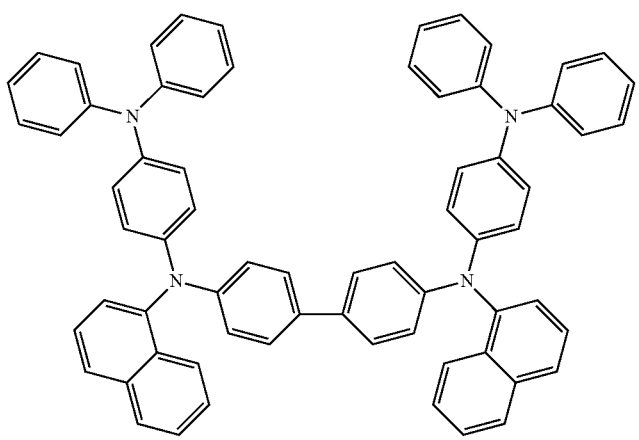 [SMILES: c1ccc(N(c2ccccc2)c2ccc(N(c3ccc(-c4ccc(N(c5ccc(N(c6ccccc6)c6ccccc6)cc5)c5cccc6ccccc56)cc4)cc3)c3cccc4ccccc34)cc2)cc1]
(166)

-continued
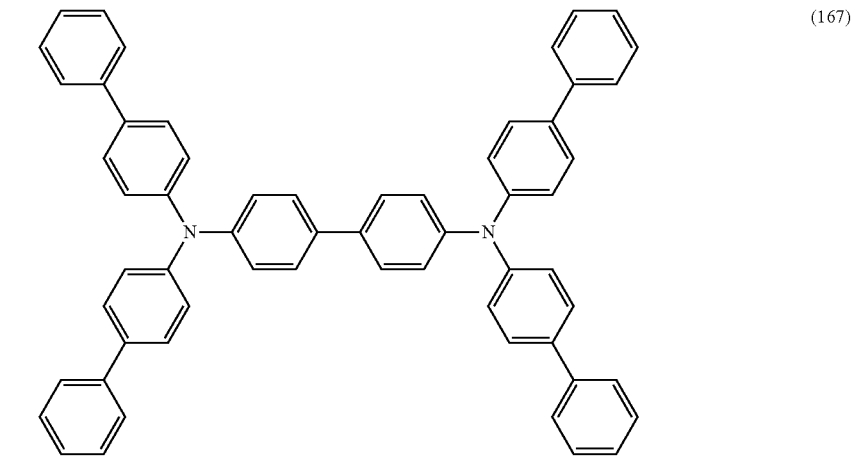
(167)
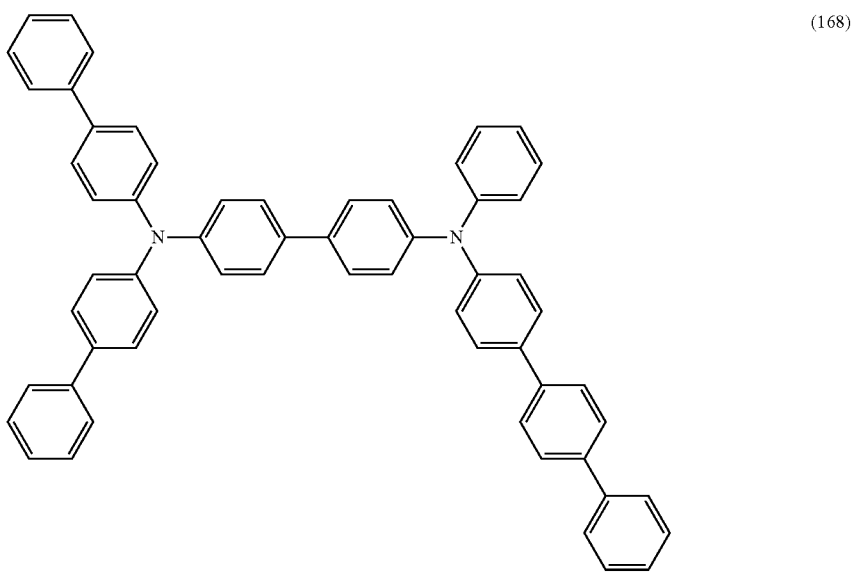
(168)
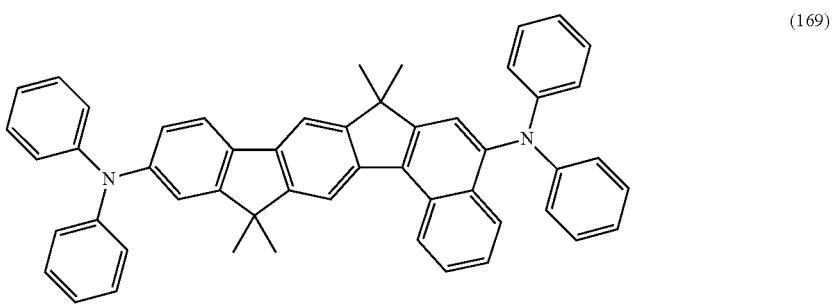
(169)
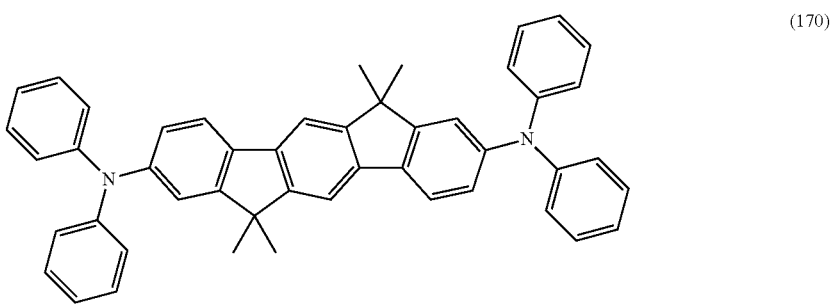
(170)

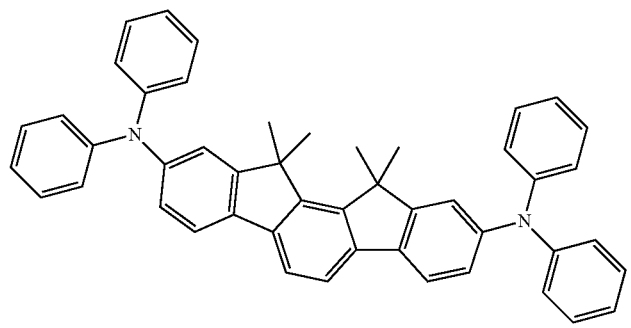 [SMILES: CC1(C)c2cc(N(c3ccccc3)c3ccccc3)ccc2-c2ccc3c(c21)C(C)(C)c1cc(N(c2ccccc2)c2ccccc2)ccc1-3]
(171)
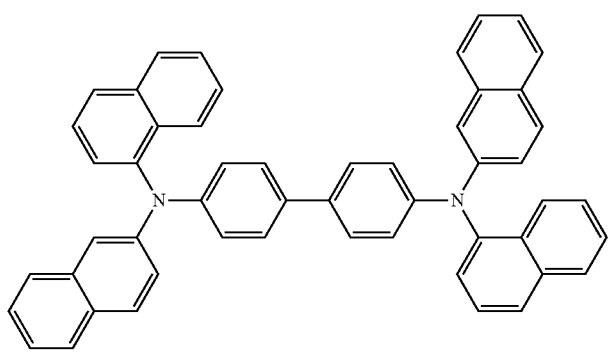 [SMILES: c1ccc2cc(N(c3ccc(-c4ccc(N(c5ccc6ccccc6c5)c5cccc6ccccc56)cc4)cc3)c3cccc4ccccc34)ccc2c1]
(172)
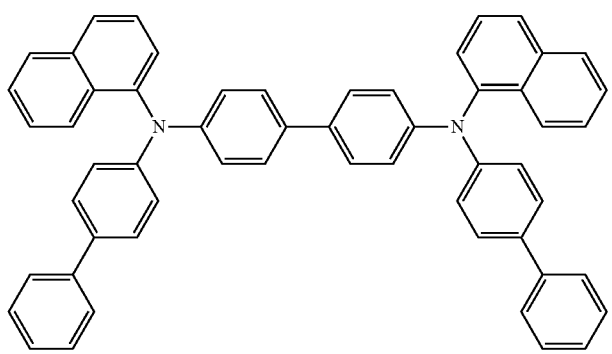 [SMILES: c1ccc(-c2ccc(N(c3ccc(-c4ccc(N(c5ccc(-c6ccccc6)cc5)c5cccc6ccccc56)cc4)cc3)c3cccc4ccccc34)cc2)cc1]
(173)
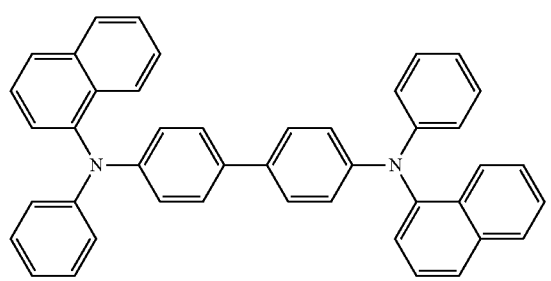 [SMILES: c1ccc(N(c2ccc(-c3ccc(N(c4ccccc4)c4cccc5ccccc45)cc3)cc2)c2cccc3ccccc23)cc1]
(174)

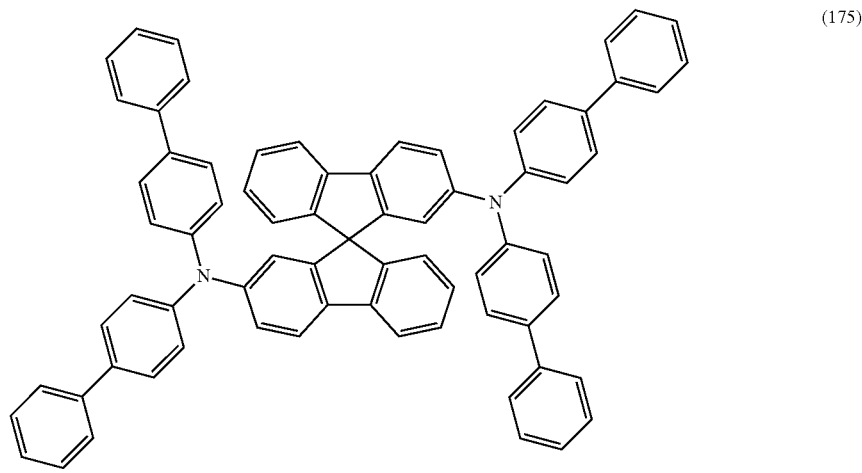

(175)

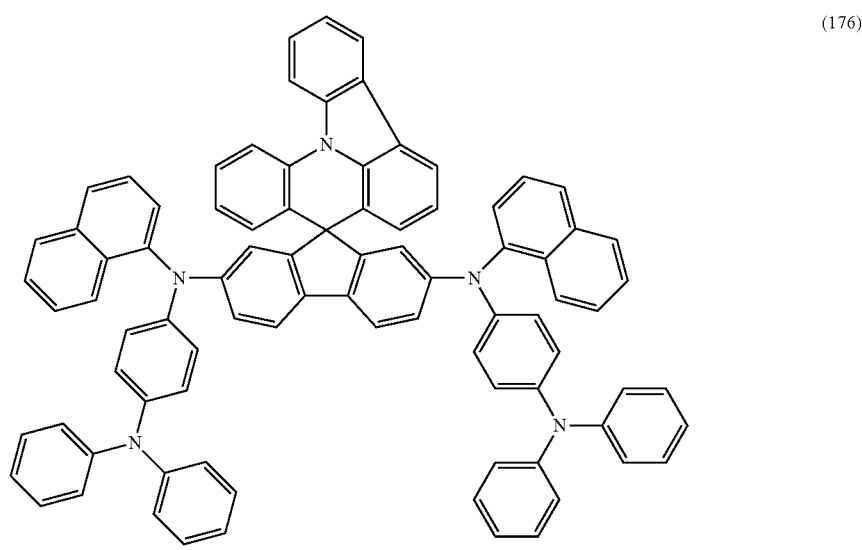

(176)

Suitable electron-transport or electron-injection materials which can be used in the electroluminescent device according to the invention are, for example, the materials indicated in the following table. Suitable electron-transport and electron-injection materials are furthermore derivatives of the compounds depicted above, as disclosed in JP 2000/053957, WO 03/060956, WO 04/028217 and WO 04/080975.

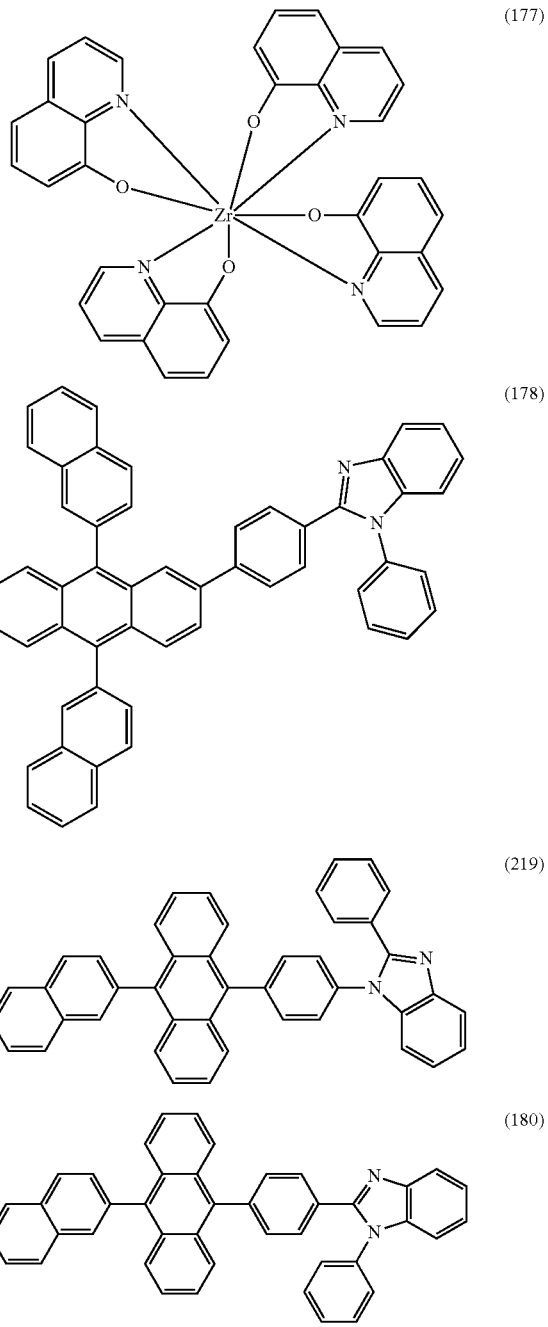

Suitable matrix materials for the compounds according to the invention are ketones, phosphine oxides, sulfoxides and sulfones, for example in accordance with WO 04/013080, WO 04/093207, WO 06/005627 or DE 102008033943, triarylamines, carbazole derivatives, for example CBP (N,N-biscarbazolyl-biphenyl) or the carbazole derivatives disclosed in WO 05/039246, US 2005/0069729, JP 2004/288381, EP 1205527 or WO 08/086,851, indolocarbazole derivatives, for example in accordance with WO 07/063,754 or WO 08/056,746, azacarbazoles, for example in accordance with EP 1617710, EP 1617711, EP 1731584, JP 2005/347160, bipolar matrix materials, for example in accordance with WO 07/137,725, silanes, for example in accordance with WO 05/111172, azaboroles or boronic esters, for example in accordance with WO 06/117052, triazine derivatives, for example in accordance with DE 102008036982, WO 07/063,754 or WO 08/056,746, or zinc complexes, for example in accordance with DE 102007053771.

According to a preferred embodiment, the organic semiconducting compounds (OSC) preferably have a molecular weight of at most 5000 g/mol, particularly at most 2000 g/mol, especially at most 1500 g/mol and more preferably at most 1000 g/mol.

According to a special embodiment of the present invention, the formulation can comprise 0.1 to 10% by weight, preferably 0.25 to 5% more preferably 0.5 to 4% by weight emitting materials and/or charge transporting materials.

Preference is furthermore also given to solutions of non-conducting, electronically inert polymers (matrix polymers; inert polymeric binders) which comprise admixed low-molecular-weight, oligomeric, dendritic, linear or branched and/or polymeric organic and/or organometallic semiconductors. Preferably, the formulation may comprise 0.1 to 10% more preferably 0.25% to 5% most preferably 0.3% to 3% by weight inert polymeric binders.

Optionally, the OSC formulation comprises one or more organic binders, preferably polymeric binders to adjust the rheological properties, as described for example in WO 2005/055248 A1, in particular an organic binder which has a low permittivity ($\in$) at 1,000 Hz of 3.3 or less, very preferably in a proportion of binder to OSC compounds from 20:1 to 1:20, preferably 10:1 to 1:10, especially 5:1 to 1:5, more preferably 1:1 to 1:5 by weight.

Preferably, the polymeric binder comprises a weight average molecular weight in the range of 1000 to 15,000,000 g/mol, especially 1500 to 12,000,000 g/mol, and most especially 1500 to 10,000,000 g/mol. Surprising effects can be achieved with polymers having a weight average molecular weight of at least 10,000 g/mol, preferably at least 200,000 g/mol, especially at least 300,000 g/mol and more preferably at least 500,000 g/mol. According to a very preferred aspect of the present invention, the polymers can preferably have a weight average molecular weigh of at least 1,000,000 g/mol and more preferably at least 2,000,000 g/mol.

The polymers being useful as inert binders can preferably have a weight average molecular weight of at most 20,000,000 g/mol, more preferably of at most 12,000,000 g/mol and most preferably at most 7,000,000 g/mol.

In particular, the polymer can have a polydispersity index $M_w/M_n$ in the range of 1.0 to 10.0, more preferably in the range of 1.01 to 5.0 and most preferably in the range of 1.02 to 3. Astonishing improvements can be achieved with preferable polymers having a polydispersity index $M_w/M_n$ in the range of 1.03 to 2.0, especially 1.04 to 1.5 and more preferably 1.05 to 1.2.

According to a special aspect of the present invention, the polymeric binder may have a multi modal molecular weight distribution. Preferably, the polymer may have 2, 3, 4 or more maxima in the molecular weight distribution as determinable using GPC.

The binder is selected for example from polystyrene, poly(α-methylstyrene), polyvinylcinnamate, poly(4-vinylbiphenyl) or poly(4-methylstyrene). Polymeric binders preferably comprise repeating units derived from styrene and/or olefins. Preferred polymeric binders can comprise at least 80%, especially 90% and more preferably 99% by weight of repeating units derived from styrene monomers and/or olefins.

The binder may also be a semiconducting binder selected for example from poly-arylamines, polyfluorenes, polythiophenes, polyspirobifluorenes, substituted polyvinylenephenylenes, polycarbazoles or polystilbenes, or copolymers thereof.

According to a preferred embodiment of the present invention, an inert binder is a polymer having a glass transition temperature in the range of −70 to 160° C., more preferably, 0 to 150° C., especially 50 to 140° C. and most preferably 70 to 130° C. The glass transition temperature can be determined by measuring the DSC of the polymer (DIN EN ISO 11357, heating rate 10° C. per minute).

Usually, the polymeric binder is dispersible or soluble in the solvent of the present formulation as described above and below. Preferably, the polymeric binder is soluble in the organic solvent and the solubility of the polymeric binder in the solvent is at least 1 g/l, especially at least 5 g/l and more preferably at least 10 g/l.

According to a special embodiment of the present invention, the formulation can comprise 0.05 to 10% by weight, preferably 0.1 to 5% more preferably 0.15 to 3% by weight polymeric binder. Astonishing improvements can be achieved by using formulations preferably comprising 0.2 to 1%, more preferably 0.25 to 0.6 and most preferably 0.3 to 0.5% % by weight polymeric binder.

Astonishing improvements can be achieved by using a high molecular weight binder at a low content in the formulation. Using such approach surprisingly efficient devices having an excellent printing quality are obtainable.

The weight ratio of the semiconducting compound to the inert binder is preferably in the range of 30:1 to 1:30, particularly in the range of 20:1 to 1:5 and more preferably in the range of 5:1 to 1:1.

According to a special embodiment the polymeric binders preferably comprise repeating units derived from styrene and/or olefins. Preferred polymeric binders can comprise at least 80%, especially 90% and more preferably 99% by weight of repeating units derived from styrene monomers and/or olefins.

Styrene monomers are well known in the art. These monomers include styrene, substituted styrenes with an alkyl substituent in the side chain, such as α-methylstyrene and a-ethylstyrene, substituted styrenes with an alkyl substituent on the ring such as vinyltoluene and p-methylstyrene, halogenated styrenes such as monochlorostyrenes, dichlorostyrenes, tribromostyrenes and tetrabromostyrenes.

Olefins are monomers consisting of hydrogen and carbon atoms. These monomers include ethylene, propylene, butylenes, isoprene and 1,3-butadiene.

According to a special aspect of the present invention, the polymeric binder is polystyrene having a weight average molecular weight of preferably at least 100,000 g/mol, especially at least 200,000. especially at least 300,000 g/mol and more preferably at least 500,000 g/mol. According to a very preferred aspect of the present invention, the polystyrene can preferably have a weight average molecular weigh of at least 1,000,000 g/mol and more preferably at least 2,000,000 g/mol.

The polystyrene being useful as inert binders can preferably have a weight average molecular weight of at most 20,000,000 g/mol, more preferably of at most 12,000,000 g/mol and most preferably at most 7,000,000 g/mol.

The formulation according to the present invention may additionally comprise one or more further components like for example surface-active compounds, lubricating agents, conductive additives, dispersing agents, hydrophobing agents, adhesive agents, flow improvers, defoaming agents, deaerators, diluents which may be reactive or non-reactive, auxiliaries, colourants, dyes or pigments, sensitizers, stabilizers, nanoparticles or inhibitors. However, these further components should not be oxidising or otherwise capable of chemically reacting with the OSC or have an electrically doping effect on the OSC.

Surprising improvements can be achieved with volatile wetting agents. The term "volatile" as used above and below means that the agent can be removed from the organic semiconducting materials by evaporation, after these materials have been deposited onto a substrate of an OE device, under conditions (like temperature and/or reduced pressure) that do not significantly damage these materials or the OE device. Preferably this means that the wetting agent has a boiling point or sublimation temperature of <350° C., more preferably ≤300° C., most preferably ≤250° C., at the pressure employed, very preferably at atmospheric pressure (1013 hPa). Evaporation can also be accelerated e.g. by applying heat and/or reduced pressure. Preferably, the wetting agents are not capable of chemically reacting with the OSC compounds. In particular they are selected from compounds that do not have a permanent doping effect on the OSC material (e.g. by oxidising or otherwise chemically reacting with the OSC material). Therefore, the formulation preferably should not contain additives, like e.g. oxidants or protonic or lewis acids, which react with the OSC materials by forming ionic products.

Surprising effects can be accomplished by formulations comprising volatile components having similar boiling points. Preferably, the difference of the boiling point of the wetting agent and the organic solvent is in the range of −50° C. to 50° C., more preferably in the range of −30° C. to 30° C. and most preferably in the range of −20° C. to 20° C.

Preferred wetting agents are non-aromatic compounds. With further preference the wetting agents are non-ionic compounds. Particular useful wetting agents comprise a surface tension of at most 35 mN/m, especially of at most 30 mN/m, and more preferably of at most 25 mN/m. The surface tension can be measured using a FTA (First Ten Angstrom) 125 contact angle goniometer at 25° C. Details of the method are available from First Ten Angstrom as published by Roger P. Woodward, Ph.D. "Surface Tension Measurements Using the Drop Shape Method". Preferably, the pendant drop method can be used to determine the surface tension.

According to a special aspect of the present invention, the difference of the surface tension of the organic solvent and the wetting agent is preferably at least 1 mN/m, especially at least 5 mN/m and more preferably at least 10 mN/m.

Unexpected improvements can be achieved by wetting agents comprising a molecular weight of at least 100 g/mol, especially at least 150 g/mol, preferably at least 180 g/mol and more preferably at least 200 g/mol.

Suitable and preferred wetting agents that do not oxidise or otherwise chemically react with the OSC materials are selected from the group consisting of siloxanes, alkanes, amines, alkenes, alkynes, alcohols and/or halogenated derivates of these compounds. Furthermore, fluoro ethers, fluoro esters and/or fluoro ketones can be used. More preferably, these compounds are selected from methyl siloxanes having 6 to 20 carbon atoms, especially 8 to 16 carbon atoms; $C_7$-$C_{14}$ alkanes, $C_7$-$C_{14}$ alkenes, $C_7$-$C_{14}$ alkynes, alcohols having 7 to 14 carbon atoms, fluoro ethers having 7 to 14 carbon atoms, fluoro esters having 7 to 14 carbon atoms and fluoro ketones having 7 to 14 carbon atoms. Most preferred wetting agents are methyl siloxanes having 8 to 14 carbon atoms.

Useful and preferred alkanes having 7 to 14 carbon atoms include heptane, octane, nonane, decane, undecane, dodecane, tridecane, tetradecane, 3-methyl heptane, 4-ethyl heptane, 5-propyl decane, trimethyl cyclohexane and decalin.

Halogenated alkanes having 7 to 14 carbon atoms include 1-chloro heptane, 1,2-dichloro octane, tetrafluoro octane, decafluoro dodecane, perfluoro nonane, 1,1,1-trifluoromethyl decane, and perfluoro methyl decalin.

Useful and preferred alkenes having 7 to 14 carbon atoms include heptene, octene, nonene, 1-decene, 4-decene, undecene, dodecene, tridecene, tetradecene, 3-methyl heptene, 4-ethyl heptene, 5-propyl decene, and trimethyl cyclohexene.

Halogenated alkenes having 7 to 14 carbon atoms include 1,2-dichloro octene, tetrafluoro octene, decafluoro dodecene, perfluoro nonene, and 1,1,1-trifluoromethyl decene.

Useful and preferred alkynes having 7 to 14 carbon atoms include octyne, nonyne, 1-decyne, 4-decyne, dodecyne, tetradecyne, 3-methyl heptyne, 4-ethyl heptyne, 5-propyl decyne, and trimethyl cyclohexyne.

Halogenated alkynes having 7 to 14 carbon atoms include 1,2-dichloro octyne, tetrafluoro octyne, decafluoro dodecyne, perfluoro nonyne, and 1,1,1-trifluoromethyl decyne.

Useful and preferred alcanols having 7 to 14 carbon atoms include, heptanol, octanol, nonanol, decanol, undecanol, dodecanol, tridecanol, tetradecanol, 3-methyl heptanol, 3,5-dimethyl-1-hexyn-3-ol, 4-ethyl heptanol, 5-propyl decanol, trimethyl cyclohexanol and hydroxyl decalin.

Halogenated alkanols having 7 to 14 carbon atoms include 1-chloro heptanol, 1,2-dichloro octanol, tetrafluoro octanol, decafluoro dodecanol, perfluoro nonanol, 1,1,1-trifluoromethyl decanol, and 2-trifluoro methyl-1-hydroxy decalin.

Useful and preferred fluoro ethers having 7 to 14 carbon atoms include 3-ethoxy-1,1,1,2,3,4,4,5,5,6,6,6 dodecafluoro-2-trifluoromethyl-hexane, 3-propoxy-1,1,1,2,3,4,4,5,5,6,6,6 dodecafluoro-2-trifluoromethyl-hexane, and 3-propoxy-1,1,1,2,3,4,4,5,5,5 decafluoro-2-trifluoromethyl-pentane.

Useful and preferred fluoro esters having 7 to 14 carbon atoms include 3-(1,1,1,2,3,4,4,5,5,6,6,6 dodecafluoro-2-trifluoromethyl-hexyl)ethanoate, and 3-(1,1,1,2,3,4,4,5,5,5 decafluoro-2-trifluoromethyl-pentyl)propanoate.

Useful and preferred fluoro ketones having 7 to 14 carbon atoms include 3-(1,1,1,2,3,4,4,5,5,6,6,6 dodecafluoro-2-trifluoromethyl-hexyl)ethyl ketone, and 3-(1,1,1,2,3,4,4,5,5,5 decafluoro-2-trifluoromethyl-pentyl) propyl ketone.

Useful and preferred siloxanes include hexamethyl disiloxane, octamethyl trisiloxane, decamethyl tetrasiloxane, dodecamethyl pentasiloxane, and tetradecamethyl hexasiloxane.

Preferably, the formulation may comprise at most 5% by weight, especially at most 3% by weight of wetting additives. More preferably, the formulation comprises 0.01 to 4% by weight, especially preferably 0.1 to 1% by weight of wetting agent.

The formulation according to the present invention can be designed as an emulsion, dispersion or solution. Preferably, the present formulation is a solution (homogeneous mixture) comprising no considerable amounts of a second phase.

The formulation according to the present invention can be used for the preparation of organic electronic (OE) devices, for example transistors like OFETs or organic photovoltaic (OPV) devices like diodes or solar cells, or organic light emitting diodes (OLED).

Especially preferred OE devices are OFETs. A preferred OFET according to the present invention comprises the following components:
optionally a substrate (1),
a gate electrode (2),
an insulator layer comprising a dielectric material (3),
an OSC layer (4)
source and drain electrodes (5),
optionally one or more protection or passivation layers (6).

BRIEF DESCRIPTION OF THE DRAWINGS

FIG. 1A exemplarily and schematically depicts a typical bottom gate (BG), top contact (TC) OFET device according to the present invention, comprising a substrate (1), a gate electrode (2), a layer of dielectric material (3) (also known as gate insulator layer), an OSC layer (4), and source and drain (S/D) electrodes (5), and an optional passivation or protection layer (6).

Figure 1A:
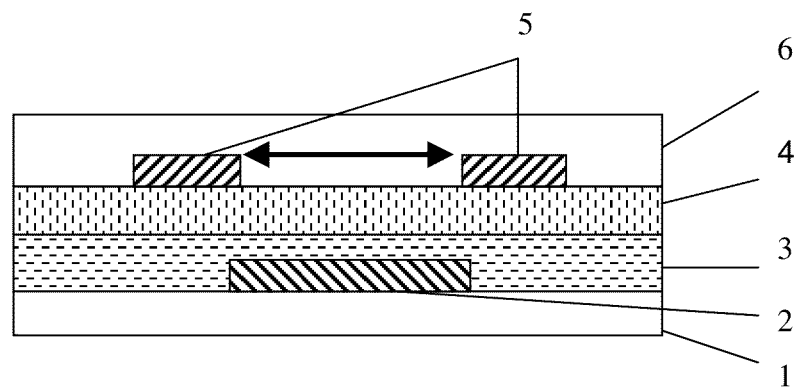
FIG. 1A exemplarily and schematically depicts a typical bottom gate (BG), top contact (TC) OFET device according to the present invention.

The device of FIG. 1A can be prepared by a process comprising the steps of depositing a gate electrode (2) on a substrate (1), depositing a dielectric layer (3) on top of the gate electrode (2) and the substrate (1), depositing an OSC layer (4) on top of the dielectric layer (3), depositing S/D electrodes (5) on top of the OSC layer (4), and optionally depositing a passivation or protection layer (6) on top of the S/D electrodes (5) and the OSC layer (4).

Figure 1B:
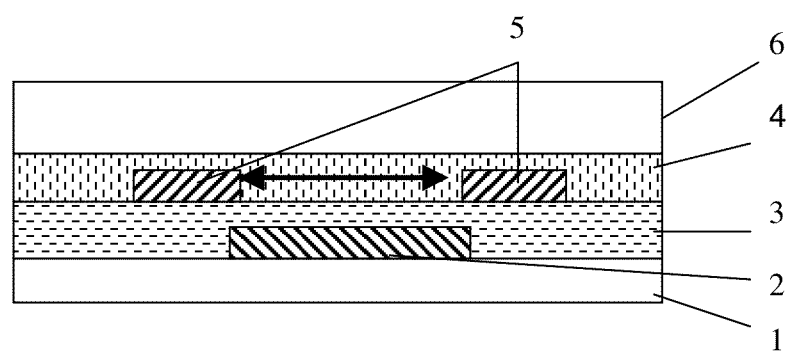
FIG. 1B exemplarily and schematically depicts a typical bottom gate (BG), bottom contact (BC) OFET device according to the present invention.

FIG. 1B exemplarily and schematically depicts a typical bottom gate (BG), bottom contact (BC) OFET device according to the present invention, comprising a substrate (1), a gate electrode (2), a dielectric layer (3), S/D electrodes (5), an OSC layer (4), and an optional passivation or protection layer (6).

The device of FIG. 1B can be prepared by a process comprising the steps of depositing a gate electrode (2) on a substrate (1), depositing a dielectric layer (3) on top of the gate electrode (2) and the substrate (1), depositing S/D electrodes (5) on top of the dielectric layer (3), depositing an OSC layer (4) on top of the S/D electrodes (4) and the dielectric layer (3), and optionally depositing a passivation or protection layer (6) on top of the OSC layer (4).

Figure 2:
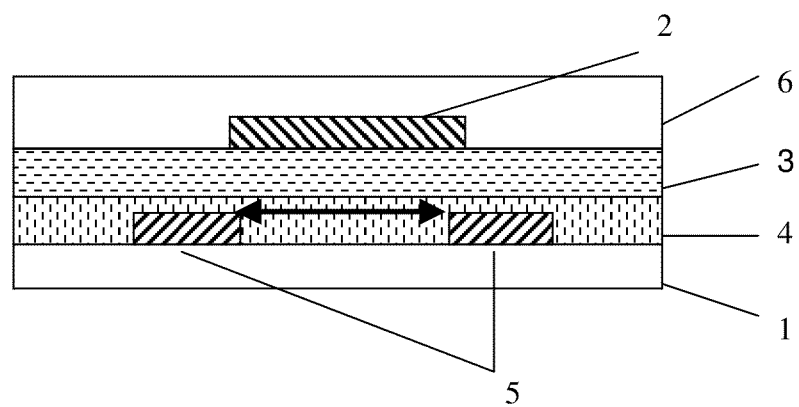
FIG. 2 exemplarily and schematically depicts a top gate (TG) OFET device according to the present invention.

FIG. 2 exemplarily and schematically depicts a top gate (TG) OFET device according to the present invention, comprising a substrate (1), source and drain electrodes (5), an OSC layer (4), a dielectric layer (3), and a gate electrode (2), and an optional passivation or protection layer (6).

The device of FIG. 2 can be prepared by a process comprising the steps of depositing S/D electrodes (5) on a substrate (1), depositing an OSC layer (4) on top of the S/D electrodes (4) and the substrate (1), depositing a dielectric layer (3) on top of the OSC layer (4), depositing a gate electrode (2) on top of the dielectric layer (3), and optionally depositing a passivation or protection layer (6) on top of the gate electrode (2) and the dielectric layer (3).

The passivation or protection layer (6) in the devices described in FIGS. 1A, 1B and 2 has the purpose of protecting the OSC layer and the S/D or gate electrodes from further layers or devices that may be later provided thereon, and/or from environmental influence.

The distance between the source and drain electrodes (5), as indicated by the double arrow in FIGS. 1A, 1B and 2, is the channel area.

In case of formulations for use in OPV cells, the formulation preferably comprises or contains, more preferably consists essentially of, very preferably exclusively of, a p-type semiconductor and a n-type semiconductor, or an acceptor and a donor material. A preferred material of this type is a blend or mixture of poly(3-substituted thiophene) or P3AT with a $C_{60}$ or $C_{70}$ fullerene or modified $C_{60}$ molecule like PCBM [(6,6)-phenyl C61-butyric acid methyl ester], as disclosed for example in WO 94/05045 A1, wherein preferably the ratio of P3AT to fullerene is from 2:1 to 1:2 by weight, more preferably from 1.2:1 to 1:1.2 by weight.

Figure 3:
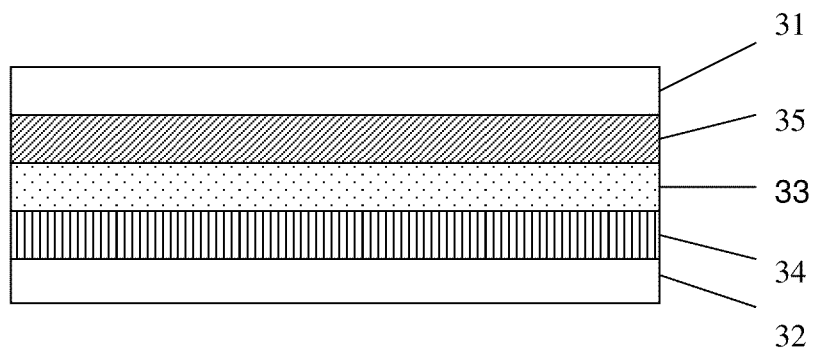
FIG. 3 exemplarily and schematically depicts a typical OPV device according to the present invention.
Figure 4:
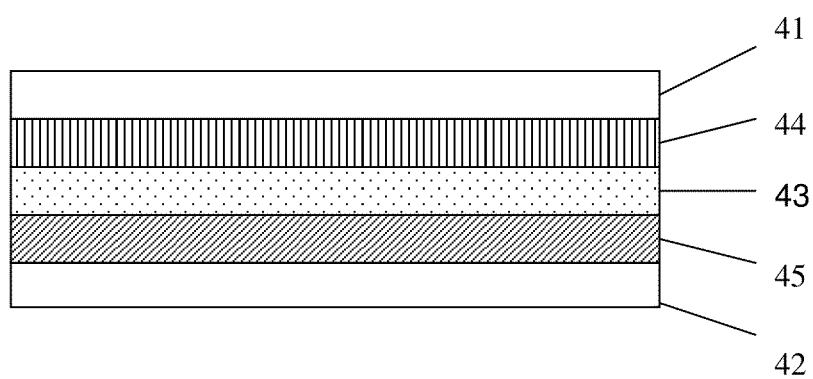
FIG. 4 exemplarily and schematically depicts a preferred OPV device according to the present invention.

FIG. 3 and FIG. 4 exemplarily and schematically depict typical and preferred OPV devices according to the present invention [see also Waldauf et al., Appl. Phys. Lett. 89, 233517 (2006)].

An OPV device as shown in FIG. 3 preferably comprises:
- a low work function electrode (31) (for example a metal, such as aluminum), and a high work function electrode (32) (for example ITO), one of which is transparent,
- a layer (33) (also referred to as "active layer") comprising a hole transporting material and an electron transporting material, preferably selected from OSC materials, situated between the electrodes (31,32); the active layer can exist for example as a bilayer or two distinct layers or blend or mixture of p and n type semiconductor,
- an optional conducting polymer layer (34), for example comprising a blend of PEDOT:PSS (poly(3,4-ethylenedioxythiophene): poly(styrenesulfonate)), situated between the active layer (33) and the high work function electrode (32), to modify the work function of the high work function electrode to provide an ohmic contact for holes,
- an optional coating (35) (for example of LiF) on the side of the low workfunction electrode (31) facing the active layer (33), to provide an ohmic contact for electrons.

An inverted OPV device as shown in FIG. 4 preferably comprises:
- a low work function electrode (41) (for example a metal, such as gold), and a high work function electrode (42) (for example ITO), one of which is transparent,
- a layer (43) (also referred to as "active layer") comprising a hole transporting material and an electron transporting material, preferably selected from OSC materials, situated between the electrodes (41,42); the active layer can exist for example as a bilayer or two distinct layers or blend or mixture of p and n type semiconductor,
- an optional conducting polymer layer (44), for example comprising a blend of PEDOT:PSS, situated between the active layer (43) and the low work function electrode (41) to provide an ohmic contact for electrons,
- an optional coating (45) (for example of $TiO_x$) on the side of the high workfunction electrode (42) facing the active layer (43), to provide an ohmic contact for holes.

The OPV devices of the present invent invention typically comprise a p-type (electron donor) semiconductor and an n-type (electron acceptor) semiconductor. The p-type semiconductor is for example a polymer like poly(3-alkylthiophene) (P3AT), preferably poly(3-hexylthiophene) (P3HT), or alternatively another selected from the groups of preferred polymeric and monomeric OSC material as listed above. The n-type semiconductor can be an inorganic material such as zinc oxide or cadmium selenide, or an organic material such as a fullerene derivate, for example (6,6)-phenyl-butyric acid methyl ester derivatized methano $C_{60}$ fullerene, also known as "PCBM" or "$C_{60}$PCBM", as disclosed for example in G. Yu, J. Gao, J. C. Hummelen, F. Wudl, A. J. Heeger, Science 1995, Vol. 270, p. 1789 ff and having the structure shown below, or an structural analogous compound with e.g. a $C_{70}$ fullerene group ($C_{70}$PCBM), or a polymer (see for example Coakley, K. M. and McGehee, M. D. Chem. Mater. 2004, 16, 4533).

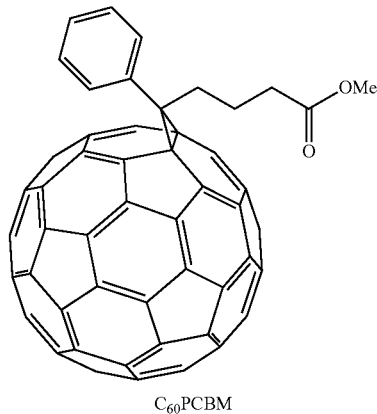

$C_{60}$PCBM

A preferred material of this type is a blend or mixture of a polymer like P3HT or another polymer selected from the groups listed above, with a $C_{60}$ or $C_{70}$ fullerene or modified fullerene like PCBM. Preferably the ratio polymer:fullerene is from 2:1 to 1:2 by weight, more preferably from 1.2:1 to 1:1.2 by weight, most preferably 1:1 by weight. For the blended mixture, an optional annealing step may be necessary to optimize blend morpohology and consequently OPV device performance.

During the process of preparing an OE device, the OSC layer is deposited onto a substrate, followed by removal of the solvent together with any volatile additive(s) present, to form a film or layer.

Various substrates may be used for the fabrication of OE devices, for example glass, ITO coated glass, ITO glass with pre coated layers including PEDOT, PANI etc, or plastics, plastics materials being preferred, examples including alkyd resins, allyl esters, benzocyclobutenes, butadiene-styrene, cellulose, cellulose acetate, epoxide, epoxy polymers, ethylene-chlorotrifluoro ethylene, ethylene-tetra-fluoroethylene, fibre glass enhanced plastic, fluorocarbon polymers, hexafluoropropylenevinylidene-fluoride copolymer, high density polyethylene, parylene, polyamide, polyimide, polyaramid, polydimethylsiloxane, polyethersulphone, polyethylene, polyethylenenaphthalate, polyethyleneterephthalate, polyketone, polymethylmethacrylate, polypropylene, polystyrene, polysulphone, polytetrafluoroethylene, polyurethanes, polyvinylchloride, silicone rubbers, silicones, and flexible films with ITO, or other conducting layers and barrier layers e.g. Vitex film.

Preferred substrate materials are polyethyleneterephthalate, polyimide, and polyethylenenaphthalate. The substrate may be any plastic material, metal or glass coated with the above materials. The substrate should preferably be homogeneous to ensure good pattern definition. The substrate may also be uniformly pre-aligned by extruding, stretching, rubbing or by photochemical techniques to induce the orientation of the organic semiconductor in order to enhance carrier mobility.

The electrodes can be deposited by liquid coating, such as spray-, dip-, web- or spin-coating, or by vacuum deposition or vapor deposition methods. Suitable electrode materials and deposition methods are known to the person skilled in the art. Suitable electrode materials include, without limitation, inorganic or organic materials, or composites of the two. Examples for suitable conductor or electrode materials include polyaniline, polypyrrole, PEDOT or doped conjugated polymers, further dispersions or pastes of graphite or particles of metal such as Au, Ag, Cu, Al, Ni or their mixtures as well as sputter coated or evaporated metals such as Cu, Cr, Pt/Pd or metal oxides such as indium tin oxide (ITO). Organometallic precursors may also be used deposited from a liquid phase.

Preferably, the substrate on surface on which the formulation according to the present invention is applied comprises a surface energy in the range of 130 to 25 mN m$^{-1}$ more preferably in the range of 115 to 30 mN m$^{-1}$ determined by measuring the contact angle of at least 2 solvents, e.g. water and methylene iodide, but other solvents can be used. These are typically measured using a contact angle goniometer such as a FTA 1000, at a temperature of 20-25° C. (room temp and at normal atmospheric pressure the contact angle of the 2 solvents are then combined using a variety of mathematical models, typically Owens-Wendt geometric mean or Wu's harmonic mean. Preferably, the Owens-Wendt method is used.

Owens-Wendt formula $$(1+\cos\theta)\gamma_{LV} = 2\sqrt{(\gamma^D_{SV}\gamma^D_{LV})} + 2\sqrt{(\gamma^P_{SV}\gamma^P_{LV})}$$

Wu's Harmonic mean formula $$(1+\cos\theta)\gamma_{LV} = 4\{\gamma_{DSV}\gamma_{DLV}/(\gamma^D_{SV}+\gamma^D_{LV}) + \gamma^P_{SV}\gamma^P_{LV}/(\gamma^P_{SV}+\gamma^P_{LV})\}$$

Deposition of the OSC layer can be achieved by standard methods that are known to the skilled person and are described in the literature. Suitable and preferred deposition methods include liquid coating and printing techniques. Very preferred deposition methods include, without limitation, dip coating, spin coating, spray coating, aerosol jetting, ink jet printing, nozzle printing, gravure printing, doctor blade coating, roller printing, reverse-roller printing, flexographic printing, web printing, spray coating, dip coating, curtain coating, kiss coating, meyer bar coating, 2 roll nip fed coating, anilox coaters, knife coating or slot dye coating. Preferably, the OSC layer is applied with gravure printing, doctor blade coating, roller printing, reverse-roller printing, flexographic printing, web printing, anilox coaters. Gravure and flexographic printing and variants of these printing methods are preferred. These include but or not limited to, micro gravure, reverse gravure, offset gravure, reverse roll etc. Both web fed (roll to roll) and sheetfed in both flatbed and the more conventional 'on the round' configurations can be used.

For flexo printing the anilox can be either chromed steel or ceramic, preferably ceramic. The cell etch can vary between 2 cm$^3$/m$^2$ to 120 cm$^3$/m$^2$ but most preferably between 3 cm$^3$/m$^2$ to 20 cm$^3$/m$^2$ and most preferably between 4 cm$^3$/m$^2$ to 18 cm$^3$/m$^2$, however the dried film thickness will vary on the concentration of the active material and the transfer characteristics of said formulation.

The cell configuration, ie shape, depth, cell wall linking can be adapted by a person skilled in the art to achieve an optimal printing result.

For gravure printing the chromed steel is preferably used but this does not exclude other materials. The engraving requirements are approximately 50% of those for the flexographic printing because there is one less transfer process involved.

The speed can vary significantly depending on the press type and configuration, for flatbed printing the print speed is typically very slow, typically 100 mm/minute or less. On roll to roll presses the speed can exceed 500 m/min.

According to a special aspect, an insulator layer can be deposited on a substrate in order to achieve a special type of an OE according to the present invention. Preferably, the insulator layer is deposited by solution processing, very preferably using a solution of a dielectric material, which is optionally cross-linkable, in one or more organic solvents. Preferably the solvent used for depositing the dielectric material is orthogonal to the solvent used for depositing the OSC material, and vice versa.

When spin coating is used as deposition method, the OSC or dielectric material is spun for example between 1000 and 2000 rpm for a period of for example 30 seconds to give a layer with a typical layer thickness between 0.5 and 1.5 μm. After spin coating the film can be heated at an elevated temperature to remove all residual volatile solvents.

If a cross-linkable dielectric is used, it is preferably cross-linked after deposition by exposure to electron beam or electromagnetic (actinic) radiation, like for example X-ray, UV or visible radiation. For example, actinic radiation can be used having a wavelength of from 50 nm to 700 nm, preferably from 200 to 450 nm, most preferably from 300 to 400 nm. Suitable radiation dosages are typically in the range from 25 to 3,000 mJ/cm$^2$. Suitable radiation sources include mercury, mercury/xenon, mercury/halogen and xenon lamps, argon or xenon laser sources, x-ray, or e-beam. The exposure to actinic radiation will induce a cross-linking reaction in the cross-linkable groups of the dielectric material in the exposed regions. It is also possible for example to use a light source having a wavelength outside the absorption band of the cross-linkable groups, and to add a radiation sensitive photosensitizer to the cross-linkable material.

Optionally the dielectric material layer is annealed after exposure to radiation, for example at a temperature from 70° C. to 130° C., for example for a period of from 1 to 30 minutes, preferably from 1 to 10 minutes. The annealing step at elevated temperature can be used to complete the cross-linking reaction that was induced by the exposure of the cross-linkable groups of the dielectric material to photoradiation.

Removal of the solvent and any volatile additive(s) is preferably achieved by evaporation, for example by exposing the deposited layer to high temperature and/or reduced pressure, preferably at −50° C. to 300° C., more preferably 20° C. to 250° C. According to a special aspect of the present invention, the solvent(s) and any volatile additive can be evaporated under reduced pressure. Preferably either atmospheric pressure or reduced pressure the pressure for solvent evaporation ranges from 10$^{-3}$ mbar to 1 bar, especially from 10$^{-2}$ mbar to 100 mbar and more preferably from 0.1 mbar to 10 mbar. Moreover, the evaporation of the solvent can be preferably achieved below the boiling point of the solvent.

The thickness of the dried OSC layer is preferably from 1 nm to 50 μm, especially from 2 to 1000 nm and more preferably 3 to 500 nm. Preferred layers comprising organic light emitting materials and/or charge transporting materials can have a thickness in the range of 2 to 150 nm.

Further to the materials and methods as described above and below, the OE device and its components can be prepared from standard materials and standard methods, which are known to the person skilled in the art and described in the literature.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

It will be appreciated that many of the features described above, particularly of the preferred embodiments, are inventive in their own right and not just as part of an embodiment of the present invention. Independent protection may be sought for these features in addition to or alternative to any invention presently claimed.

Unless the context clearly indicates otherwise, as used herein plural forms of the terms herein are to be construed as including the singular form and vice versa.

Throughout the description and claims of this specification, the words "comprise" and "contain" and variations of the words, for example "comprising" and "comprises", mean "including but not limited to", and are not intended to (and do not) exclude other components.

The term "polymer" includes homopolymers and copolymers, e.g. statistical, alternating or block copolymers. In addition, the term "polymer" as used hereinafter does also include oligomers and dendrimers. Dendrimers are typically branched macromolecular compounds consisting of a multifunctional core group onto which further branched monomers are added in a regular way giving a tree-like structure, as described e.g. in M. Fischer and F. Vögtle, *Angew. Chem., Int. Ed.* 1999, 38, 885. The term "conjugated polymer" means a polymer containing in its backbone (or main chain) mainly C atoms with $sp^2$-hybridisation, or optionally sp-hybridisation, which may also be replaced by hetero atoms, enabling interaction of one π-orbital with another across an intervening a-bond. In the simplest case this is for example a backbone with alternating carbon-carbon (or carbon-hetero atom) single and multiple (e.g. double or triple) bonds, but does also include polymers with units like 1,3-phenylene. "Mainly" means in this connection that a polymer with naturally (spontaneously) occurring defects, which may lead to interruption of the conjugation, is still regarded as a conjugated polymer. Also included in this meaning are polymers wherein the backbone comprises for example units like aryl amines, aryl phosphines and/or certain heterocycles (i.e. conjugation via N-, O-, P- or S-atoms) and/or metal organic complexes (i.e. conjugation via a metal atom). The term "conjugated linking group" means a group connecting two rings (usually aromatic rings) consisting of C atoms or hetero atoms with $sp^2$-hybridisation or sp-hybridisation. See also "IUPAC Compendium of Chemical terminology, Electronic version".

Unless stated otherwise, the molecular weight is given as the number average molecular weight $M_n$ or as weight average molecular weight $M_w$, which unless stated otherwise are determined by gel permeation chromatography (GPC) against polystyrene standards.

The degree of polymerization (n) means the number average degree of polymerization, unless stated otherwise given as $n = M_n/M_U$, wherein $M_U$ is the molecular weight of the single repeating unit.

The term "small molecule" means a monomeric, i.e. a non-polymeric compound.

Unless stated otherwise, percentages of solids are percent by weight ("wt. %"), percentages or ratios of liquids (like e.g. in solvent mixtures) are percent by volume ("vol. %"), and all temperatures are given in degrees Celsius (° C.).

Unless stated otherwise, concentrations or proportions of mixture components, given in percentages or ppm are related to the entire formulation including the solvents.

The invention will now be described in more detail by reference to the following examples, which are illustrative only and do not limit the scope of the present invention.

All process steps described above and below can be carried out using known techniques and standard equipment which are described in prior art and are well-known to the skilled person.

EXAMPLES

Example 1

Small Molecule, Flexo Printed, Top Gate

Compound A is a mixture of the following isomers

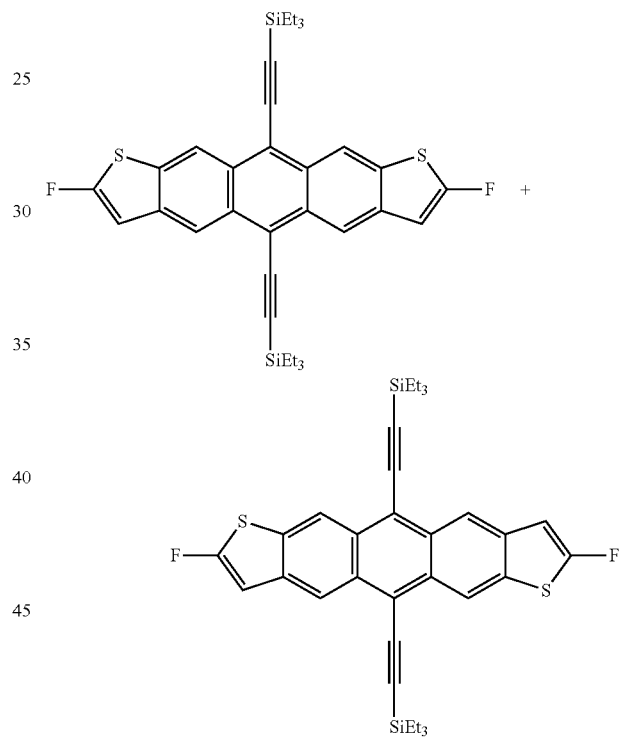

Compound A and its preparation are disclosed in S. Subramanian, J. Anthony et al., J. Am. Chem. Soc. 2008, 130, 2706-2707 (including Supporting Information).

An OFET device was prepared as follows:

Teonex Q65FA film (available from DuPont Teijin Films) was washed in an ultrasonic methanol bath for 2 minutes and then rinsed with methanol. Approximately 60 nm thick gold source drain electrodes were evaporated with a parallel plate geometry of 20 micron wide by 1000 micron long. The substrate was cleaned with plasma ozone for 1 minutes. The electrodes were treated with Lisicon™ M001 (available from Merck Chemicals) SAM treatment by spin coating from isopropyl alcohol and evaporating the excess off on a hot plate at 100° C. for 1 min.

An OSC formulation was prepared by dissolving of 1.6 Compound A and 0.4 parts 350 000 Mw polystyrene in 78.4 parts cyclohexylbenzene and 19.6 parts of mesitylene filtering the solution through a 0.2 μm PTFE cartridge filter.

Viscosity of 2.2 cP as measured using an AR G-2 rheometer ex TA instruments. The viscosity was measured over a shear rate range of 10 sec$^{-1}$ to 1000 sec$^{-1}$ viscosity extrapolated using a Newtonian fit equation, all measurements taken at 25° C.

The OSC formulation was then printed as a 5×5 cm wide area block on the array of source drain electrodes on PEN film as described above using a RK Flexiproof 100 flexographic printing with a 8 cm$^3$/m$^2$ loaded anilox and a Cyrel HiQS flexo mat running at 80 m/min speed. The printed OSC layer was then annealed at 70° C. for 3 minutes.

A dielectric layer of fluoro-polymer Lisicon™ D139 (9% solids available from Merck Chemicals) was spun on top of the OSC layer on the device and annealed at 100° C. for 2 minutes to give a dry dielectric film of approximately 1 micron thick.

Finally a 40 nm thick gold gate electrode array of evaporated on top of the dielectric layer in such a way that it covered the existing source drain electrode structures.

Figure 5:
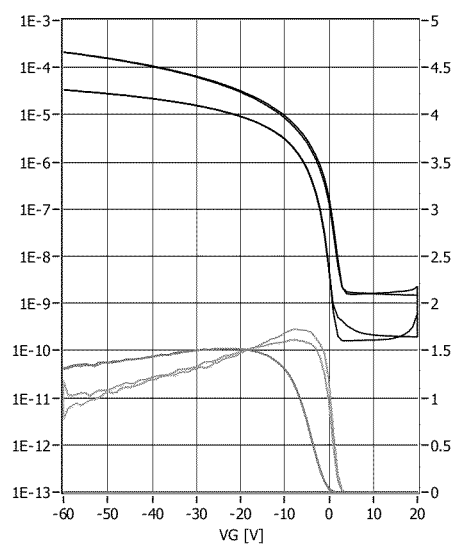

The transfer and stress measurements of the OFET device was performed by using Keithley 4200. The transistor transfer characteristic and the linear and saturation mobility are depicted in FIG. 5.

Example 2

Small Molecule, Flexo Printed, Top Gate

An OFET device was prepared as follows:
Teonex Q65FA film (available from DuPont Teijin Films) was washed in an ultrasonic methanol bath for 2 minutes and then rinsed with methanol. Approximately 60 nm thick gold source drain electrodes were evaporated with a parallel plate geometry of 20 micron wide by 1000 micron long. The substrate was cleaned with plasma ozone for 1 minutes. The electrodes were treated with Lisicon™ M001 (available from Merck Chemicals) SAM treatment by spin coating from isopropyl alcohol and evaporating the excess off on a hot plate at 100° C. for 1 min.

An OSC formulation was prepared by dissolving of 1.3 parts Compound A (as mentioned in Example 1) and 0.7 parts 350 000 Mw polystyrene in 78.4 parts cyclohexylbenzene and 19.6 parts of mesitylene filtering the solution through a 0.2 μm PTFE cartridge filter.

Viscosity of 2.3 cP as measured using an AR G-2 rheometer ex TA instruments. The viscosity was measured over a shear rate range of 10 sec$^{-1}$ to 1000 sec$^{-1}$ viscosity extrapolated using a Newtonian fit equation, all measurements taken at 25° C.

The OSC formulation was then printed as a 5×5 cm wide area block on the array of source drain electrodes on PEN film as described above using a RK Flexiproof 100 flexographic printing with a 8 cm$^3$/m$^2$ loaded anilox and a Cyrel HiQS flexo mat running at 80 m/min speed. The printed OSC layer was then annealed at 70° C. for 3 minutes.

A dielectric layer of fluoro-polymer Lisicon™ D139 (9% solids available from Merck Chemicals) was spun on top of the OSC layer on the device and annealed at 100° C. for 2 minutes to give a dry dielectric film of approximately 1 micron thick.

Finally a 40 nm thick gold gate electrode array of evaporated on top of the dielectric layer in such a way that it covered the existing source drain electrode structures.

Figure 6:
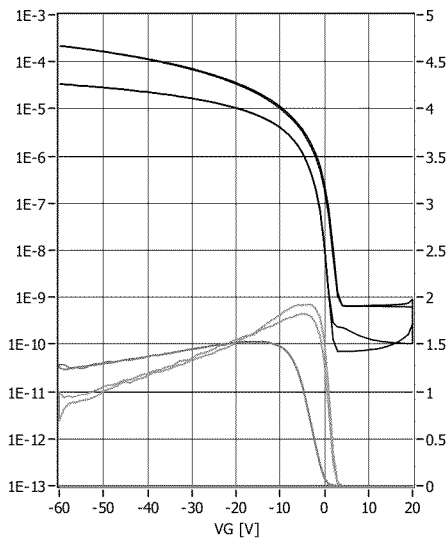

The transfer and stress measurements of the OFET device was performed by using Keithley 4200. The transistor transfer characteristic and the linear and saturation mobility are depicted in FIG. 6.

Example 3

Small Molecule, Flexo Printed, Top Gate

An OFET device was prepared as follows:
Teonex Q65FA film (available from DuPont Teijin Films) was washed in an ultrasonic methanol bath for 2 minutes and then rinsed with methanol. Approximately 60 nm thick gold source drain electrodes were evaporated with a parallel plate geometry of 20 micron wide by 1000 micron long. The substrate was cleaned with plasma ozone for 1 minutes. The electrodes were treated with Lisicon™ M001 (available from Merck Chemicals) SAM treatment by spin coating from isopropyl alcohol and evaporating the excess off on a hot plate at 100° C. for 1 min.

An OSC formulation was prepared by dissolving of 1.3 parts Compound A (as mentioned in Example 1) and 0.7 parts 350 000 Mw polystyrene in 58.8 parts cyclohexylbenzene and 39.2 parts of mesitylene filtering the solution through a 0.2 μm PTFE cartridge filter.

Viscosity of 1.6 cP as measured using an AR G-2 rheometer ex TA instruments. The viscosity was measured over a shear rate range of 10 sec$^{-1}$ to 1000 sec$^{-1}$ viscosity extrapolated using a Newtonian fit equation, all measurements taken at 25° C.

The OSC formulation was then printed as a 5×5 cm wide area block on the array of source drain electrodes on PEN film as described above using a RK Flexiproof 100 flexographic printing with a 8 cm$^3$/m$^2$ loaded anilox and a Cyrel HiQS flexo mat running at 80 m/min speed. The printed OSC layer was then annealed at 70° C. for 3 minutes.

A dielectric layer of fluoro-polymer Lisicon™ D139 (9% solids available from Merck Chemicals) was spun on top of the OSC layer on the device and annealed at 100° C. for 2 minutes to give a dry dielectric film of approximately 1 micron thick.

Finally a 40 nm thick gold gate electrode array of evaporated on top of the dielectric layer in such a way that it covered the existing source drain electrode structures.

Figure 7:
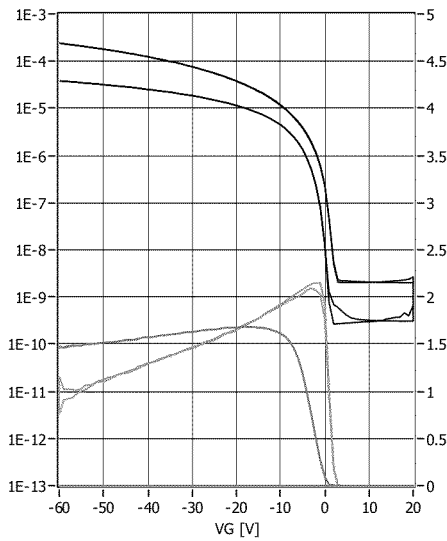

The transfer and stress measurements of the OFET device was performed by using Keithley 4200. The transistor transfer characteristic and the linear and saturation mobility are depicted in FIG. 7.

Example 4

Small Molecule, Gravure Printed, Top Gate

An OFET device was prepared as follows:
Teonex Q65FA film (available from DuPont Teijin Films) was washed in an ultrasonic methanol bath for 2 minutes and then rinsed with methanol. Approximately 60 nm thick gold source drain electrodes were evaporated with a parallel plate geometry of 20 micron wide by 1000 micron long. The substrate was cleaned with a 500 W argon plasma for 1 minute. The electrodes were treated with Lisicon™ M001 (available from Merck Chemicals) SAM treatment by spin coating from isopropyl alcohol and evaporating the excess off on a hot plate at 100° C. for 1 min.

OSC formulation was prepared by dissolving of 1.6 parts Compound A (as mentioned in Example 1) and 0.4 parts 350000 Mw polystyrene in 78.4 parts cyclohexylbenzene and 19.6 parts o-xylene and filtering the solution through a 0.2 µm PTFE cartridge filter.

Viscosity of 2.23 cP as measured using an AR G-2 rheometer ex TA instruments. The viscosity was measured over a shear rate range of 10 sec$^{-1}$ to 1000 sec$^{-1}$ viscosity extrapolated using a Newtonian fit equation, all measurements taken at 25° C.

The OSC formulation was then gravure printed as a wide area block on the array of source drain electrodes on PEN film as described above using a RK Flexiproof 100 printer by directly contacting a 8 cm$^3$/m$^2$ loaded anilox running at 90 m/min speed with the PEN substrate. The printed OSC layer was then annealed at 70° C. for 3 minutes.

A dielectric layer of fluoro-polymer Lisicon™ D139 (9% solids available from Merck Chemicals) was spun on top of the OSC layer on the device and annealed at 100° C. for 2 minutes to give a dry dielectric film of approximately 1 micron thick.

Finally a 40 nm thick gold gate electrode array of evaporated on top of the dielectric layer in such a way that it covered the existing source drain electrode structures.

Figure 8:
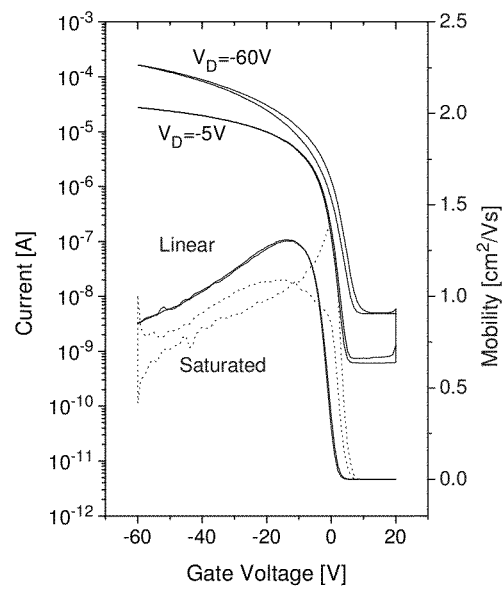

The transfer and stress measurements of the OFET device was performed by using Keithley 4200. The transistor transfer characteristic and the linear and saturation mobility are depicted in FIG. 8.

Example 5

Small Molecule, Flexo Printed, Bottom Gate

An OFET device was prepared as follows:
Teonex Q65FA (PEN) film (available from DuPont Teijin Films) was washed in an ultrasonic methanol bath for 3 minutes and then rinsed with methanol. Approximately 40 nm thick gold gate electrode were evaporated on top of the PEN substrate. A dielectric layer of D206 available (from Merck Chemicals) was spun on top of the gold gate electrode, at a spin speed of 1500 rpm for 30 seconds; annealed at 120° C. for 1 minute, and then UV cured under UV light (302 nm) for 5 minutes. Approximately 40 nm thick gold source drain electrodes were evaporated. The electrodes were treated with Lisicon™ M001 (available from Merck Chemicals) SAM treatment by spin coating from isopropyl alcohol and then rinsed with IPA and spin dried evaporating the excess off on a hot plate at 100° C. for 1 min.

An OSC formulation was prepared by dissolving of 1.6 parts Compound A (as mentioned in Example 1) and 0.4 parts 6 000 000 Mw polystyrene in mesitylene filtering the solution through a 0.2 µm PTFE cartridge filter.

Viscosity of 3.6 cP as measured using an AR G-2 rheometer ex TA instruments. The viscosity was measured over a shear rate range of 10 sec$^{-1}$ to 1000 sec$^{-1}$ viscosity extrapolated using a Newtonian fit equation, all measurements taken at 25° C.

The OSC formulation was then printed as a 5×5 cm wide area block on the array of source drain electrodes on PEN film as described above using a RK Flexiproof 100 flexographic printing with a 8 cm$^3$/m$^2$ loaded anilox and a Cyrel HiQS flexo mat running at 80 m/min speed. The printed OSC layer was then annealed at 70° C. for 3 minutes.

Figure 9:
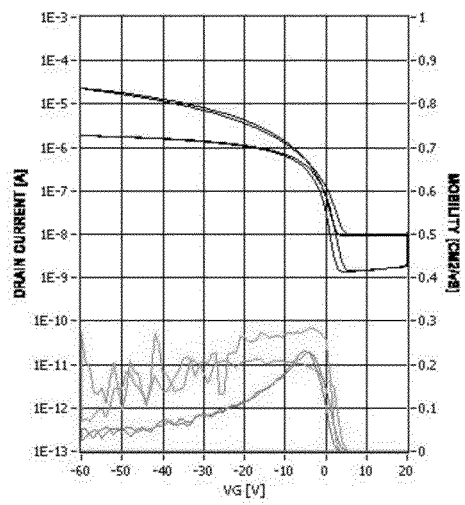

The transfer and stress measurements of the OFET device was performed by using Keithley 4200. The transistor transfer characteristic and the linear and saturation mobility are depicted in FIG. 9.

Example 6

Small Molecule, Flexo Printed, Bottom Gate

An OFET device was prepared as follows:
Teonex Q65FA (PEN) film (available from DuPont Teijin Films) was washed in an ultrasonic methanol bath for 3 minutes and then rinsed with methanol. Approximately 40 nm thick gold gate electrode were evaporated on top of the PEN substrate. A dielectric layer of D206 available (from Merck Chemicals) was spun on top of the gold gate electrode, at a spin speed of 1500 rpm for 30 seconds; annealed at 120° C. for 1 minute, and then UV cured under UV light (302 nm) for 5 minutes. Approximately 40 nm thick gold source drain electrodes were evaporated. The electrodes were treated with Lisicon™ M001 (available from Merck Chemicals) SAM treatment by spin coating from isopropyl alcohol and then rinsed with IPA and spin dried evaporating the excess off on a hot plate at 100° C. for 1 min.

An OSC formulation was prepared by dissolving of 1.6 parts Compound A (as mentioned in Example 1) and 0.4 parts 6 000 000 Mw polystyrene in cyclohexylbenzene/mesitylene in a 1:1 blend filtering the solution through a 0.2 µm PTFE cartridge filter.

Viscosity of 5.6 cP as measured using an AR G-2 rheometer ex TA instruments. The viscosity was measured over a shear rate range of 10 sec$^{-1}$ to 1000 sec$^{-1}$ viscosity extrapolated using a Newtonian fit equation, all measurements taken at 25° C.

The OSC formulation was then printed as a 5×5 cm wide area block on the array of source drain electrodes on PEN film as described above using a RK Flexiproof 100 flexographic printing with a 8 cm$^3$/m$^2$ loaded anilox and a Cyrel HiQS flexo mat running at 80 m/min speed. The printed OSC layer was then annealed at 70° C. for 3 minutes.

Figure 10:
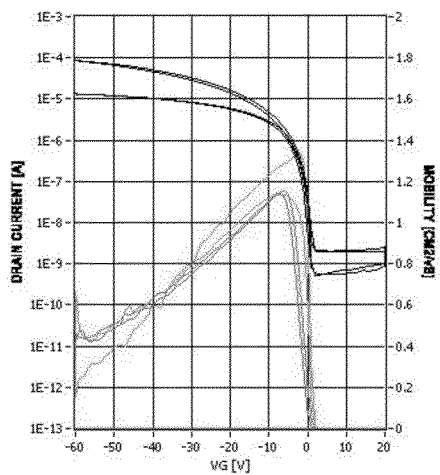

The transfer and stress measurements of the OFET device was performed by using Keithley 4200. The transistor transfer characteristic and the linear and saturation mobility are depicted in FIG. 10.

Example 7

Polymer, Flexo Printed, Top Gate

An OFET device was prepared as follows:
Teonex Q65FA film (available from DuPont Teijin Films) was washed in an ultrasonic methanol bath for 2 minutes and then rinsed with methanol. Approximately 60 nm thick gold source drain electrodes were evaporated with a parallel plate geometry of 20 micron wide by 1000 micron long. The substrate was cleaned with plasma ozone for 1 minutes. The electrodes were treated with Lisicon™ M001 (available from Merck Chemicals) SAM treatment by spin coating from methoxy propanol and evaporating the excess off on a hot plate at 100° C. for 1 min.

An OSC formulation was prepared by dissolving of 1% polymer comprising phenanthrene units having the following structure

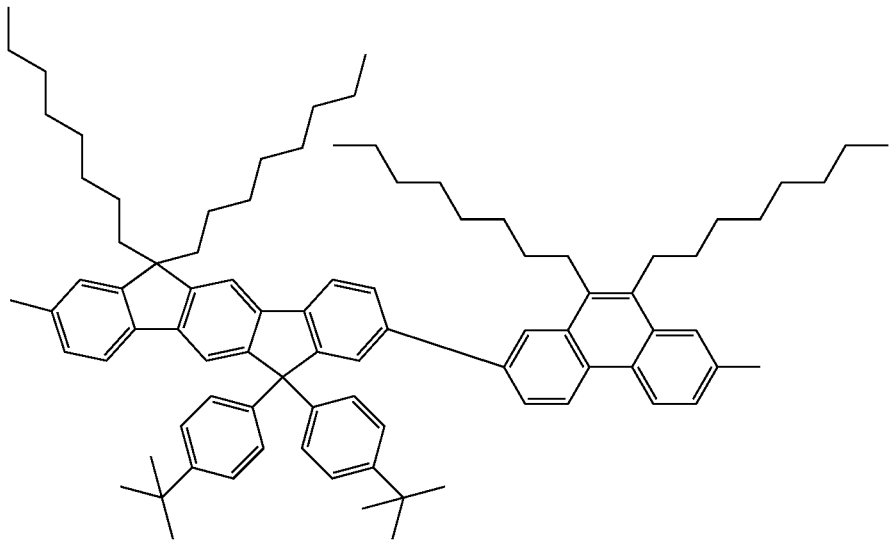 [SMILES: CCCCCCCCc1c(CCCCCCCC)c2cc(-c3ccc4c(c3)C(c3ccc(C(C)(C)C)cc3)(c3ccc(C(C)(C)C)cc3)c3cc5c(cc3-4)C(CCCCCCCC)(CCCCCCCC)c3cc(C)ccc3-5)ccc2c2ccc(C)cc12]

and a weight average molecular weight of 78,000 in mesitylene filtering the solution through a 0.2 μm PTFE cartridge filter.

Viscosity of 6.1 cP as measured using an AR G-2 rheometer ex TA instruments. The viscosity was measured over a shear rate range of 10 sec$^{-1}$ to 1000 sec$^{-1}$ viscosity extrapolated using a Newtonian fit equation, all measurements taken at 25° C.

The OSC formulation was then printed as a 5×5 cm wide area block on the array of source drain electrodes on PEN film as described above using a RK Flexiproof 100 flexographic printing with a 8 cm$^3$/m$^2$ loaded anilox and a Cyrel HiQS flexo mat running at 80 m/min speed. The printed OSC layer was then annealed at 70° C. for 3 minutes.

A dielectric layer of fluoro-polymer Lisicon™ D139 (9% solids available from Merck Chemicals) was spun on top of the OSC layer on the device and annealed at 100° C. for 2 minutes to give a dry dielectric film of approximately 1 micron thick.

Finally a 40 nm thick gold gate electrode array of evaporated on top of the dielectric layer in such a way that it covered the existing source drain electrode structures.

Figure 11:
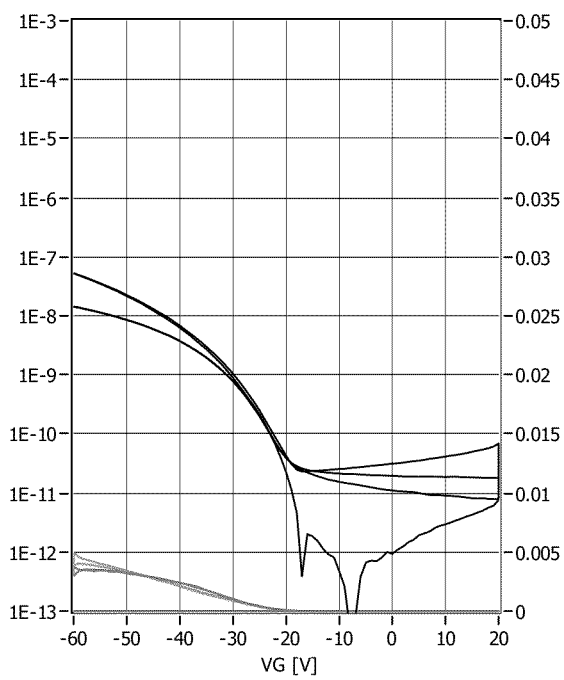

The transfer and stress measurements of the OFET device was performed by using Keithley 4200. The transistor transfer characteristic and the linear and saturation mobility are depicted in FIG. 11.

Example 8

Small Molecule, Flexo Printed, Bottom Gate

An OFET device was prepared as follows:
Teonex Q65FA (PEN) film (available from DuPont Teijin Films) was washed in an ultrasonic methanol bath for 3 minutes and then rinsed with methanol. Approximately 40 nm thick gold gate electrode were evaporated on top of the PEN substrate. A dielectric layer of D206 available (from Merck Chemicals) was spun on top of the gold gate electrode, at a spin speed of 1500 rpm for 30 seconds; annealed at 120° C. for 1 minute, and then UV cured under UV light (302 nm) for 5 minutes. Approximately 40 nm thick gold source drain electrodes were evaporated. The electrodes were treated with Lisicon™ M001 (available from Merck Chemicals) SAM treatment by spin coating from isopropyl alcohol and then rinsed with IPA and spin dried evaporating the excess off on a hot plate at 100° C. for 1 min.

An OSC formulation was prepared by dissolving of 1.6 parts Compound A (as mentioned in Example 1) and 0.4 parts 6 000 000 Mw polystyrene in cyclohexylbenzene, filtering the solution through a 0.2 μm PTFE cartridge filter.

Viscosity of 6.5 cP as measured using an AR G-2 rheometer ex TA instruments. The viscosity was measured over a shear rate range of 10 sec$^{-1}$ to 1000 sec$^{-1}$ viscosity extrapolated using a Newtonian fit equation, all measurements taken at 25° C.

The OSC formulation was then printed as a 5×5 cm wide area block on the array of source drain electrodes on PEN film as described above using a RK Flexiproof 100 flexographic printing with a 8 cm$^3$/m$^2$ loaded anilox and a Cyrel HiQS flexo mat running at 80 m/min speed. The printed OSC layer was then annealed at 70° C. for 3 minutes.

Figure 12:
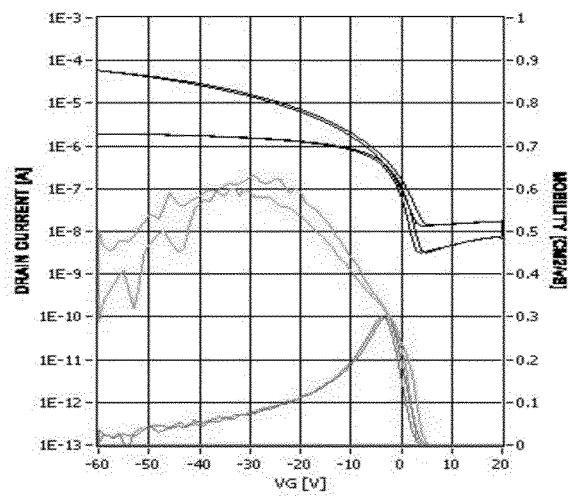

The transfer and stress measurements of the OFET device was performed by using Keithley 4200. The transistor transfer characteristic and the linear and saturation mobility are depicted in FIG. 12.

Example 9

Small Molecule, Gravure Printed, Bottom Gate, Mesitylene/CHB

Teonex Q65FA (PEN) film (available from DuPont Teijin Films) was washed in an ultrasonic methanol bath for 2 minutes and then rinsed with methanol. Approximately 50 nm thick gold gate electrode were evaporated on top of the PEN substrate. A dielectric layer of D206 available (from Merck Chemicals) was spun on top of the gold gate electrode, at a spin speed of 1500 rpm for 30 seconds; annealed at 100° C. for 10 minute, and then UV cured under UV light (306 nm) for 5 minutes. Approximately 60 nm thick gold source drain electrodes were evaporated. The electrodes were treated with M001 (available from Merck Chemicals) SAM treatment by covering for 1 min and then spin coating to remove excess M001 and then rinsed with IPA and spin dried evaporating the excess off on a hot plate at 100° C. for 1 min.

An OSC formulation was prepared by dissolving of 1.6 parts Compound A and 0.4 parts 6000000 Mw polystyrene in cyclohexylbenzene/mesitylene (1:1) filtering the solution through a 0.2 μm PTFE cartridge filter. Viscosity of 5.6 cP as measured using an AR G-2 rheometer ex TA Instruments. The viscosity was measured over a shear rate range of 10 $sec^{-1}$ to 1000 $sec^{-1}$ viscosity extrapolated using a Newtonian fit equation, all measurements taken at 25° C.

The OSC formulation was then printed using a CP 90-100-13 Sauerressig lab proofer. The gravure cylinder had many cell depths in order to achieve different volumes. The Anilox was 6.8 ml/$m^2$. The doctor blade was put into contact with the gravure cylinder, the formulation was placed in the nip between the doctor blade and the gravure cylinder and then rotated by hand. The print head was then slowly pulled over the substrate. The printed OSC layer was then annealed (forced air) at 70° C. for 4 minutes.

Figure 13:
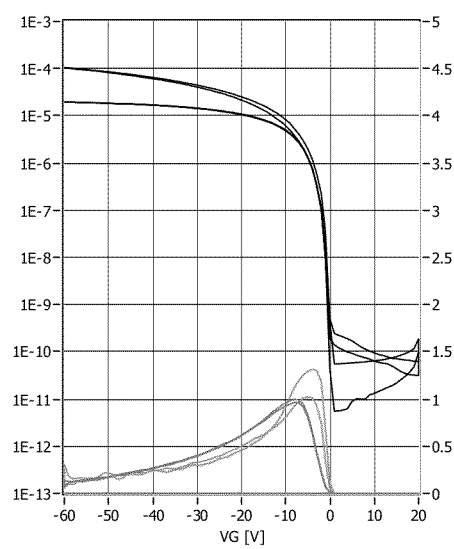

The transfer and stress measurements of the OFET device was performed by using Keithley 4200. The transistor transfer characteristic and the linear and saturation mobility are depicted in FIG. 13.

Example 10

Small Molecule, Gravure Printed, Top Gate

Teonex Q65FA film (available from DuPont Teijin Films) was washed in an ultrasonic methanol bath for 2 minutes and then rinsed with methanol. Approximately 60 nm thick gold source drain electrodes were evaporated with a parallel plate geometry of 20 micron wide by 1000 micron long. The substrate was cleaned with a 1000 W oxygen plasma for 1 minute. The electrodes were treated with M001 (available from Merck Chemicals) SAM treatment by depositing a film and leaving for 1 minute and then spinning-off excess and evaporating the excess off on a hot plate at 100° C. for 1 min.

An OSC formulation was prepared by dissolving of 1.6 parts Compound A and 0.4 parts 6000000 Mw polystyrene in cyclohexylbenzene/mesitylene (1:1) filtering the solution through a 0.2 μm PTFE cartridge filter. Viscosity of 5.6 cP as measured using an AR G-2 rheometer ex TA Instruments. The viscosity was measured over a shear rate range of 10 $sec^{-1}$ to 1000 $sec^{-1}$ viscosity extrapolated using a Newtonian fit equation, all measurements taken at 25° C.

The OSC formulation was then printed using a CP 90-100-13 Sauerressig lab proofer. The gravure cylinder had many cell depths in order to achieve different volumes. The doctor blade was put into contact with the gravure cylinder, the formulation was placed in the nip between the doctor blade and the gravure cylinder and then rotated by hand. The print head was then slowly pulled over the substrate. The printed OSC layer was then annealed at 70° C. for 4 minutes.

A dielectric layer of fluoro-polymer D139 (9% solids available from Merck Chemicals) was spun on top of the OSC layer on the device and annealed at 70° C. for 3 minutes and then 100 C for 1 minute, to give a dry dielectric film of approximately 1 micron thick.

Finally a 50 nm thick gold gate electrode array of evaporated on top of the dielectric layer in such a way that it covered the existing source drain electrode structures.

Figure 14:
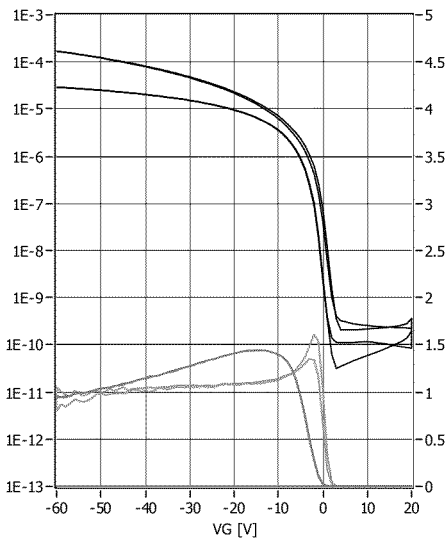

The transfer and stress measurements of the OFET device was performed by using Keithley 4200. The transistor transfer characteristic and the linear and saturation mobility are depicted in FIG. 14.

Example 11

Small Molecule, Flexo Printed, Top Gate, in Dimethoxytoluene

An OFET device was prepared as follows:
Teonex Q65FA film (available from DuPont Teijin Films) was washed in an ultrasonic methanol bath for 2 minutes and then rinsed with methanol. Approximately 60 nm thick gold source drain electrodes were evaporated with a parallel plate geometry of 20 micron wide by 1000 micron long. The substrate was cleaned with plasma ozone for 1 minutes. The electrodes were treated with Lisicon™ M001 (available from Merck Chemicals) SAM treatment by spin coating from isopropyl alcohol and evaporating the excess off on a hot plate at 100° C. for 1 min.

An OSC formulation was prepared by dissolving of 1.0 parts Compound A (as mentioned in Example 1) and 1.0 parts PTAA in dimethoxytoluene filtering the solution through a 0.2 μm PTFE cartridge filter.

Viscosity of 5.0 cP as measured using an AR G-2 rheometer ex TA instruments. The viscosity was measured over a shear rate range of 10 $sec^{-1}$ to 1000 $sec^{-1}$ viscosity extrapolated using a Newtonian fit equation, all measurements taken at 25° C.

The OSC formulation was then printed as a 5×5 cm wide area block on the array of source drain electrodes on PEN film as described above using a RK Flexiproof 100 flexographic printing with a 8 $cm^3/m^2$ loaded anilox and a Cyrel HiQS flexo mat running at 80 m/min speed. The printed OSC layer was then annealed at 70° C. for 3 minutes.

A dielectric layer of fluoro-polymer Lisicon™ D139 (9% solids available from Merck Chemicals) was spun on top of the OSC layer on the device and annealed at 100° C. for 2 minutes to give a dry dielectric film of approximately 1 micron thick.

Finally a 40 nm thick gold gate electrode array of evaporated on top of the dielectric layer in such a way that it covered the existing source drain electrode structures.

Figure 15A:
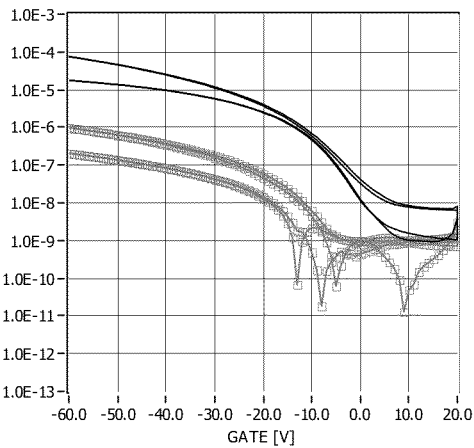
Figure 15B:
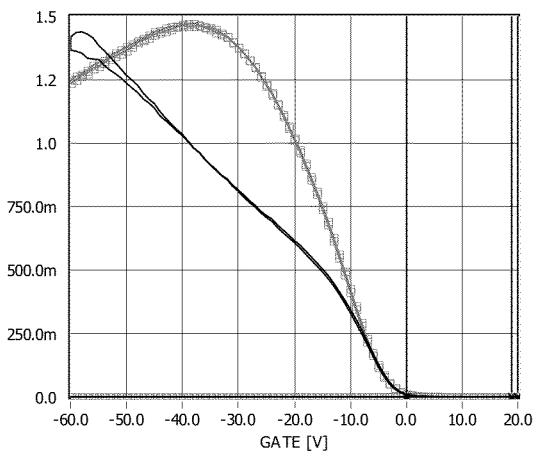

The transfer and stress measurements of the OFET device was performed by using Keithley 4200. The transistor transfer characteristic is depicted in FIG. 15a and the linear and saturation mobility are depicted in FIG. 15b.

Example 12

Small Molecule, Flexo Printed, Top Gate, in Isochroman

An OFET device was prepared as follows:
Teonex Q65FA film (available from DuPont Teijin Films) was washed in an ultrasonic methanol bath for 2 minutes and then rinsed with methanol. Approximately 60 nm thick gold source drain electrodes were evaporated with a parallel plate geometry of 20 micron wide by 1000 micron long. The substrate was cleaned with plasma ozone for 1 minutes. The electrodes were treated with Lisicon™ M001 (available from Merck Chemicals) SAM treatment by spin coating from isopropyl alcohol and evaporating the excess off on a hot plate at 100° C. for 1 min.

An OSC formulation was prepared by dissolving of 1.0 parts Compound A (as mentioned in Example 1) and 1.0 parts polytriarylamine (PTAA) in isochroman 95 parts and 1-methy naphthalene 3 parts filtering the solution through a 0.2 μm PTFE cartridge filter.

Viscosity of 5.3 cP as measured using an AR G-2 rheometer ex TA instruments. The viscosity was measured over a shear rate range of 10 sec$^{-1}$ to 1000 sec$^{-1}$ viscosity extrapolated using a Newtonian fit equation, all measurements taken at 25° C.

The OSC formulation was then printed as a 5×5 cm wide area block on the array of source drain electrodes on PEN film as described above using a RK Flexiproof 100 flexographic printing with a 8 cm$^3$/m$^2$ loaded anilox and a Cyrel HiQS flexo mat running at 80 m/min speed. The printed OSC layer was then annealed at 70° C. for 3 minutes.

A dielectric layer of fluoro-polymer Lisicon™ D139 (9% solids available from Merck Chemicals) was spun on top of the OSC layer on the device and annealed at 100° C. for 2 minutes to give a dry dielectric film of approximately 1 micron thick.

Finally a 40 nm thick gold gate electrode array of evaporated on top of the dielectric layer in such a way that it covered the existing source drain electrode structures.

Figure 16:
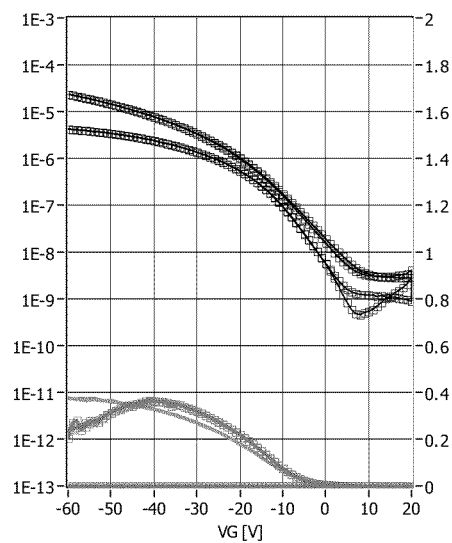

The transfer and stress measurements of the OFET device was performed by using Keithley 4200. The transistor transfer characteristic and the linear and saturation mobility are depicted in FIG. 16.

Example 13

Small Molecule, Flexo Printed, Top Gate, in Tetralin

An OFET device was prepared as follows:
Teonex Q65FA film (available from DuPont Teijin Films) was washed in an ultrasonic methanol bath for 2 minutes and then rinsed with methanol. Approximately 60 nm thick gold source drain electrodes were evaporated with a parallel plate geometry of 20 micron wide by 1000 micron long. The substrate was cleaned with plasma ozone for 1 minutes. The electrodes were treated with Lisicon™ M001 (available from Merck Chemicals) SAM treatment by spin coating from isopropyl alcohol and evaporating the excess off on a hot plate at 100° C. for 1 min.

An OSC formulation was prepared by dissolving of 1.0 parts Compound A (as mentioned in Example 1) and 1.0 parts PTAA in tetralin filtering the solution through a 0.2 μm PTFE cartridge filter.

Viscosity of 2.9 cP as measured using an AR G-2 rheometer ex TA instruments. The viscosity was measured over a shear rate range of 10 sec$^{-1}$ to 1000 sec$^{-1}$ viscosity extrapolated using a Newtonian fit equation, all measurements taken at 25° C.

The OSC formulation was then printed as a 5×5 cm wide area block on the array of source drain electrodes on PEN film as described above using a RK Flexiproof 100 flexographic printing with a 8 cm$^3$/m$^2$ loaded anilox and a Cyrel HiQS flexo mat running at 80 m/min speed. The printed OSC layer was then annealed at 70° C. for 3 minutes.

A dielectric layer of fluoro-polymer Lisicon™ D139 (9% solids available from Merck Chemicals) was spun on top of the OSC layer on the device and annealed at 100° C. for 2 minutes to give a dry dielectric film of approximately 1 micron thick.

Finally a 40 nm thick gold gate electrode array of evaporated on top of the dielectric layer in such a way that it covered the existing source drain electrode structures.

Figure 17A:
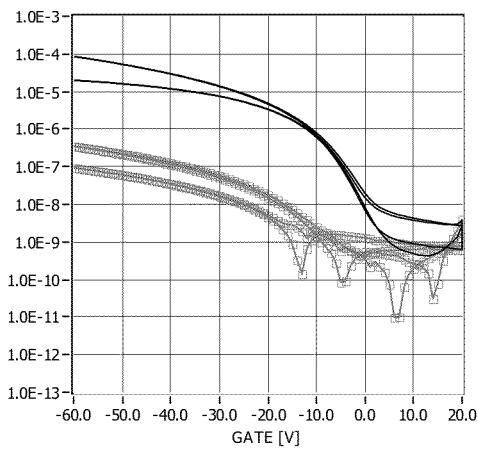
Figure 17B:
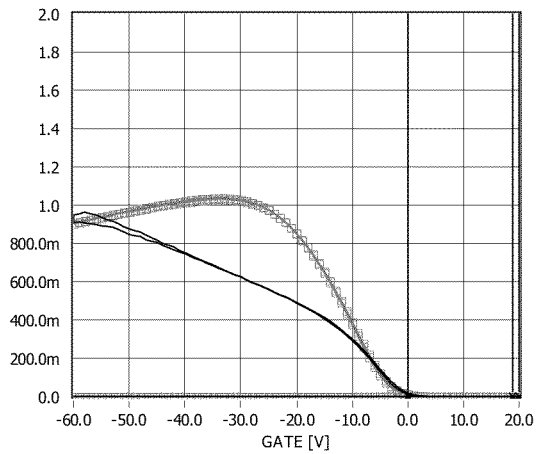

The transfer and stress measurements of the OFET device was performed by using Keithley 4200. The transistor transfer characteristic is depicted in FIG. 17a and the linear and saturation mobility are depicted in FIG. 17b.

Example 14

Small Molecule, Flexo Printed, Top Gate, Butyl Phenyl Ether

An OFET device was prepared as follows:
Teonex Q65FA film (available from DuPont Teijin Films) was washed in an ultrasonic methanol bath for 2 minutes and then rinsed with methanol. Approximately 60 nm thick gold source drain electrodes were evaporated with a parallel plate geometry of 20 micron wide by 1000 micron long. The substrate was cleaned with plasma ozone for 1 minutes. The electrodes were treated with Lisicon™ M001 (available from Merck Chemicals) SAM treatment by spin coating from isopropyl alcohol and evaporating the excess off on a hot plate at 100° C. for 1 min.

An OSC formulation was prepared by dissolving of 1.6 parts Compound A (as mentioned in Example 1) and 0.4 parts Poly (alpha)methylstyrene having a weight average molecular weight below 10,000 g/mol in butyl phenyl ether filtering the solution through a 0.2 μm PTFE cartridge filter.

Viscosity of 1.6 cP as measured using an AR G-2 rheometer ex TA instruments. The viscosity was measured over a shear rate range of 10 sec$^{-1}$ to 1000 sec$^{-1}$ viscosity extrapolated using a Newtonian fit equation, all measurements taken at 25° C.

The OSC formulation was then printed as a 5×5 cm wide area block on the array of source drain electrodes on PEN film as described above using a RK Flexiproof 100 flexographic printing with a 8 cm$^3$/m$^2$ loaded anilox and a Cyrel HiQS flexo mat running at 80 m/min speed. The printed OSC layer was then annealed at 70° C. for 3 minutes.

A dielectric layer of fluoro-polymer Lisicon™ D139 (9% solids available from Merck Chemicals) was spun on top of the OSC layer on the device and annealed at 100° C. for 2 minutes to give a dry dielectric film of approximately 1 micron thick.

Finally a 40 nm thick gold gate electrode array of evaporated on top of the dielectric layer in such a way that it covered the existing source drain electrode structures.

Figure 18:
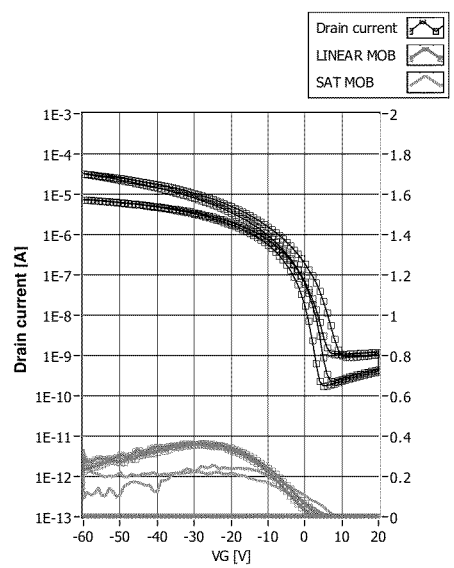

The transfer and stress measurements of the OFET device was performed by using Keithley 4200. The transistor transfer characteristic and the linear and saturation mobility are depicted in FIG. 18.

Example 15

Small Molecule, Flexo Printed, Bottom Gate

An OFET device was prepared as follows:
Teonex Q65FA (PEN) film (available from DuPont Teijin Films) was washed in an ultrasonic methanol bath for 3 minutes and then rinsed with methanol. Approximately 40 nm thick gold gate electrode were evaporated on top of the PEN substrate. A dielectric layer of D206 available (from Merck Chemicals) was spun on top of the gold gate electrode, at a spin speed of 1500 rpm for 30 seconds; annealed at 120° C. for 1 minute, and then UV cured under UV light (302 nm) for 5 minutes. Approximately 40 nm thick gold source drain electrodes were evaporated. The electrodes were treated with Lisicon™ M001 (available from Merck Chemicals) SAM treatment by spin coating from isopropyl alcohol and then rinsed with IPA and spin dried evaporating the excess off on a hot plate at 100° C. for 1 min.

An OSC formulation was prepared by dissolving of 1.6 parts Compound A (as mentioned in Example 1) and 0.4 parts 6 000 000 Mw polystyrene in cyclohexylbenzene/mesitylene in a 60/40 blend filtering the solution through a 0.2 μm PTFE cartridge filter.

Viscosity of 8 cP as measured using an AR G-2 rheometer ex TA instruments. The viscosity was measured over a shear rate range of 10 sec$^{-1}$ to 1000 sec$^{-1}$ viscosity extrapolated using a Newtonian fit equation, all measurements taken at 25° C.

The OSC formulation was then printed as a 5×5 cm wide area block on the array of source drain electrodes on PEN film as described above using a RK Flexiproof 100 flexographic printing with a 8 cm$^3$/m$^2$ loaded anilox and a Cyrel HiQS flexo mat running at 80 m/min speed. The printed OSC layer was then annealed at 70° C. for 3 minutes.

Figure 19:
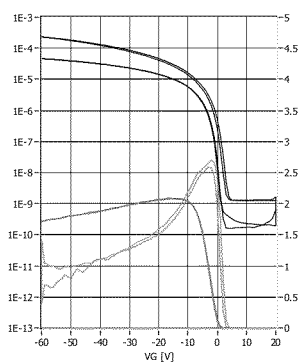

The transfer and stress measurements of the OFET device was performed by using Keithley 4200. The transistor transfer characteristic and the linear and saturation mobility are depicted in FIG. 19.

Example 16

Small Molecule, Flexo Printed, Bottom Gate

An OFET device was prepared as follows:

Teonex Q65FA (PEN) film (available from DuPont Teijin Films) was washed in an ultrasonic methanol bath for 3 minutes and then rinsed with methanol. Approximately 40 nm thick gold gate electrode were evaporated on top of the PEN substrate. A dielectric layer of D206 available (from Merck Chemicals) was spun on top of the gold gate electrode, at a spin speed of 1500 rpm for 30 seconds; annealed at 120° C. for 1 minute, and then UV cured under UV light (302 nm) for 5 minutes. Approximately 40 nm thick gold source drain electrodes were evaporated. The electrodes were treated with Lisicon™ M001 (available from Merck Chemicals) SAM treatment by spin coating from isopropyl alcohol and then rinsed with IPA and spin dried evaporating the excess off on a hot plate at 100° C. for 1 min.

An OSC formulation was prepared by dissolving of 1.6 parts Compound A (as mentioned in Example 1) and 0.5 parts 6 000 000 Mw polystyrene in cyclohexylbenzene/mesitylene in a 60:40 blend filtering the solution through a 0.2 μm PTFE cartridge filter.

Viscosity of 10 cP as measured using an AR G-2 rheometer ex TA instruments. The viscosity was measured over a shear rate range of 10 sec$^{-1}$ to 1000 sec$^{-1}$ viscosity extrapolated using a Newtonian fit equation, all measurements taken at 25° C.

The OSC formulation was then printed as a 5×5 cm wide area block on the array of source drain electrodes on PEN film as described above using a RK Flexiproof 100 flexographic printing with a 8 cm$^3$/m$^2$ loaded anilox and a Cyrel HiQS flexo mat running at 80 m/min speed. The printed OSC layer was then annealed at 70° C. for 3 minutes.

Figure 20:
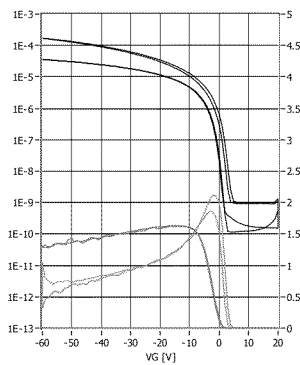

The transfer and stress measurements of the OFET device was performed by using Keithley 4200. The transistor transfer characteristic and the linear and saturation mobility are depicted in FIG. 20.

The invention claimed is:

1. Formulation comprising one or more organic semiconducting compounds (OSC), and one or more organic solvents, wherein:
   one or more organic semiconducting compound has a molecular weight of 2000 g/mol or less and is of the formula P6:

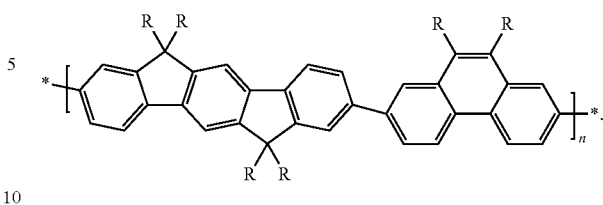

wherein
   n is an integer >1,
   R on each occurrence identically or differently denotes H, F, Cl, Br, I, CN, a straight-chain, branched or cyclic alkyl group having from 1 to 40 C atoms, in which one or more C atoms are optionally replaced by O, S, O—CO, CO—O, O—CO—O, CR$^0$=CR$^0$ or C≡C such that O— and/or S-atoms are not linked directly to each other, and in which one or more H atoms are optionally replaced by F, Cl, Br, I or CN, or denotes an aryl or heteroaryl group having from 4 to 20 ring atoms that is unsubstituted or substituted by one or more non-aromatic groups R$^s$, and wherein one or more groups R may also form a mono- or polycyclic aliphatic or aromatic ring system with one another and/or with the ring to which they are attached,
   R$^s$ on each occurrence identically or differently denotes F, Cl, Br, I, CN, Sn(R$^{00}$)$_3$, Si(R$^{00}$)$_3$ or B(R$^{00}$)$_2$ a straight-chain, branched or cyclic alkyl group having from 1 to 25 C atoms, in which one or more C atoms are optionally replaced by O, S, O—CO, CO—O, O—CO—O, CR$^0$=CR$^0$, C≡C such that O—and/or S-atoms are not linked directly to each other, and in which one or more H atoms are optionally replaced by F, Cl, Br, I or CN, or R$^s$ denotes an aryl or heteroaryl group having from 4 to 20 ring atoms that is unsubstituted or substituted by one or more non-aromatic groups R$^s$, and wherein one or more groups R$^s$ may also form a ring system with one another and/or with R,
   R$^0$ on each occurrence identically or differently denotes H, F, Cl, CN, alkyl having from 1 to 12 C atoms or aryl or heteroaryl having from 4 to 10 ring atoms,
   R$^{00}$ on each occurrence identically or differently denotes H or an aliphatic or aromatic hydrocarbon group having from 1 to 20 C atoms, wherein two groups R$^{00}$ may also form a ring together with the hetero atom (Sn, Si or B) to which they are attached,
   the formulation has a viscosity at 25° C. of less than 15 mPas and
   the boiling point of one or more organic solvent is at most 400° C.

2. Formulation according to claim 1, wherein the formulation has a viscosity at 25° C. in the range of 0.5 to 9.5 mPas.

3. Formulation according to claim 1, wherein said formulation is a solution.

4. Formulation according to claim 1, wherein the formulation has a surface tension in the range of 22 mN/m to 50 mN/m.

5. Formulation according to claim 1, wherein one or more organic solvent has Hansen Solubility parameters of H$_d$ in the range of 17.0 to 23.2 MPa$^{0.5}$, H$_p$ in the range of 0.2 to 12.5 MPa$^{0.5}$ and H$_h$ in the range of 0.0 to 20.0 MPa$^{0.5}$.

6. Formulation according to claim 5, wherein one or more organic solvent has Hansen Solubility parameters of H$_d$ in the range of 17.0 to 23.2 MPa$^{0.5}$, H$_p$ in the range of 0.2 to 10.5 MPa$^{0.5}$ and H$_h$ in the range of 0.0 to 5.0 MPa$^{0.5}$.

7. Formulation according to claim 5, wherein one or more organic solvent comprises one or more of an aromatic and/or heteroaromatic compound.

8. Formulation according to claim 5, wherein one or more organic solvent comprises of one or more aromatic hydrocarbon compound.

9. Formulation according to claim 8, wherein said aromatic hydrocarbon compound comprises a cycloalkyl group.

10. Formulation according to claim 8, wherein said aromatic hydrocarbon compound comprises an alkyl group having 1 to 8 carbon atoms.

11. Formulation according to claim 1, wherein said organic solvent comprises a mixture of hydrocarbon aromatic compounds.

12. Formulation according to claim 1, wherein one or more organic solvent has a boiling point of at least 130° C.

13. Formulation according to claim 1, wherein said organic solvent is a mixture of compounds having different boiling points and the boiling point of the compound with the lowest boiling point is at least 10° C. below the boiling point of the compound with the highest boiling point.

14. Formulation according to claim 1, wherein said organic solvent is a mixture of compounds having different boiling points and the boiling point of the compound with the lowest boiling point is at most 100° C. below the boiling point of the compound with the highest boiling point.

15. Formulation according to claim 1, wherein said formulation comprises at least 80% by weight of said organic solvents.

16. Formulation according to claim 1, wherein one or more organic solvent has a partition ratio log P of at least 1.5.

17. Formulation according to claim 1, wherein said formulation comprises at least one inert binder.

18. Formulation according to claim 17, wherein said inert binder is a polymer comprising repeating units derived from styrene monomers and/or olefins.

19. Formulation according to claim 17, wherein said inert binder is a polymer comprising at least 80% by weight of repeating units derived from styrene monomers and/or olefins.

20. Formulation according to claim 17, wherein said inert binder is a polymer having a weight average molecular weight of at least 200,000 g/mol.

21. Formulation according to claim 1, wherein one or more organic semiconducting compound is an organic light emitting material and/or charge transporting material.

22. Formulation according to claim 1, wherein one or more organic semiconducting compound has a molecular weight of 1000 g/mol or less.

23. Formulation according to claim 1, wherein the formulation further comprises a host material.

24. Formulation according to claim 1, wherein the formulation comprises 0.1 to 5% by weight of organic semiconducting compounds.

25. Formulation according to claim 17, wherein the weight ratio of said semiconducting compound to said inert binder is in the range of 5:1 to 1:1.

26. Formulation according to claim 1, wherein the formulation comprises at least one wetting agent.

27. Formulation according to claim 26, wherein said wetting agent is volatile and is not capable of chemically reacting with said organic semiconducting compound.

28. A coating or printing ink for the preparation of OE devices, comprising a formulation according to claim 1.

29. Process of preparing an organic electronic (OE) device, comprising the steps of
   a) depositing the formulation according to claim 1 onto a substrate to form a film or layer, and
   b) removing the solvent(s).

30. Process according to claim 29, wherein the formulation is applied by gravure printing, doctor blade coating, roller printing, reverse roller printing, flexographic printing, or web printing.

31. Process according to claim 29, wherein the formulation is applied by a printing process with a printing device and the cell etch of the printing device is in the range of 4 $cm^3/m^2$ to 18 $cm^3/m^2$.

32. Process according to claim 29, wherein the formulation is applied by a printing process with a printing device having a print speed of 100 m/minute or less.

33. Process according to claim 29, wherein the surface on which the formulation is applied has a surface energy in the range of 25 to 130 mN $m^{-1}$.

34. Process according to claim 29, wherein removing of the solvent is by evaporation and the evaporation of the solvent is achieved below the boiling point of the solvent.

35. An organic electronic (OE) device prepared by a process according to claim 29.

36. An organic electronic (OE) device according to claim 35, which is an organic light emitting diode (OLED), an organic field effect transistor (OFET) or an organic photovoltaic (OPV) device.

37. An organic electronic (OE) device according to claim 35, which has a top gate design.

38. An organic electronic (OE) device according to claim 35, which has a bottom gate design.

* * * * *